(12) United States Patent
Tsuchi

(10) Patent No.: US 8,823,570 B2
(45) Date of Patent: Sep. 2, 2014

(54) DIGITAL-TO-ANALOG CONVERTER CIRCUIT AND DISPLAY DRIVER

(75) Inventor: Hiroshi Tsuchi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 613 days.

(21) Appl. No.: 13/192,998

(22) Filed: Jul. 28, 2011

(65) Prior Publication Data
US 2012/0026154 A1 Feb. 2, 2012

(30) Foreign Application Priority Data
Jul. 29, 2010 (JP) ................................ 2010-169951

(51) Int. Cl.
*H03M 1/66* (2006.01)
*G09G 3/36* (2006.01)

(52) U.S. Cl.
CPC ........ *G09G 3/3688* (2013.01); *G09G 2310/027* (2013.01)
USPC ......................................... 341/145; 341/144

(58) Field of Classification Search
USPC ...................... 341/144, 145; 345/187, 94, 204
See application file for complete search history.

(56) References Cited

U.S. PATENT DOCUMENTS

| | | | | |
|---|---|---|---|---|
| 5,059,978 A | * | 10/1991 | Valdenaire | 341/145 |
| 6,549,155 B1 | * | 4/2003 | Heminger et al. | 341/144 |
| 8,274,417 B2 | * | 9/2012 | Zhao et al. | 341/145 |
| 2007/0126689 A1 | | 6/2007 | Ishii et al. | |
| 2009/0109077 A1 | | 4/2009 | Tsuchi et al. | |
| 2009/0213051 A1 | | 8/2009 | Tsuchi | |
| 2009/0295767 A1 | | 12/2009 | Tsuchi | |

FOREIGN PATENT DOCUMENTS

| | | |
|---|---|---|
| JP | 2007-158810 A | 6/2007 |
| JP | 2009-104056 A | 5/2009 |
| JP | 2009-213132 A | 9/2009 |
| JP | 2009-284310 A | 12/2009 |

* cited by examiner

*Primary Examiner* — Brian Young
(74) *Attorney, Agent, or Firm* — Foley & Lardner LLP

(57) ABSTRACT

Provided first and second reference voltage set wherein the first reference voltage set includes a part or all of reference voltages of the second reference voltage set, and a decoder including first and second sub-decoder sections that select Q reference voltages from first and second reference voltage sets according to upper bits of the input digital signal and transfer the so selected reference voltages to the first to Qth nodes, and third and fourth sub-decoder sections that select first and second voltages from the Q reference voltages transferred to the first to Qth nodes according to lower bits of the input digital signal and transfer the so selected voltages to the first to Pth nodes. The first and third sub-decoder sections are made up of first conductivity type transistors, while the second and fourth sub-decoder sections are made up of second conductivity type transistors. Also provided an amplifier circuit takes a weighted average of voltages at the first to Pth nodes at a preset weighting factors and outputs the weighted average voltage at an output terminal as an analog signal corresponding to the input digital signal.

9 Claims, 22 Drawing Sheets

$Vout = \{V(T1) + V(T2)\}/2$ $Vout = \{V(T1) + V(T2) + 2 \times V(T3)\}/4$

FIG. 4

| REFERENCE VOLTAGE GROUP | ORDINAL SEQUENCE OF REFERENCE VOLTAGES OF EACH REFERENCE VOLTAGE GROUP | | | | | | | | | | | |
|---|---|---|---|---|---|---|---|---|---|---|---|---|
| | 1 | 2 | ~ | j | ~ | f | ~ | k | ~ | h-1 | h |
| 1 | Vr1 | Vr(tS+1) | ~ | Vr{(j-1)×(zS)+1} | ~ | Vr{(f-1)×(zS)+1} | ~ | Vr{(k-1)×(zS)+1} | ~ | Vr{(h-2)×(zS)+1} | Vr{(h-1)×(zS)+1} |
| 2 | Vr2 | Vr(tS+2) | ~ | Vr{(j-1)×(zS)+2} | ~ | Vr{(f-1)×(zS)+2} | ~ | Vr{(k-1)×(zS)+2} | ~ | Vr{(h-2)×(zS)+2} | Vr{(h-1)×(zS)+2} |
| 3 | Vr3 | Vr(tS+3) | ~ | Vr{(j-1)×(zS)+3} | ~ | Vr{(f-1)×(zS)+3} | ~ | Vr{(k-1)×(zS)+3} | ~ | Vr{(h-2)×(zS)+3} | Vr{(h-1)×(zS)+3} |
| ... | ... | ... | ... | ... | ... | ... | ... | ... | ... | ... | ... |
| i | Vr(i) | Vr(tS+i) | ~ | Vr{(j-1)×(zS)+i} | ~ | Vr{(f-1)×(zS)+i} | ~ | Vr{(k-1)×(zS)+i} | ~ | Vr{(h-2)×(zS)+i} | Vr{(h-1)×(zS)+i} |
| ... | ... | ... | ... | ... | ... | ... | ... | ... | ... | ... | ... |
| zS | Vr(zS) | Vr(tzS) | ~ | Vr(jzS) | ~ | Vr(fzS) | ~ | Vr(kzS) | ~ | Vr{(h-1)×(zS)} | Vr(hzS) |
| zS+1 | Vr(zS+1) | Vr(tzS+1) | ~ | Vr(jzS+1) | ~ | Vr(fzS+1) | ~ | Vr(kzS+1) | ~ | Vr{(h-1)×(zS)+1} | Vr(hzS+1) |

S DENOTES POWERS OF 2, INCLUSIVE OF 1: 1, 2, 4, 8, ···
z DENOTES POWERS OF 2, INCLUSIVE OF 1, ADDED TO WITH 1: 2, 3, 5, 9, ···
h DENOTES A PRESET POSITIVE INTEGER NOT LESS THAN 2 j=1, 2, 3, ···, f, ···, k, ···, h   (f<k<h)

OUTPUT VOLTAGE RANGE OF LDC
(LIQUID CRYSTAL DISPLAY) DRIVER

OUTPUT VOLTAGE RANGE OF OLED
(ORGANIC LIGHT-EMITTING DIODE)
DISPLAY DRIVER

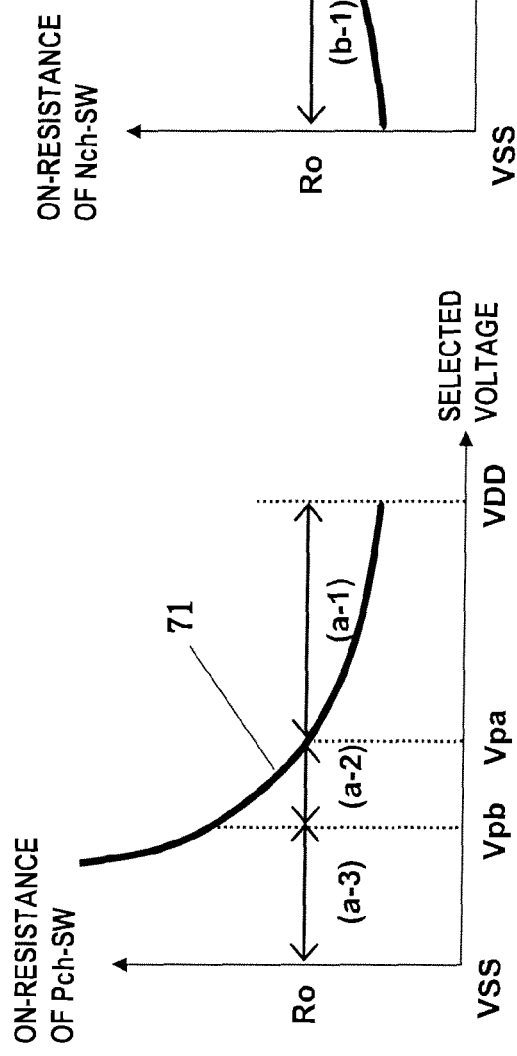
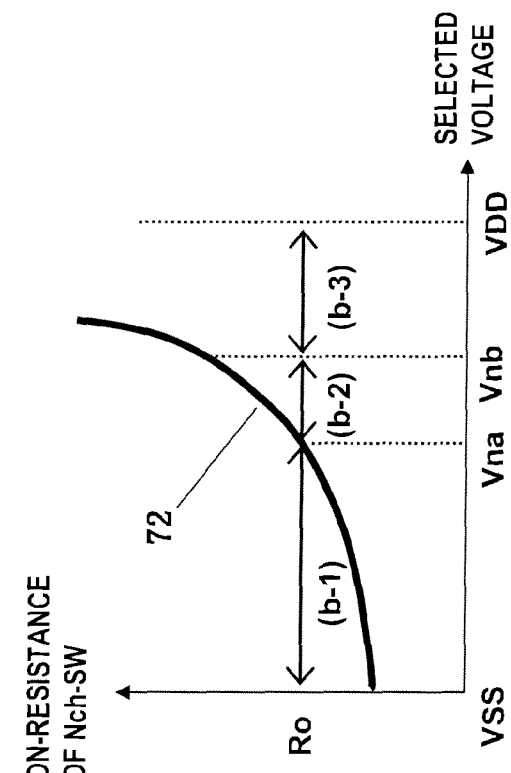
FIG. 13A
FIG. 13B
FIG. 13C
FIG. 13D

REFERENCE CASE

FIG. 18

RELATED ART

| REFERENCE VOLTAGE GROUP | ORDINAL SEQUENCE OF REFERENCE VOLTAGES OF EACH REFERENCE VOLTAGE GROUP | | | | | | | |
|---|---|---|---|---|---|---|---|---|
| | 1 | 2 | 3 | ~ | j | ~ | h−1 | h |
| 1 | Vr1 | Vr(½S+1) | Vr(½S+1) | ~ | Vr{(j−1)×(½S)+1} | ~ | Vr{(h−2)×(½S)+1} | Vr{(h−1)×(½S)+1} |
| 2 | Vr2 | Vr(½S+2) | Vr(½S+2) | ~ | Vr{(j−1)×(½S)+2} | ~ | Vr{(h−2)×(½S)+2} | Vr{(h−1)×(½S)+2} |
| 3 | Vr3 | Vr(½S+3) | Vr(½S+3) | ~ | Vr{(j−1)×(½S)+3} | ~ | Vr{(h−2)×(½S)+3} | Vr{(h−1)×(½S)+3} |
| ... | ... | ... | ... | ... | ... | ... | ... | ... |
| i | Vr(i) | Vr(½S+i) | Vr(½S+i) | ~ | Vr{(j−1)×(½S)+i} | ~ | Vr{(h−2)×(½S)+i} | Vr{(h−1)×(½S)+i} |
| ... | ... | ... | ... | ... | ... | ... | ... | ... |
| zS | Vr(zS) | Vr(½zS) | Vr(½zS) | ~ | Vr(jzS) | ~ | Vr{(h−1)×(½S)} | Vr(hzS) |
| zS+1 | Vr(zS+1) | Vr(½zS+1) | Vr(½zS+1) | ~ | Vr(jzS+1) | ~ | Vr{(h−1)×(½S)+1} | Vr(hzS+1) |

S DENOTES POWERS OF 2, INCLUSIVE OF 1: 1, 2, 4, 8, ...
z DENOTES POWERS OF 2, INCLUSIVE OF 1, ADDED TO WITH 1: 2, 3, 5, 9, ...

DIGITAL-TO-ANALOG CONVERTER CIRCUIT AND DISPLAY DRIVER

REFERENCE TO RELATED APPLICATION

This application is based upon and claims the benefit of the priority of Japanese patent application No. 2010-169951, filed on Jul. 29, 2010, the disclosure of which is incorporated herein in its entirety by reference thereto.

TECHNICAL FIELD

This invention relates to a digital-to-analog converter circuit, a data driver and a display device in which they are used.

BACKGROUND

A liquid crystal display device (LCD), featured by thin thickness, light weight and low power consumption, has recently come into widespread use, and is being predominantly used as a display unit of a mobile equipment, such as a portable telephone set (mobile phones or cellular phones), a PDA (Personal Digital Assistant), a multi-function portable information terminal or a notebook PC. In these days, the technique for enlarging the display size or for coping with a moving picture has made progress such that it is possible nowadays to implement not only a mobile equipment but also a stationary large screen display device or a large display size liquid crystal TV. For such liquid crystal display device, a liquid crystal display device of the active matrix driving system is in use. As a display device of a thin thickness, a display device of the active matrix driving system employing an organic light emitting diode (OLED) has also been developed.

Referring to FIGS. 16A-16C, a typical configuration of a thin type display device of the active matrix driving system (a liquid crystal display device as well as an organic light emitting diode display device) will be briefly described. FIG. 16A is a block diagram showing essential portions of a thin type display device, and FIG. 16B is a diagram showing essential portions of a unit pixel of a display panel of a liquid crystal display device. FIG. 16C is a diagram showing essential portions of a unit pixel of a display panel of an organic light emitting diode display device. It is noted that, in FIGS. 16B and 16C, unit pixels are schematically shown as equivalent circuits.

Referring to FIG. 16A, the thin type display device of the active matrix driving system includes, as its typical components, a power supply circuit 940, a display controller 950, a display panel 960, a gate driver 970 and a data driver 980. The display device panel 960 includes unit pixels, each of which includes a pixel switch 964 and a display element 963 and which are arranged in a matrix array. In a color SXGA (Super eXtended Graphics Array) panel, for example, the matrix array is made up by 1280×3 pixel columns by 1024 pixel rows. On the display device panel 960, scan lines 961 that transmit scan signals output from the gate driver 970 to the respective unit pixels and data lines 962 that transmit gray scale voltage signals output from the data driver 980 are provided in a lattice-shaped configuration. The gate driver 970 and the data driver 980 are supplied with a clock signal CLK and a control signal under control by the display device controller 950. Image data are supplied to the data driver 980. Nowadays, image data are predominantly digital data. A power supply circuit 940 supplies the necessary power supply voltages to the gate driver 970 and to the data driver 980. The display device panel 960 includes a semiconductor substrate.

As the display device panel 960 of a large screen display device, a semiconductor substrate formed by an insulating substrate, having thin film transistors (pixel switches) formed thereon, is widely used.

If, in the display device of FIG. 16A, the on/off of the pixel switch 964 is controlled by a scan signal. When the pixel switch 964 is turned on (made electrically conductive), the gray scale voltage signal, corresponding to the pixel data, is supplied to the display element 963. The display element 963 then is changed in luminance in response to the gray scale voltage signal, thus displaying an image. Each picture image equivalent data is updated for each frame period which is usually ca. 0.017 sec for 60 Hz driving. Each scan line 961 sequentially selects a pixel row (line) to turn on the pixel switch 964. During the time the pixel row is selected, the gray scale voltage signal is supplied from the data line 962 via the pixel switch 964 to the display element 963. There is also such an arrangement in which a plurality of pixel rows are simultaneously selected by the scan lines or driving is made by the frame frequency higher than 60 Hz.

Referring to FIGS. 16A and 16B, a liquid crystal display device has a display panel 960 including a semiconductor substrate and an opposite substrate. The semiconductor substrate has a matrix array of the pixel switches 964, as unit pixels, and transparent electrodes 973. The opposite substrate has a single transparent electrode 974 extending on its entire surface. These substrates are mounted facing each other with a gap in-between in which to charge a liquid crystal material. The display element 963, forming a unit pixel, includes the pixel electrode 973, the opposite substrate electrode 974, a liquid crystal capacitance 971 and an auxiliary capacitance 972. A backlight is provided as a light source on a back side of the display device panel.

When the pixel switch 964 is turned on by a scan signal from the scan lines 961, the gray scale voltage signal from the data line 962 is applied to the pixel electrode 973. The transmittance of the backlight, transferred through the liquid crystal, is changed due to the potential difference between each pixel electrode 973 and the opposite substrate electrode 974. The potential difference is kept for certain time duration by the liquid crystal capacitance 971 and the auxiliary capacitance 972 even after the pixel witch 964 is turned off, thus providing for display. It is noted that, in driving the liquid crystal display device, the voltage polarity is reversed between plus and minus polarities, with respect to the common voltage of the opposite substrate electrode 974, usually every frame period (inverted driving), in order to prevent deterioration of the liquid crystal. As typical of the driving of the data line is dot inversion driving where voltage polarities differ between neighboring pixels and column inversion driving where voltage polarities differ between neighboring data lines. In the dot inversion driving, gray scale voltage signals of the polarities different from one selection period (one data period) to another are output to the data line 962. In the column inversion driving, gray scale voltage signals of the polarities which are the same from one selection period (one data period) to another are output to the data line 962 in a frame period.

Turning to the organic light emitting diode display device, shown in FIGS. 16A and 16C, the display device panel 960 includes a semiconductor substrate carrying thereon a matrix array of larger numbers of unit pixels. Each of these unit pixels is composed of a pixel switch 964, an organic light emitting diode 982 and a thin film transistor (TFT) 981. The organic light emitting diode is formed by an organic film sandwiched between two thin film electrode layers. The TFT controls the current supplied to the organic light emitting diode 982. The organic light emitting diode 982 and the TFT 981 are connected in series with each other between power supply terminals 984, 985 supplied with different power supply voltages. An auxiliary capacitance 983 holds a control terminal voltage of the TFT 981. Meanwhile, the display element 963, correlated with a pixel, includes the TFT 981, organic light emitting diode 982, power supply terminals 984, 985 and the auxiliary capacitance 983.

When the pixel switch 964 is turned on (made electrically conductive) by the scan signal from the scan line 961, the gray scale voltage signal from the data line 962 is applied to the control terminal of the TFT 981. This causes light to be emitted from the organic light emitting diode 982 with the luminance corresponding to the current to make necessary display. Light emission is sustained even after the pixel switch 964 is turned off (made electrically non-conductive) since the gray scale voltage signal applied to the control terminal of the TFT 981 is kept for a certain time period by the auxiliary capacitance 983. In FIGS. 16A-16C, the pixel switch 964 and the TFT 981 implemented as Nch transistors are shown as an example. The pixel switch 964 and TFT 981 may, however, be implemented as Pch transistors. An organic EL element may also be connected to the side the power supply terminal 984. In the driving of the organic light emitting diode display device, no inverted driving, such as is used in the liquid crystal display device, need be used, such that a gray scale voltage signal for the pixel being displayed is output for one selection period (one data period).

Apart from the configuration of the organic light emitting diode display device in which display is made in keeping with the gray scale voltage signal from the data line 962, there is such a configuration in which the display device receives the gray scale current signal output from the data driver in order to make display. However, the following explanation of the present invention will be made only with reference to the configuration in which the display is in response to the gray scale voltage output from the data driver.

In FIG. 16A, it is only sufficient that the gate driver 970 provides at least bi-valued scan signals. On the other hand, the data driver 980 has to drive each data line 962 with multi-level gray scale voltage signals corresponding to the number of gray scales. For this reason, the data driver 980 includes a decoder for converting image data into gray scale voltage signals and a digital-to-analog converter (DAC) for amplifying the gray scale voltage signal to output the so amplified signal to the data line 962.

In mobile equipment, notebook PCs, monitors and television for high-end use, having a display of thin thickness configuration, such as liquid crystal display or organic light emitting diode display, the tendency is towards higher picture quality and larger numbers of colors that may be displayed. There is also a demand for larger numbers of hits for digital image data. The area of the multi-bit DAC depends upon the decoder configuration.

In a liquid crystal display, there is a demand for lowering of a driving power supply voltage of the liquid crystal. On the other hand, in the organic light emitting diode display, unlike the liquid crystal display, there is no necessity for polarity inversion. Also, the dynamic range (driving voltage range) with respect to the power supply voltage is broad. In light of the above, a CMOS switch is needed as a switch for a decoder of the digital-to-analog converter circuit in a data driver 980 for both the liquid crystal display and the organic light emitting diode display. The CMOS switch is comprised of a Pch transistor switch (Pch-SW) and an Nch transistor switch (Nch-SW) combined together. More specifically, the Pch switch and the Nch switch are connected in parallel to each other so that the directions of currents flowing in the drain-to-source paths of the switches will be the same, and complementary control signals are supplied to the gates of the switches which are controlled to be turned on and off in common.

However, if the Pch or Nch switches are all configured as CMOS switches, the decoder area is increased to raise the cost of the data driver.

In Patent Document 1 (JP Patent Kokai Publication No. JP-P2009-104056A), Patent Document 2 (JP Patent Kokai Publication No. JP-P2009-284310A) and in Patent Document 3 (JP Patent Kokai Publication No. JP-P2009-213132A), there are shown digital-to-analog converters as techniques relevant to the present invention. In these digital-to-analog converters, the number of reference voltages, selected by the decoder, is suppressed from increasing in order to suppress the number of bits of the input digital signal of the data driver from increasing to prevent that the number of elements that make up the decoder is increased.

FIG. 17 shows essential components of a digital-to-analog converter circuit disclosed in the Patent Documents 1 to 3 in common. The digital-to-analog converter circuit includes a decoder correlated with one of the positive and negative polarities of the LCD. The drawing has been drafted by the present inventor to illustrate the related techniques.

Referring to FIG. 17, the digital-to-analog converter of the Patent Documents 1 to 3 includes a reference voltage ensemble 820, a decoder 810 made up of first to (zS+1)th sub-decoders 811-1 to 811-(zS+1) and a sub-decoder 813, and an interpolation amplifier 830. The reference voltage ensemble 820 is an ensemble of reference voltages output from a reference voltage generator, not shown. The first to (zS+1)th sub-decoders input upper (m−n) bits out of m bits of m-bit digital data, and the sub-decoder 813 inputs lower n bits of the digital data. It is noted that S denotes integers representing powers of 2, inclusive of 1, namely 1, 2, 4, . . . , z denotes integers representing powers of 2, inclusive of 1, added to with 1, namely 2, 3, 5, 9, . . . , m denotes a preset positive integer not less than 3 and n denotes a preset positive integer not less than 2. In the digital-to-analog converter of FIG. 17, the number of the reference voltages, supplied to the decoder 810, is small as compared to the number of output levels supplied by the interpolation amplifier 830. In addition, the number of the transistor switches that make up the decoder is reduced. The decoder 810 is made up of transistor switches of a single conductivity type.

The reference voltage ensemble 820 includes a number of different reference voltages, in which voltage values are arrayed in accordance with an ordinal number sequence. These voltage values are grouped in (zS+1) reference voltage groups (820-1 to 820-(zS+1)). In the description to follow, multiplication mark (×) in the multiplication of symbols and numerical figures or that of symbols and other symbols are omitted for simplicity in notation. For example, zS denotes z×S, 2zS denotes 2×z×S and (j−1)zS denotes (j−1)×z×S.

The first reference voltage set 820-1 has $\{(j-1)zS+1\}$th reference voltages ($Vr\{(j-1)zS+1\}$), where j may assume values 1, 2, . . . , and h, where h being a positive integer not less than 2. In case the index number j assumes the total of the integer values of 1 to h, the reference voltage set 820-1 has the reference voltage $Vr\{1\}$, $Vr\{zS+1\}$, $Vr\{2zS+1\}$, . . . , and $Vr\{(h-1)zS+1\}$, at intervals of (zS) reference voltages.

The second reference voltage set 820-2 has $\{(j-1)zS+2\}$nd reference voltages ($Vr\{(j-1)zS+2\}$). In case the index number j assumes the total of the integer values of 1 to h, the reference voltage set 820-2 has the reference voltage $Vr\{2\}$, $Vr\{zS+2\}$, $Vr\{2zS+2\}, \ldots$, and $Vr\{(h-1)zS+2\}$, at intervals of (zS) reference voltages.

In similar manner, the (zS+1)th reference voltage set 820-(zS+1) has $\{(j-1)zS+(zS+1)\}$th, that is, $((jzS+1))$th, reference voltages $(Vr\{(j-1)zS+(zS+1)\})=Vr(jzS+1)$. In case the index number j assumes the total of the integer values of 1 to h, the (zS+1)th reference voltage set 820-(zS+1) has the reference voltage $Vr\{(zS+1)\}$, $Vr\{2zS+1\}$, $Vr\{3zS+1\}, \ldots$, and $Vr\{hzS+1\}$, at intervals of (zS) reference voltages.

In case the index number j assumes the total of integer values of 1 to h, the reference voltage ensemble 820 has (hzS+1) different reference voltages. There are cases where there partially lack the index numbers j in association with the case where there partially lack reference voltages.

Each of the first to (zS+1)th sub-decoders 811-1 to 811-(zS+1) is able to select each one reference voltage from each of the reference voltage groups (820-1 to 820-(zS+1)), depending upon the value of the (m−n) bits (D(m−1) to Dn and D(m−1)B to DnB) of the m-bit digital signal. It is noted that D(m−1)B to DnB are complementary signals of D(m−1) to Dn, respectively. It is also noted that the bit signals (D0, D0B) are LSBs (Least Significant Bits) and the bit signals (D(m−1) and D(m−1)B) are MSBs (Most Significant Bits), with the sides of the smaller and larger values of the symbol m being the lower side bits and upper side bits, respectively.

The sub-decoder 813 selects first and second voltages Vo1 and Vo2 from (zS+1) or less reference voltages, which have been selected by the first to (zS+1)th sub-decoders 811-1 to 811-(zS+1), depending upon the values of the lower side n bits (D(n−1) to D0 and D(n−1)B to D0B) of the m-bit digital signal.

The interpolation amplifier 830 receives the first and second voltages Vo1 and Vo2, selected by the sub-decoder 813, at P inputs, inclusive of duplications, as $V(T1), V(T2), \ldots$, and V(TP), to output voltage levels resulting from weighted averaging of the voltages $V(T1), V(T2), \ldots$, and V(TP) at a preset ratio. That is, the interpolation amplifier 830 is able to generate a plurality of voltage levels by interpolation of two voltages (Vo1, Vo2), which may be the same or different, and which have been selected by the decoder 810.

The reference voltages of the reference voltage ensemble 820 from Vr1 to Vr(hzS+1) are at respective different voltage levels. That is, VrX, where X=1 to (hzS+1), are arrayed in an ordinal sequence so as to increase or decrease monotonically in connection with the ascending or descending order of the value X.

More specifically, the interpolation amplifier 830 may be so configured that, with P=2, its two inputs T1 and T2 receive two voltages (Vo1, Vo2), with the voltages V(T1) and V(T2), supplied to the two inputs T1 and T2, being interpolated at 1:1 to yield (Vout=$\{V(T1)+V(T2)\}/2$), as disclosed in Patent Documents 1 to 3. It may also be so configured that, with P=3, its three inputs T1, T2 and T3 receive two voltages (Vo1, Vo2), with the voltages V(T1), V(T2) and V(T3), supplied to the three inputs T1, T2 and T3, being weight-averaged at a ratio of 1:1:2 to produce Vout $(V(T1)+V(T2)+2\times V(T3))/4$, as disclosed in Patent Documents 1 and 2.

The first to (zS+1)th sub-decoders 811-1 to 811-(zS+1) receive upper side (m−n) bit (D(m−1) to Dn and D(m−1)B to DnB in common. The (zS+1) or less reference voltages, as selected by the sub-decoders 811-1 to 811-(zS+1), are reference voltages in the reference voltage ensemble 820 differing in voltage levels and contiguous in ordinal voltage values.

For example, if the reference voltage $Vr\{(j-1)\,zS+1\}$ has been selected in the first sub-decoder 811-1, the reference voltage $Vr\{(j-1)\,zS+2\}$, reference voltage $Vr\{(j-1)\,zS+3\}, \ldots$, the reference voltage $Vr(jzS+1)$ are selected in the second sub-decoder, third sub-decoder, ..., and the (zS+1)th sub-decoder, respectively.

The following describes the grouping in the reference voltage ensemble 820 and the reference voltages selected by the sub-decoders 811-1 to 811-(zS+1) of FIG. 17.

FIG. 18 schematically shows an example grouping of the reference voltage ensemble 820 of FIG. 17, and has been drafted by the present inventor for illustrating the related technique. Referring to FIG. 18, a plurality of reference voltages, (hzS+1) reference voltages at the maximum, of the reference voltage ensemble 820 of FIG. 17, may be represented by a two-dimensional array of (zS+1) rows and h columns. In this two-dimensional array, the first to (zS+1)th reference voltage groups (820-1 to 820-(zS+1)) are allocated to rows, and the ordinal sequence numbers, such as 1, 2, ..., h−1 and h, where h in the reference voltage groups of the reference voltages belonging to the particular groups, are allocated to columns. It is noted that the two-dimensional array of FIG. 18 is not present in reality, for example, such as in the decoder 810, but is a kind of representation format suited for explaining the grouping/ordinal sequence of the reference voltages.

The element of the row i column j, allocated to the two-dimensional array, where i is an integer not less than 1 and not greater than (zS+1), j is an integer not less than 1 and not greater than h and h is an integer not less than 2, corresponds to the reference voltage $Vr((j-1)zs+i)$.

That is, the first reference voltage set 820-1 is composed of $(Vr1, Vr(zS+1), Vr(2zS+1), \ldots$, and $Vr\{(h-1)(zS+1)\}$, allocated to the first row of the two-dimensional array, with the voltage values spaced apart from one another by zS reference voltages.

The second reference voltage set 820-2 is composed of $(Vr2, Vr(zS+2), Vr(2zS+2), \ldots$, and $Vr\{(h-1)(zS)+2\}$, allocated to the second row of the two-dimensional array, with the voltage values being spaced apart from one another by zS reference voltages.

The i-th reference voltage set 820-i is composed of $(Vr(i), Vr(zS+i), Vr(2zS+i), \ldots$, and $Vr\{(h-1)(zS)+i\}$, allocated to the i-th row of the two-dimensional array, with the voltage values being spaced apart from one another by zS reference voltages.

The (zS+1)th reference voltage set 820-(zS+1) is composed of $(Vr(zS+1), Vr(2zS+1), Vr(3zS+1), \ldots$, and $Vr\{hzS+1\}$), allocated to the (zS+1)th row of the two-dimensional array, with the voltage values being spaced apart from one another by zS reference voltages.

The first to (h−1)th reference voltage in the (zS−1)th reference voltage set 820-(zS+1) (the reference voltages allocated to the first to the (h−1)th columns of the (zS+1)th row of the two-dimensional array) are the same as the second to the h-th reference voltages in the reference voltage set 820-1 (reference voltages allocated to the second to the h-th columns of the first row of the two-dimensional array).

The columns of the two-dimensional array of FIG. 18 are in keeping with the upper order (m−n) bits (D(m−1) to Dn and D(m−1)B to DnB) of the m-bit digital signal of FIG. 17. The reference voltages selected by the first to (zS+1)th sub-decoders 811-1 to 811-(zS+1) are reference voltages allocated to any one of the first to hth columns of FIG. 18 corresponding to the upper side (m−n) bits.

It is noted that FIG. 18 shows the location relationship among respective different (hzS+1) reference voltages of from Vr1 to Vr(hzS+1). In these reference voltages, any suitable preset number of the reference voltages as from Vr1 may be lacking. Also, any suitable preset number of the reference voltages as from a voltage ahead of the voltage Vr(hzS+1) down to the voltage Vr(hzS+1) may be lacking.

The relationship between FIG. 17 and the digital-to-analog converter shown in Patent Documents 1 to 3 will now be described.

(a) In the case of S=1 and z=2(zS+1=3), the digital-to-analog converter of FIG. 17 includes first to third sub-decoders supplied with a plurality of reference voltages grouped into three reference voltage groups and with upper side (m−n) bits of the m-bit digital signal. The digital-to-analog converter also includes a sub-decoder supplied with outputs of the first to third sub-decoders and with lower n bits of the m-bit digital signal to select first and second voltages (Vo1, Vo2). The digital-to-analog converter further includes an interpolation amplifier supplied with the first and second voltages (Vo1, Vo2) at its P inputs to weight-average the voltages received at a preset weight ratio to output a resulting voltage. Such case corresponds to FIG. 1 of Patent Document 1. It is noted that the symbol k of Patent Document 1 (FIG. 1) corresponds to a symbol j in FIG. 17.

(b) In the case of S=2, z=2(zS+1=5), and P=2, the digital-to-analog converter of FIG. 17 includes first to fifth sub-decoders supplied with a plurality of reference voltages grouped into five reference voltage groups and with upper side (m−n) bits of the m-bit digital signal. The digital-to-analog converter also includes a sub-decoder supplied with outputs of the first to fifth sub-decoders and with lower n bits of the m-bit digital signal to select first and second voltages (Vo1, Vo2). The digital-to-analog converter further includes an interpolation amplifier supplied with the first and second voltages (Vo1, Vo2) at its two inputs to average (interpolate) the voltages received at a preset ratio to output a resulting voltage. Such case corresponds to FIG. 3 of Patent Document 2. It is noted that the symbol S of Patent Document 2 corresponds to a symbol (zS) in FIG. 17.

(c) In the case of S=4, z=2 (zS+1=9), and P=2, the digital-to-analog converter of FIG. 17 includes first to ninth sub-decoders supplied with a plurality of reference voltages grouped into nine reference voltage groups and with upper side (m−n) bits of the m-bit digital signal. The digital-to-analog converter also includes a sub-decoder supplied with outputs of the first to ninth sub-decoders and with lower n bits of the m-bit digital signal to select first and second voltages (Vo1, Vo2). The digital-to-analog converter further includes an interpolation amplifier supplied with the first and second voltages (Vo1, Vo2) at its two inputs to average (interpolate) the voltages received at a preset ratio to output a resulting voltage. Such case corresponds to FIG. 9 of Patent Document 2.

(d) In the case of S=2, z=2 (zS+1 and P=3, the digital-to-analog converter of FIG. 17 includes first to fifth sub-decoders supplied with a plurality of reference voltages grouped into five reference voltage groups and with upper side (m−n) bits of the m-bit digital signal. The digital-to-analog converter also includes a sub-decoder supplied with outputs of the first to fifth sub-decoders and with lower n bits of the m-bit digital signal to select first and second voltages (Vo1, Vo2). The digital-to-analog converter further includes an interpolation amplifier supplied with the first and second voltages (Vo1, Vo2) at its three inputs to weight-average the voltages received at a ratio of 1:1:2 to output a resulting voltage. Such case corresponds to FIG. 16 of Patent Document 2.

(e) In the case of S being an integer equal to powers of 2, inclusive of 1, and being not less than 2, z=3 (zS+1=3S+1), and P=2, the digital-to-analog converter of FIG. 17 includes first to (3S+1)th sub-decoders supplied with a plurality of reference voltages grouped into (3S+1) reference voltage groups and with upper side (m−n) bits of the m-bit digital signal. The digital-to-analog converter also includes a sub-decoder supplied with outputs of the first to (3S+1)th sub-decoders and with lower n bits of the m-bit digital signal to select first and second voltages (Vo1, Vo2). The digital-to-analog converter further includes an interpolation amplifier supplied with the first and second voltages (Vo1, Vo2) at its two inputs to average (interpolate) the voltages received at a ratio of 1:1 to output a resulting voltage. Such case corresponds to FIG. 1 of Patent Document 3.

(f) In the case of S=2, z=3 (zS+1=7), and P=2, the digital-to-analog converter of FIG. 17 includes first to seventh sub-decoders supplied with a plurality of reference voltages grouped into seven reference voltage groups and with upper side (m−n) bits of the m-bit digital signal. The digital-to-analog converter also includes a sub-decoder supplied with outputs of the first to seventh sub-decoders and with lower n bits of the m-bit digital signal to select first and second voltages (Vo1, Vo2). The digital-to-analog converter further includes an interpolation amplifier supplied with the first and second voltages (Vo1, Vo2) at its two inputs to average (interpolate) the voltages received at a ratio of 1:1 to output a resulting voltage. Such case corresponds to FIG. 3 of Patent Document 3.

(g) In the case of S=1, z=3 (zS+1=4), and P=2, the digital-to-analog converter of FIG. 17 includes first to fourth sub-decoders supplied with a plurality of reference voltages grouped into four reference voltage groups and with upper side (m−n) bits of the m-bit digital signal. The digital-to-analog converter also includes a sub-decoder supplied with outputs of the first to fourth sub-decoders and with lower n bits of the m-bit digital signal to select first and second voltages (Vo1, Vo2). The digital-to-analog converter further includes an interpolation amplifier supplied with the first and second voltages (Vo1, Vo2) at its two inputs to average (interpolate) the voltages received at a ratio of 1:1 to output a resulting voltage. Such case corresponds to FIG. 7 of Patent Document 3.

As may be seen from above, various arrangements based upon various combinations of the symbols S, z and P in FIG. 17 correspond to the arrangements of the digital-to-analog converter disclosed in Patent Documents 1 to 3. The symbol S is an integer representing powers of 2, inclusive of 1, namely 1, 2, 4, . . . , the symbol z is an integer representing powers of 2, inclusive of 1, added to with 1, namely 2, 3, 5, 9, . . . . The symbol P is 2 or 3. It is noted that the results of analysis by the present inventor have revealed that a digital-to-analog converter of the configuration other than that disclosed in the Patent Documents 1 to 3 may similarly be implemented by various combinations of particular values of the above mentioned symbols. As for the relationship between the multiple reference voltages and the voltage level that may be output from the interpolation amplifier, reference may be made to data disclosed in the Patent Documents 1 to 3.

The following describes the configuration of the sub-decoders 811-1 to 811-(zS+1) of FIG. 17. FIG. 19 shows the configuration of an i-th sub-decoder 811-*i* (i=1 to (zS+1)), and has been drafted by the present inventor in order to illustrate the related technique. It is assumed that the reference voltage ensemble 820 has (hzS+1) respective different reference voltages from Vr1 to Vr(zS+1). In this case, the first to the (zS+1)th sub-decoders are of the same circuit configuration, with the difference being in the sets of the reference voltages supplied to the sub-decoders. In FIG. 19, the leftmost reference voltage set 820-1 is supplied to the first sub-decoder 811-1, the reference voltage set 820-2 is supplied to the second sub-decoder 811-2 and the reference voltage set 820-(zS+1) is supplied to the (zS+1)th sub-decoder 811-(zS+

1). However, the sub-decoder shown is only the i-th sub-decoder. In FIG. 19, the first to the (zS+1)th sub-decoders 811-$i$, where i is 1 to (zS+1), select reference voltages Vr{(j−1)zS+1}, Vr{(j−1)zS+2}, . . . , Vr{jzS+1}, bearing the ordinal sequence number of j in the respective reference voltage groups (820-1 to 820-(zS+1)), depending upon the values of upper side (m−n) bits of the m-bit digital signal (D(m−1) to Dn and D(m−1)B to DnB). These reference voltages, bearing the ordinal sequence number of j, correspond to the elements of the column j (j-th column) of the two-dimensional array of FIG. 18.

In FIG. 19, the sub-decoder 811-$i$, where i=1 to (zS+1), inputs h reference voltages and sequentially makes selection on the basis of (m−n) bits (D(m−1) to Dn and D(m−1)B to DnB) of the m-bit digital signal in a sequence of from lower side bits (Dn, DnB) to the upper side bits. The sub-decoder 811-$i$ is thus a tournament configuration switch, and selects a sole voltage with D(m−1), D(m−1)B to output the so selected voltage.

Each switch is composed by a pass transistor of a single conductivity type. In case the switch is composed by an Nch transistor, Dn to D(m−1) are supplied to bit signal lines b1 to b5, whilst DnB to D(m−1)B are supplied to bit signal lines b1$b$ to b5$b$. In case the switch is composed by a Pch transistor, DnB to D(m−1)B are supplied to the hit signal lines b1 to b5, whilst Dn to D(m−1) are supplied to the bit signal lines b1$b$ to b5$b$. FIG. 19 shows, for explanation sake, the configuration of a sub-decoder of a 5-bit tournament configuration made up of a number of Nch transistors.

The following describes the configuration of the sub-decoder 813 of FIG. 17. The sub-decoder 813 differs in configuration depending upon the values of the symbols A, z and P and upon the conductivity types of the transistor switches. In the following, a typical example of an Nch transistor configuration will be explained.

FIG. 20 shows a configuration of a sub-decoder 813-A, where S=2, z=2 (zS+1=5) and P=2. As for details, see Patent Document 2. The Nch transistor switches, connected to (D2B, D2), select one out of (Vr(4j−3), Vr(4j−1)), one out of (Vr(4j−2), Vr(4j)) and one out of (Vr(4j−1), Vr(4j+1)), respectively, to output the selected three voltages at nodes n3, n4 and n5. In case D2=1 (HIGH), (n3, n4, n5)=(Vr(4j−1), Vr(4j), Vr(4j+1)), whereas, if D2B=1, (n3, n4, n5)=(Vr(4j−3), Vr(4j−2), Vr(4j)).

The Nch transistor switches, connected to (D1B, D1), select one out of (node n3, node n4) and one out of (node n4, node n5) to output the resulting two at nodes T1 and n2. If D1 is 1, (T1, n2)=(n4, n5) and, if D1B is 1, (T1, n2)=(n3, n4).

The Nch transistors, connected to (D0B, D0), select one out of the nodes T1 and n2 to output the resulting one at node T2. If D0 is 1, T2=n2 and, if D0B is 1, T2=T1.

The nodes T1 and T2 output two voltages having contiguous ordinal sequence numbers or, in duplication, a single voltage (two same voltages), as first and second voltages (Vo1, Vo2), to the interpolation amplifier 830. The voltages V(T1) and V(T2) at the respective nodes T1 and T2 are interpolated at a ratio of 1:1 and the resulting voltage is output to the interpolation amplifier 830.

FIG. 21 shows a configuration of a sub-decoder 813-B where S=2, z=2 (zS+1=5) and P=3. As for details, see Patent Document 2. The Nch transistor switches, connected to (D3B, D3), select one out of (Vr(4j−3), Vr(4j−1)), one out of (Vr(4j−2), Vr(4j) and one out of (Vr(4j−1), Vr(4j+1), respectively, to output the selected three voltages at nodes n13, n14 and n15. In case D3=1 (HIGH), (n13, n14, n15) (Vr(4j−1), Vr(4j), Vr(4j+1)), whereas, if D3B=1, (n13, n14, n15)=(Vr(4j−3), Vr(4j−2), Vr(4j)).

The Nch transistor switches, connected to (D2B, D2), select one out of (node n13, node n14) and one out of (node n14, node n15) to output the resulting two at nodes T2 and n12. If D2 is 1, (T2, n12)=(n14, n15) and, if D2B is 1, (T2, n12)=(n13, n14).

The Nch transistor switches, connected to (D1B, D1), select one of the nodes T2, n12 to output the selected one at the node T3. In case D1 is 1, T3=n12, whereas, in case D1B=1, and T3=T2.

The Nch transistor switches, connected to (D0B, D0), select one of the nodes T2, n12 to output the selected one at the node T1. In case D0 is 1, T1=n12, whereas, in case D0B=1, T1=T2.

The nodes T1, T2 and T3 output two voltages having contiguous ordinal sequence numbers, or a single voltage in duplication (two same voltages), as first and second voltages (Vo1, Vo2) to the interpolation amplifier 830. The interpolation amplifier 830 weight-averages (or interpolates) voltages V(T1), V(T2) and V(T3) of the respective nodes T1, T2 and T3 at a ratio of 1:1:2 to output a resulting weight averaged voltage.

FIG. 22 shows a configuration of a sub-decoder 813-C where S=1, z=3(zS+1=4) and P=2. As for details, see Patent Document 3. The Nch transistor switches, connected to (D0B, D0), select one out of (Vr(3j−2), Vr(3j−1)), one out of (Vr(3j−1), Vr(3j) and one out of (Vr(3j−1), Vr(3j−2), respectively, to output the selected three voltages at nodes n24, n25, n26 and n27. In case D0=1 (HIGH), (n24, n25, n26, n27)= (Vr(3j−1), Vr(3j), Vr(3j+1) Vr(3j−2), whereas, if D0B=1, (n24, n25, n26, n27)=(Vr(3j−2), Vr(3j−1), Vr(3j), Vr(3j−1)).

The Nch transistor switches, connected to (D1B, D1), select one out of (node n24, node n25), one out of (Vr(3j−2), node n27) and one out of (Vr(3j−1), Vr(3j)) to output the resulting three voltages at nodes 21, 22 and 23. If D1 is 1 (HIGH), (n21, n22, n23)=(n25, n27, Vr(3j)) and, if D1B is 1, (n21, n22, n23) (n24, Vr(3j−2), Vr(3j−1)).

The Nch transistor switches, connected to (D2B, D2), select one out of the nodes n21, n26 and one out of nodes n22, n23 to output the selected one at the nodes T1 and T2. In case D2 is 1 (HIGH), (T1, T2)=(n26, n23), whereas, in case D2B=1, (T1, T2)=(n21, n22).

The nodes T1 and T2 output either two voltages or a single voltage (two same voltages), in duplication, as first and second voltages (Vo1, Vo2), to the interpolation amplifier 830. This interpolation amplifier 830 weight averages (or interpolates) voltages V(T1) and V(T2) of the nodes T1 and T2 at a ratio of 1:1 to output a resulting averaged voltage.

RELATED DOCUMENTS

Patent Documents

[Patent Document 1]
JP Patent Kokai Publication No. JP-α2009-104056A
[Patent Document 2]
JP Patent Kokai Publication No. JP-P2009-284310A
[Patent Document 3]
JP Patent Kokai Publication No. JP-P2009-213132A
[Patent Document 4]
JP Patent Kokai Publication No. JP-P2007-158810A

SUMMARY

The following describes problems of the related techniques.

Referring to FIGS. 12A and 12B, the output voltage range of a driver will now be explained. FIGS. 12A and 12B have been drafted by the present inventor to illustrate the problem inherent to the related technique. FIG. 12A represents an output voltage range of an LCD driver. The LCD driver effects polarity inversion driving from the positive electrode to the negative electrode and vice versa with respect to a common electrode voltage COM. An output voltage range of the positive electrode is divided into a high potential side and a low potential side, as is that of the negative electrode. However, in light of an adjustment width Vdif1 of the common electrode voltage, it is required of the possible output voltage ranges of the positive and negative electrodes to be broader than (½)×(VDD−VSS), where VSS in general is the ground potential=0V.

FIG. 12B shows an output voltage range of an OLED driver for active matrix driving (voltage programming configuration). In the OLED driver, polarity inversion driving, such as is performed in LCD, shown in FIG. 12A, is not carried out. FIG. 12B shows a case where the output voltage range is (VSS+Vdif2) to VDD, where Vdif2 is a potential difference. This voltage difference Vdif2 is correlated with the electrode-to-electrode potential difference needed for light emission of an OLED element formed on a display panel or with a threshold voltage of a transistor on a display panel that controls the current supplied to the OLED element.

In FIGS. 12A and 12B, it is required of the LCD driver and the OLED driver to have an output voltage range which is broad enough as compared to the power supply voltage. It is thus required of a decoder provided in each of these drivers for selecting a reference voltage corresponding to an output voltage level, to possess a broad range of voltage selection in dependence upon a data signal (digital picture signal). For example, in a decoder, the reference voltage on the high potential side (VDD side) may be selected by a Pch transistor switch (Pch-SW). However, a Pch transistor (Pch-SW), selecting the low potential side (VSS side) reference voltage, has its threshold voltage (absolute value) increased due to a substrate bias effect, thus decreasing the transistor's gate-to-source voltage Vgs (absolute value). Hence, the transistor's on-resistance increases to lower the current driving capability, such that there may be cases where it is not possible to select/output the low potential side (VSS side) reference voltage.

It is thus necessary to increase the transistor size (gate width W) of the Pch-SW that selects the low potential side (VSS side) reference voltage or to use a CMOS switch composed by an Nch-SW and a Pch-SW connected parallel to each other (combination of Pch-SW and Nch-SW). The Pch-SW is to select a low potential side (VSS side) reference voltage. This configuration leads to a markedly increased decoder area.

FIG. 13A schematically shows, for a standard size Pch-SW of a decoder, the relationship between the input reference voltage and an output selected voltage. FIG. 13B schematically shows the same relationship for a standard size Nch-SW of the same decoder. FIG. 13C shows, for the Pch-SW, the relationship between a selection voltage and an on-resistance (characteristic 71), and FIG. 13D shows the same relationship between the selection voltage and an on-resistance (characteristic 72) for the Nch-SW. It is noted that the selected voltage and the on-resistance shown is an averaged value per one Pch-SW or per one Nch-SW, and that the abscissa denotes the selected voltage (switch output voltage), while the ordinate denotes the on-resistances of the transistor switches. Meanwhile, FIGS. 13A-13D have been drafted by the present inventor to illustrate the problem inherent in the related technique.

In FIG. 13C, a voltage range Vpa to VDD, denoted as (a−1), represents a voltage range that may be selected at a sufficient operational speed only with the standard size Pch-SW. The gate potential of the Pch-SW is the Low voltage (VSS). In case the selected voltage is the high voltage range of (a−1), the absolute value of the gate/source voltage Vgs is increased. The on-resistance is small, as shown in by the characteristic 71. In FIG. 13C, Ro on the ordinate represents an allowable upper limit value of the Pch-SW that takes the output delay of the selected voltage into account.

Referring to FIG. 13C, a voltage range Vpb to Vpa, denoted as (a−2), represents a voltage range which may be selected solely with the Pch-SW but in which the on-resistance is rather high such that the operational speed falls into shortage. It is necessary to increase the gate width (W) of Pch-SW so that it will be sufficiently larger than the standard size to decrease its on-resistance.

In FIG. 13C, a voltage range VSS to Vpb, indicated as (a−2), denotes a voltage range for which it is not possible to output the selected voltage solely by the Pch-SW. It is thus necessary to use an Nch-SW in combination with the Pch-SW to form a CMOS.

Referring to FIG. 13D, a voltage range VSS to Vna, denoted as (b−1), represents a voltage range that may be selected at a sufficient operational speed only with the standard size Nch-SW. The gate potential of the Nch-SW is the high voltage (VDD). In case the selected voltage is the high voltage range of (b−1), the absolute value of the gate/source voltage Vgs is increased. The on-resistance is small, as shown by a characteristic 72. In FIG. 13D, Ro on the ordinate represents an allowable upper limit value for the Nch-SW that takes the output delay of the selected voltage into account.

Referring to FIG. 13D, the voltage range Vnb to Vna, denoted as (b−2), represents a voltage range which may be selected solely with Pch-SW but in which the on-resistance is rather high so that the operational speed falls into shortage. It is necessary to increase the gate width (W) of Nch-SW so that it will be sufficiently larger than the standard size to decrease its on-resistance.

In FIG. 13D, a voltage range Vnb to VDD, denoted as (b−2), represents a voltage range for which voltage selection is not possible solely by the Nch-SW. It is thus necessary to use an Nch-SW in combination with the Pch-SW to form a CMOS.

It may be seen from above that, in a decoder in need of a broad range of voltage selection, it is necessary to increase the gate width (W) of a transistor of a single conductivity type or to combine a Pch-SW and an Nch-SW to from a CMOS.

FIG. 15 schematically shows a typical example configuration of a data driver, more specifically a single chip of an LSI of the data driver. FIG. 15 depicts a circuit block diagram of an OLED or one out of the positive electrode and the negative electrode of an LCD. FIG. 15 has been drafted by the present inventor for explaining the problem inherent in the related technique.

Referring to FIG. 15, the data driver includes a reference voltage generator 704 that outputs a plurality of reference voltages, a set of decoders 705-1 to 705-$q$ and amplifiers (interpolation amplifiers) 706-1 to 706-$q$. Outputs S1 to Sq of the data driver are taken at the ends of a longer side of the chip. The more the number of outputs, the longer becomes the length of the long side of the chip.

The multiple reference voltages (reference voltage ensemble), output from the reference voltage generator 704, are supplied common to the decoders 705-1 to 705-$q$. A plurality of reference voltage wirings are laid along the long side of the chip 980. Digital data signals are fed to the decoders 705-1 to 705-$q$ arranged in association with the outputs S1 to Sq. A plurality of bit lines that form the digital data signals are laid along the short side of the chip 980. To form the decoders 705-1 to 705-$q$, a Pch transistor area 705P, formed by solely the Pch-SWs, and an Nch transistor area 705N, formed by solely the Nch-SWs, are arrayed in a vertical direction in the drawing, that is, along the short side of the chip, in an arbitrary order. In a silicon LSI, a number of Pch transistors and a number of Nch transistors are preferably collectively arranged in an N-well and in a separate P-well, respectively, for space saving. The reason is that the separation between neighboring transistors may in general be reduced in the same well but it tends to increase in different wells.

It is therefore more preferable to arrange the Pch transistor area 705P and the Nch transistor area 705N in an up-and-down direction in the drawing for extending along the short side direction than arraying the transistor areas alternately along the long side direction. It is because the distances between transistors of the outputs of the decoders 705-1 to 705-$q$ and hence the distances between the outputs of the outputs S1, S2, . . . , and d Sq may be reduced, as a result of which the area of the LSI chip 980 may be reduced. Each decoder selects the multiple voltages, output from the reference voltage generator 704, by transistor switches of the Pch transistor area 705P and the Nch transistor area 705N. The voltages selected may be supplied via wirings extending along the short side of the chip to the amplifier circuit arranged below the decoder. It is noted that bit signal lines that control the gates of the transistor switches are connected to the Pch transistor area 705P and the Nch transistor area 705N of the respective decoders. A number of bit signal lines at least equal to twice the number of the bits, inclusive of the complementary signal lines, are arrayed along the short side of the chip 980. Although the reference voltage generator 704 is arranged on the left side of the decoders 705-1 to 705-$q$ of the reference voltage generator 704, they may also be arrayed on the right side of or between the decoders 705-1 to 705-$q$.

However, if, in the respective decoders, the number of the transistor switches that form CMOS circuits is increased, the number of wirings that interconnect the transistor switches of the Pch transistor area 705P and the Nch transistor area 705N is increased, thus increasing the area taken up by the wirings.

In the digital-to-analog converter circuit, including a decoder that selects and outputs a plurality of voltages from the reference voltage ensemble, in response to a digital signal, and an amplifier circuit that performs an operation on a plurality of voltages to output multi-valued voltage levels, it is necessary for the decoder to have a broad range of voltage selection. Such decoder may not be constructed solely by transistors of the single conductivity type, that is, the Pch or Nch transistors, given the broad range of the voltage selection. It is thus necessary to use a CMOS switch configuration by combining Pch-SWs and Nch-SWs or to set gate widths (W) of the transistor switches of the single conductivity type at a larger value, thus increasing the decoder area.

It is therefore an object of the present invention to provide a digital-to-analog converter circuit having a decoder that selects a plurality of voltages from an ensemble of reference voltages in response to a digital signal and outputs the so selected voltages, and an amplifier circuit. In the digital-to-analog converter circuit, the number of transistor switches in forming a CMOS configuration by combining Pch and Nch transistors is to be reduced. On the other hand, the gate widths of the transistor switches, which do not form the CMOS configuration but the gate widths of which need to be increased, may be suppressed from increasing so as not to increase the decoder area. There are also provided a data driver and a display apparatus, including the digital-to-analog converter circuit.

It is also an object of the present invention to provide the digital-to-analog converter circuit in which, as long as the transistor switches to form the CMOS configuration is concerned, the number of wirings connecting the regions of the Pch transistor switches and Nch transistor switches may be suppressed from increasing. There are also provided a data driver and a display apparatus, including the digital-to-analog converter circuit.

To solve at least one of the above mentioned problems, the present invention provides following configuration, which is given by way of illustration and not limited thereto:

According to one aspect of the present invention, there is provided a digital-to-analog converter circuit comprises:

a reference voltage ensemble that includes a plurality of reference voltages different from one another;

a decoder that receives an m-bit digital signal, where m is a preset positive integer not less than 3, and that selects first and second voltages from the reference voltage ensemble, based on the m-bit digital signal; and an amplifier circuit that receives the first and second voltages, selected by the decoder, and that performs operational amplification on the first and second voltages to output a resulting voltage level, at an output terminal thereof.

The reference voltage ensemble includes: a first reference voltage set; and a second reference voltage set, the first reference voltage set including a part or all of the reference voltages of the second reference voltage set.

The decoder includes: a first sub-decoder section that includes a plurality of switches that are controlled to be electrically conductive or non-conductive, based on a signal of an upper side (m–n) bit of the m-bit digital signal, the plurality of switches selecting Q reference voltages different one another from the first reference voltage set to transfer the Q reference voltages selected to the first to Qth nodes, respectively, where Q is a preset positive integer not less than 2;

a second sub-decoder section that includes a plurality of switches that are controlled to be electrically conductive or non-conductive, based on the signal of the upper side (m–n) bit of the m-bit digital signal, the plurality of switches selecting Q reference voltages different one another from the first reference voltage set to transfer the Q reference voltages selected to the first to Qth nodes, respectively, where Q is a preset positive integer not less than 2;

third and fourth sub-decoder sections, each of which includes first to Qth input nodes, in common, as input nodes, and includes a plurality of switches that are controlled to be electrically conductive or non-conductive, based on a signal of lower side n bits of the m-bit digital signal, the plurality of switches of the third and fourth sub-decoder sections selecting in common the first and second voltages from the Q reference voltages transferred to the first to Qth nodes to transfer the first and second voltages selected to the first to Pth nodes, where P is a preset positive integer not less than 2.

The amplifier circuit includes first to Pth inputs that are connected to the first to Pth nodes, the amplifier circuit taking a weighted average of voltages transferred to the first to Pth nodes and received at the first to Pth inputs, with preset weighting factors to output a weighted average voltage as an analog signal corresponding to the m-bit digital signal.

The switches of the first and third sub-decoders each are composed by a transistor of an identical conductivity type and the switches of the second and fourth sub-decoders each being composed by a transistor having a conductivity type opposite to that of the switches of the first and third sub-decoders.

According to the present invention, there are also provided a data driver having the digital-to-analog converter and a display apparatus having the data driver.

According to the present invention, the third and fourth sub-decoders may transfer the same voltage to a part or the total of the first to Pth nodes based upon a value of lower side n bits of the m-bit digital signal. The present invention also provides a data driver including the digital-to-analog converter circuit, and a display apparatus including the data driver.

According to the present invention, there is provided a digital-to-analog converter circuit including a decoder that can extend a range of voltage selected by the decoder, with the number of transistor switches to be formed into a CMOS being suppressed from increasing. In addition, a gate width of transistor switches, each of which is a pass transistor and not configured as a CMOS switch, may be suppressed from increasing, thereby being able to suppress an increase of a circuit area. There are also provided a data driver and a display apparatus. Moreover, according to the present invention, an amount of wiring interconnections between Pch and Nch transistor regions as well as a wiring area may be suppressed from increasing.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 4 is a diagram for illustrating a reference voltage group and the ordinal sequence numbers of the reference voltages in the reference voltage group according to the first exemplary embodiment of the present invention.

FIGS. 13A to 13D are diagrams showing the relationship between the selection voltages of the Pch-SW and the Nch-SW and on-resistance.

FIG. 18 is a diagram for illustrating the reference voltage group of FIG. 17 and the ordinal sequence of the reference voltages of the reference voltage group.

PREFERRED MODES

Figure 1:
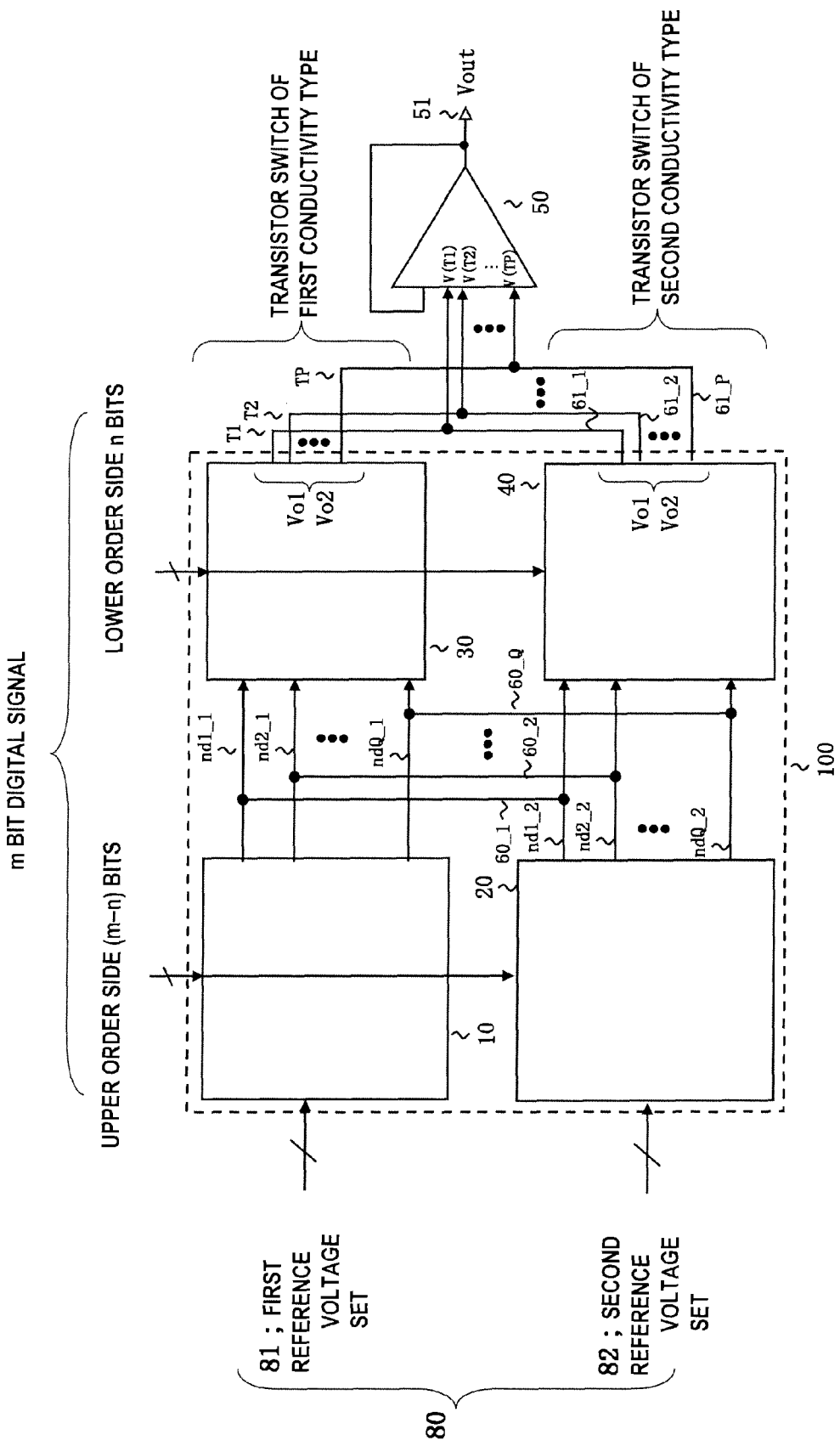
FIG. 1 is a schematic circuit diagram showing a configuration of one of exemplary embodiments of the present invention.

The following describes preferred exemplary embodiments of the present invention. It is noted that symbols used in the drawings and description of the related technique are also used in the drawings which are referred by exemplary embodiments provided that the symbols designate components used for the same purposes. FIG. 1 shows an arrangement of one of preferred modes. More specifically, FIG. 1 shows the configuration of a digital-to-analog converter circuit including a decoder for OLED or a decoder for one of the positive and negative polarities of LCD. Referring to FIG. 1, the digital-to-analog converter circuit according includes a reference voltage ensemble or family 80, a decoder 100, and an amplifier circuit 50. The reference voltage ensemble 80 includes a plurality of reference voltages different each other. The decoder 100 receives an m-bit digital signal, m being a preset positive integer not less than 3, and selects first and second voltages (Vo1, Vo2) from the reference voltage ensemble 80, based on the m-bit digital signal. The amplifier circuit 50 inputs the first and second voltages (Vo1, Vo2) as selected by the decoder 100 to output at an output terminal 51 a voltage level obtained on amplification by an operation on the first and second voltages (Vo1, Vo2).

The reference voltage ensemble 80 includes a first reference voltage set 81 and a second reference voltage set 82. The first reference voltage set 81 includes a part or an entirety of the second reference voltage set 82.

The decoder 100 includes first and second sub-decoder sections 10 and 20 that receive, in common, a signal of upper side (m−n) bits of the m-bit digital signal, where n is a preset positive integer not less than 2 and not greater than m−1, and that also receive the first and second reference voltage sets 81 and 82. The decoder 10 also includes third and fourth sub-decoder sections 30 and 40 that receive, in common, a signal of the lower side n-bits of the m-bit digital signal.

The first sub-decoder section 10 includes a plurality of switches that are controlled to be electrically conductive or non-conductive, based on the signal of the upper side (m−n) bits, select respective different Q reference voltages, where Q is a preset positive integer not less than 2, from the first reference voltage set 81 and transfer the so selected reference voltages to first to Qth nodes nd1_1, nd2_1, . . . , and ndQ_1. The second sub-decoder section 20 also includes a plurality of switches controlled to be electrically conductive or non-conductive, based on the signal of the upper side (m−n) bits, select respective different Q reference voltages, where Q is a preset positive integer not less than 2, from the second reference voltage set 82, and transfer the so selected reference voltages to first to Qth nodes nd1_2, nd2_2, . . . , and ndQ_2 connected in common with the first sub-decoder section 10. The third and fourth sub-decoder sections 30 and 40 share the first to Qth nodes nd1_1, nd2_1, . . . , and ndQ_1 (and the nodes nd1_2, nd2_2, . . . , and ndQ_2), as input nodes in common, and each similarly include a plurality of switches that are controlled to be electrically conductive or non-conductive, based on a signal of lower side n bits, select first and second voltages (Vo1, Vo2) from Q reference voltages selected by the first or second sub-decoder section 10 or 20, and transfer the so selected first and second voltages (Vo1, Vo2), inclusive of duplications, to the first to Pth nodes T1, T2, . . . , and TP, shared as output nodes, where P is a preset positive integer not less than 2. It is noted that the first to Qth nodes (nd1_1, nd_2_1, . . . , and ndQ_1) that receive outputs of the first sub-decoder section 10 and the first to Qth nodes (nd1_2, nd2_2, . . . , and ndQ_2) that receive outputs of the second sub-decoder section 20 are the identical Q nodes. That is, a pair nodes nd1_1 and nd1_2, a pair nodes nd2_1 and nd2_2, . . . , and a pair nodes ndQ_1 and ndQ_2 are respectively connected in common. However, for convenience in explanation, suffixes _1 and _2 are appended to the notation for the nodes for distinction as well as for matching to the output nodes of the first and second sub-decoder sections 10 and 20. The nodes nd1_1 and nd1_2 are connected by a wiring (interconnect) 60_1 connecting the Pch/Nch regions, the nodes nd2_1 and nd2_2 are connected by a wiring (interconnect) 60_2 connecting the Pch/Nch regions and so forth until the nodes ndQ_1 and ndQ_2 are connected by a wiring (interconnect) 60_Q connecting the Pch/Nch regions.

The first and second voltages (Vo1, Vo2), connected in common to the output nodes of the third and fourth sub-decoder sections 30 and 40, are either two different voltages differing in the order in the reference voltage ensemble 80, or a single voltage selected in duplication. The P output nodes of the third sub-decoder section 30 and the P output nodes of the fourth sub-decoder section 40 are connected to the first to Pth nodes (terminals) T1, T2, . . . , and TP by first to Pth wirings (interconnects) 61_1 to 61_P that connect the Pch/Nch regions, respectively. These wirings 60_1 to 60_Q and 61_1 to 61_P arranged between the Pch/Nch regions are also termed Pch/Nch transistor region interconnection wirings.

The amplifier circuit 50 receives the first and second voltages (Vo1, Vo2), transferred to the first to Pth nodes T1, T2, . . . and TP connected in common to the output nodes of the third and fourth sub-decoder sections 30 and 40, at the first to Pth inputs that are respectively connected to the nodes T1, T2, . . . , and TP. The amplifier circuit 50 takes a weighted average, with preset weighting factors, on the voltages V(T1), V(T2), . . . , and V(TP) received at the first to Pth inputs and outputs, at its output terminal 51, a resulting weight average voltage Vout.

The switches of the first and third sub-decoders 10 and 30 are composed by transistors of a first conductivity type (Pch or Nch), whilst the second and fourth sub-decoders 20 and 40 are composed by transistors of a second conductivity type (Nch or Pch).

The voltage Vout of the amplifier circuit 50 is produced by weighted averaging of V(T1) to V(TP) with respective preset weightings factors w1 to wP, as follows.

$$Vout = w1*V(T1) + w2*V(T2) + \ldots + wP*V(TP) \tag{1-1}$$

$$w1 + w2 + \ldots + wP = 1 \tag{1-2}$$

In case of taking a simple average or an arithmetic average, w1 to wP are set to w1=w2= . . . =wP=1/P.

As for an amplifier circuit in which the output terminal 51 is feed back connected to one input (inverting input) to output a voltage corresponding to a weighted average voltage of a plurality of voltages, reference may be made to, for example, the disclosure of Patent Documents 1 and 2.

The first and second sub-decoder sections 10 and 20 may differ from each other as to the number of the input reference voltages, even though the number of the outputs Q is the same.

The input nodes of the third and fourth sub-decoder sections 30 and 40 are connected in common by the Pch/Nch region connecting wirings 60_1 to 60_Q, while the output nodes thereof are also connected in common by the Pch/Nch region connecting wirings 61_1 to 61_P. However, the third and fourth sub-decoders may differ from each other in their inner configurations.

Based upon a signal of lower side n-bits of the m-bit digital signal, the third and fourth sub-decoder sections 30 and 40 perform the processing of decoding in which the first and second voltages (Vo1, Vo2) selected in common out of input Q reference voltages are allocated to first, second, . . . , and Pth nodes.

Inputs of the third sub-decoder section 30 of the first conductivity type (Pch or Nch) and inputs of the fourth sub-decoder section 40 of the second conductivity type (Nch or Pch) are connected together. By so doing, the transistor switches of the first conductivity type of the third sub-decoder section 30 and the transistor switches of the second conductivity type, corresponding to the transistor switches of the first conductivity type, constitute an equivalent CMOS configuration. Hence, in the third and fourth sub-decoder sections 30 and 40, on-resistances of the switches, which serve to transfer the first and second voltages selected (Vo1, Vo2), may be reduced, as compared to those in case the switches of the single conductivity type (first or second conductivity type) are used.

When Q reference voltages are selected in the second sub-decoder section 20 from plural reference voltages of the second reference voltage set 82 included in the first reference voltage set 81, the first sub-decoder section 10 similarly selects the same reference voltages as those selected in the second sub-decoder section 20.

On the other hand, when Q reference voltages are selected in the first sub-decoder section 10 from plural reference voltages of the first reference voltage set 81 not included in the second reference voltage set 82, the second sub-decoder section 20 is not selected (that is, the switches of the second sub-decoder section 20, which select a reference voltage out of the second reference voltage set 82, are all in an off state). In similar manner, when Q reference voltages are selected in the second sub-decoder section 20 from plural reference voltages of the second reference voltage set 82 not included in the first reference voltage set 81, the first sub-decoder section 10 is not selected (that is, the switches of the first sub-decoder section 10, which select a reference voltage out of the first reference voltage set 81, are all in an off state). Accordingly, there is prevented an occurrence of a situation in which, in the common output nodes nd1_1, nd2_1, . . . , and ndQ_1 (and nd1_2, nd1_2, . . . , and ndQ_2) of the first and second sub-decoder sections 10 and 20, respective different reference voltages are selected from the first and second sub-decoder sections 10 and 20 to collide against each other.

The third and fourth sub-decoder sections 30 and 40 are combined together to provide an equivalent CMOS configuration by having the input nodes and the output nodes of the third and fourth sub-decoder sections 30 and 40 shared by the sub-decoder sections 30 and 40. As a result, on-resistances of the switches, transferring the selected voltages, may be reduced. As regards the transistor switches of the first and second sub-decoder sections 10 and 20, not forming the equivalent CMOS configuration (a transistor switch of a single pass transistor of first or second conductivity type), it is possible to suppress the transistor size (that is, a gate width) from increasing. Since these transistor switches (pass transistors) may be of a standard size, it is possible to save the area of the decoder 100.

Figure 14A:
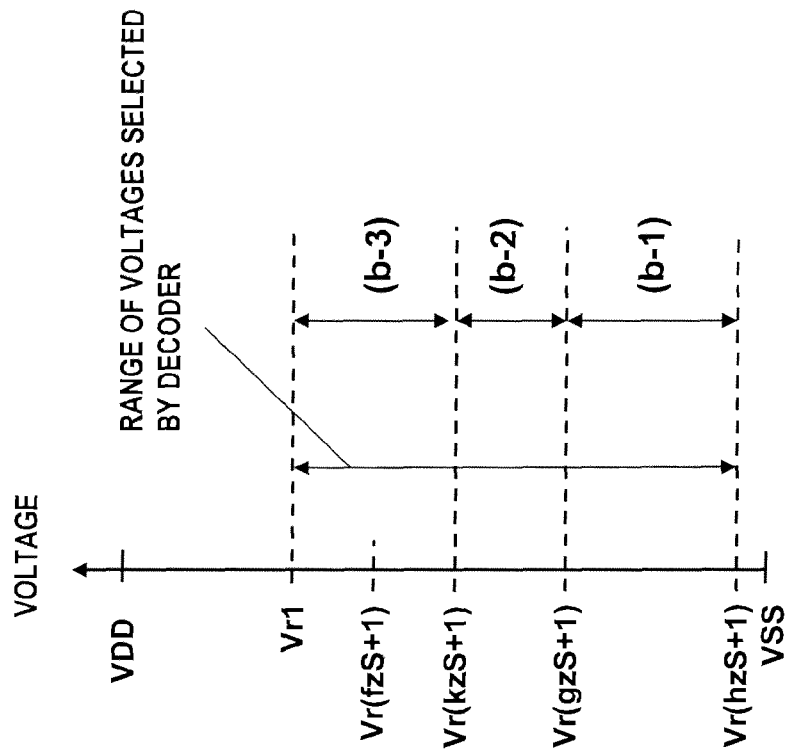
FIGS. 14A and 14B are diagrams showing the selection voltages of the Pch-SW and the Nch-SW and the on-resistances.
Figure 14B:
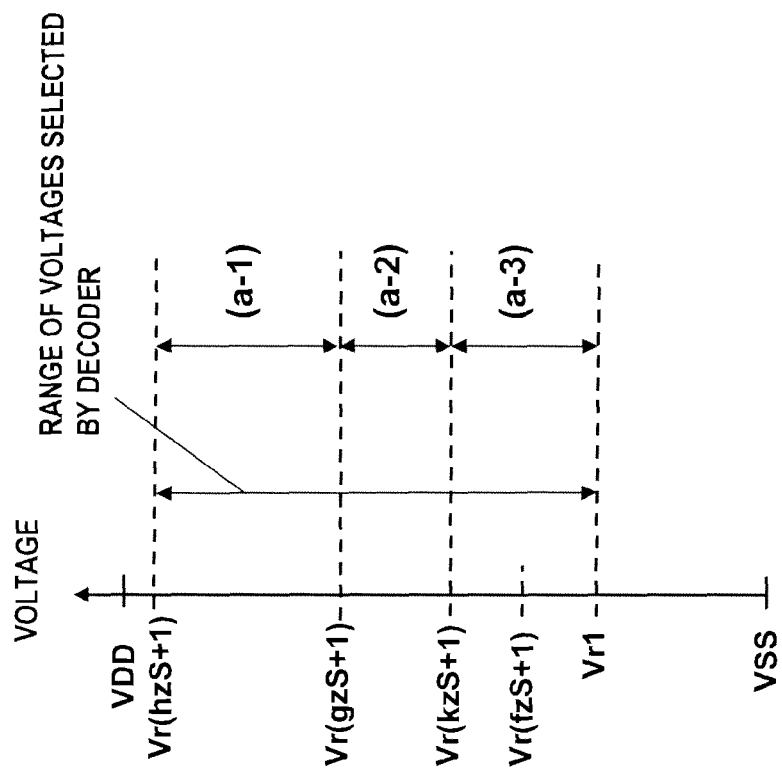

The following describes several exemplary embodiments. Initially, the relationship of correspondence of the reference voltages and the range of voltage selection by the decoder will be explained. FIG. 14A is a diagram showing the relationship of correspondence between the reference voltages in a decoder for an OLED or a positive electrode decoder associated with the voltage range of the positive electrode of an LCD and the range of voltage selection by the decoder. FIG. 14B is a diagram showing the relationship of correspondence between the reference voltages in a negative electrode decoder associated with the voltage range of the negative electrode of an LCD and the range of voltage selection by the decoder.

Referring to FIG. 14A, reference voltages Vr1 to Vr(hzS+1), offset towards the high potential side power supply VDD, are supplied to the decoder for OLED or the positive electrode decoder for the voltage range of the positive electrode of LCD. The reference voltages Vr1 and Vr(hzS+1) are to be the lower limit (towards the low potential) and the upper limit (the high potential side) of the range of voltage selection by the decoder. The reference voltages from Vr1 to Vr(hzS+1) are in the ordinal sequence, here representing monotonically increasing voltage levels.

In this decoder, the switches that select reference voltages of the high potential side range of Vr(gzS+1) to Vr(hzS+1), where h>g, may be composed by solely the Pch-SWs of the standard size. The reference voltages are in a voltage range (a–1) of FIG. 13C, with the on-resistances of the Pch-SWs being low and the absolute values of the gate-to-source voltage Vgs being larger.

The switches that select the reference voltages in a range from Vr(kzS+1) to Vr(gzS+1), where g>k, may be composed solely by the Pch-SWs. The reference voltages are in a voltage range (a–2) of FIG. 13C, with the on-resistances of the Pch-SWs being rather high and the absolute values of the gate-to-source voltage Vgs being rather small. It is necessary to increase a gate width (W) of the Pch-SW.

The switches that select the reference voltages in a range from Vr1 to Vr(kzS+1), where k>1, are unable to be composed solely by the Pch-SWs. The reference voltages are in a voltage range (a–3) of FIG. 13C, with the on-resistances of the Pch-SWs being high and the absolute values of the gate-to-source voltage Vgs being small. It is necessary to combine the Pch-SW with an Nch-SW to form a CMOS configuration.

In case the range of voltage selection by the decoder extends well towards the low potential side, the switches selecting the lowest potential side Vr1 to Vr(fzS+1), where k>f>1, may be composed solely by the Nch-SWs.

Referring to FIG. 14B, reference voltages Vr1 to Vr(hzS+1), offset towards the low potential side power supply VSS, are supplied to a negative electrode decoder correlated with the voltage range of the negative electrode of the LCD. The reference voltage Vr1 is to be an upper limit (towards the high potential side) of the range of voltage selection of the decoder, whilst the reference voltage Vr(hzS+1) is to be a lower limit (low potential side) of the range of voltage selection of the decoder. The reference voltages from Vr1 to Vr(hzS+1) are in the ordinal sequence, here representing monotonically decreasing voltage levels.

In this decoder, the switches that select reference voltages of the low potential side range of Vr(gzS+1) to Vr(hzS+1), where h>g, may be composed by solely the Nch-SWs of the standard size. The reference voltages are in a voltage range (b–1) of FIG. 13D, with on-resistances of the Nch-SWs being low and the gate-to-source voltage Vgs being larger.

The switches that select the reference voltages in a range from Vr(kzS+1) to Vr(gzS+1), where g>k, may be composed solely by the Nch-SWs. The reference voltages are in a voltage range (b–2) of FIG. 13D, with on-resistances of the Pch-SWs being rather high and the gate-to-source voltage Vgs being rather small. It is necessary to increase the gate width (W) of the Nch-SW.

The switches that select the reference voltages in a range from Vr1 to Vr(kzS+1), where k>1, are unable to be composed solely by the Nch-SWs. The reference voltages are in a voltage range (b–3) of FIG. 13D, with on-resistances of the Nch-SWs being high and the gate-to-source voltage Vgs being small. It is necessary to combine the Nch-SW with a Pch-SW to form a CMOS configuration.

In case the range of voltage selection by the decoder extends well towards the low potential side, the switches selecting the highest potential side Vr1 to Vr(fzS+1), where k>f>1, may be composed solely by the Pch-SWs.

Exemplary Embodiment 1

Figure 2:
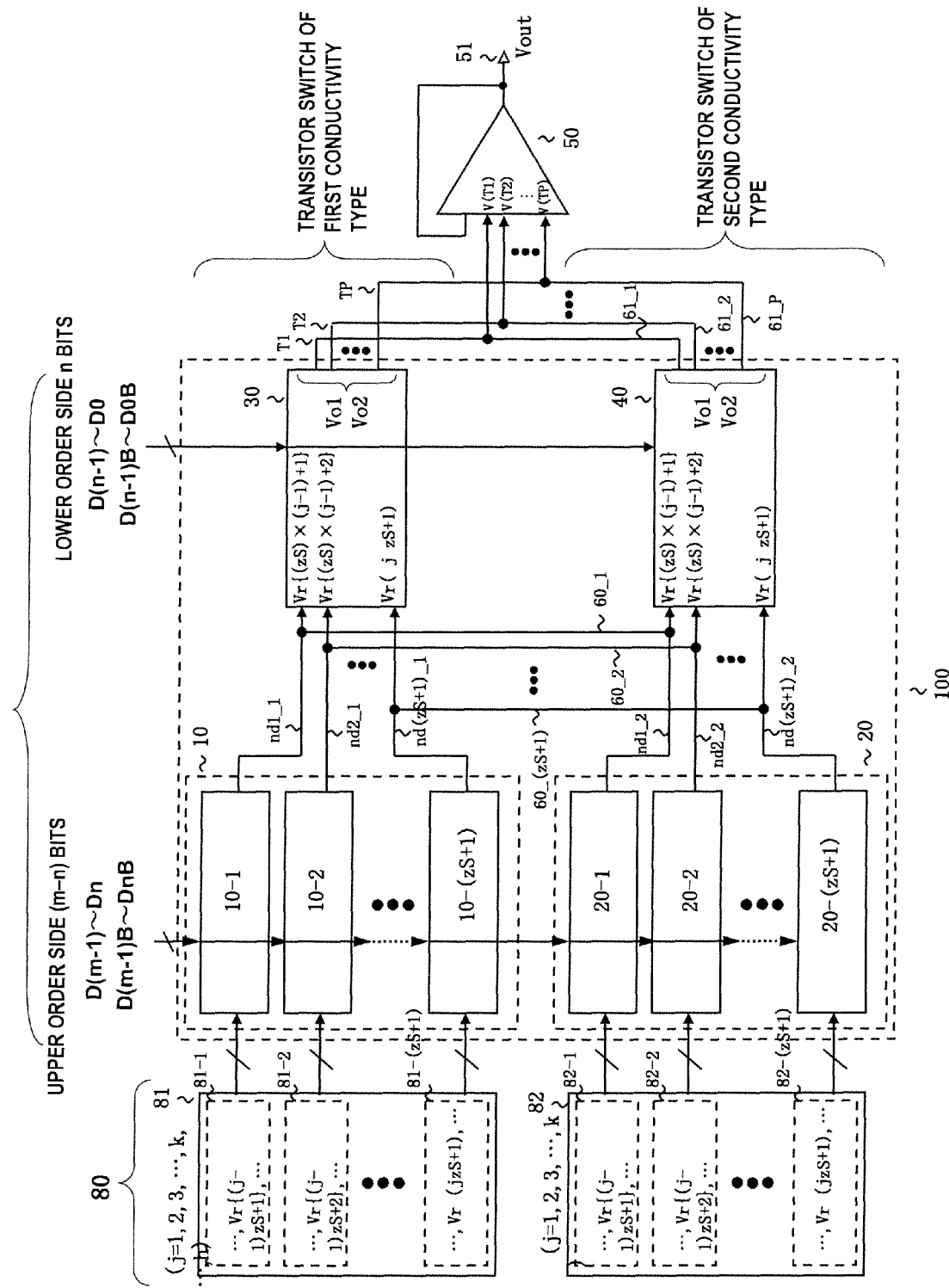
FIG. 2 is a schematic circuit diagram showing a configuration of a first exemplary embodiment of the present invention.

FIG. 2 shows a configuration of a first exemplary embodiment. In FIG. 2, there is shown a configuration of a digital-to-analog converter circuit comprised of a decoder for an OLED (FIG. 14A) or a decoder for one of the positive polarity and the negative polarity of the LCD (FIG. 14A or 14B). Referring to FIG. 2, the digital-to-analog converter of the present exemplary embodiment includes a reference voltage ensemble 80, a decoder 100 and an amplifier circuit 50. The reference voltage ensemble 80 includes first reference voltage set 81 and a second reference voltage set 82. The decoder 100 includes a first sub-decoder section 10, a second sub-decoder section 20, a third sub-decoder section 30 and a fourth sub-decoder section 40. In the decoder 100, the first sub-decoder section 10 and the third sub-decoder section 30 are composed of transistor switches of the first conductivity type (Pch or Nch), while the second sub-decoder section 20 and the fourth sub-decoder section 40 are composed of transistor switches of the second conductivity type (Nch or Pch).

In the present exemplary embodiment, the reference voltage ensemble 80 includes a plurality of reference voltages different from one another, the voltage levels thereof are in an ordinal sequence, and is divided into first and second reference voltage sets 81 and 82.

The first reference voltage set 81 has (hzS+1) respective different reference voltages Vr1, Vr2, Vr3, . . . , Vr(kzS+1), . . . , and Vr(hzS+1), where the symbol S stands for a positive integer of powers of 2, inclusive of 1, namely 1, 2, 4, . . . . The symbol z stands for a positive integer of powers of 2, inclusive of 1, added to with 1, namely 2, 3, 5, 9, . . . and the symbols h and k stand for a positive integer not less than two, with h>k.

The second reference voltage set 82 has (kzS+1) respective different reference voltages Vr1, Vr2, Vr3, . . . and Vr(kzS+1). It is noted that the (kzS+1) reference voltages Vr1, Vr2, Vr3, . . . , and Vr(kzS+1) are the same reference voltages as the reference voltages Vr1, Vr2, Vr3, . . . , and Vr(kzS+1) of the first reference voltage set 81. In the present exemplary embodiment, Vr1, Vr2, Vr3, . . . and Vr(hzS+1) are arrayed in the ordinal sequence by index numbers, though not in a limiting way, so that, as the index numbers are increased, the corresponding voltage values (levels) are monotonically changed, that is, monotonically increased or decreased.

In the present exemplary embodiment, in each of the first and second reference voltage set 81 and 82, the reference voltages are grouped in (zS+1) reference voltage groups.

A first reference voltage group 81-1 of the first reference voltage set 81 has a {(j−1) zS+1}th reference voltage, where the index numbers j may take the values of 1, 2, . . . and h. In case the index number takes all of the integer values of from 1 to h, the first reference voltage group 81-1 has the reference voltages Vr{1}, Vr{zS+1}, Vr{2zS+1}, . . . , and Vr{(h−1) zS+1}, with an interval of (zS) between neighboring reference voltages.

A second reference voltage group 81-2 of the first reference voltage set 81 has a {(j−1) zS+2}nd reference voltage. In case the index j takes all of the integer values of from 1 to h, the second reference voltage group 81-2 has the reference voltages Vr{2}, Vr{zS+2}, Vr{2zS+2}, . . . , and Vr{(h−1) zS+2}, with an interval of (zS) between neighboring reference voltages.

In similar manner, a (zS+1)th reference voltage group 81-(zS+1) of the first reference voltage set 81 has {(j−1) zS+(zS+1)}th (=(jzS+1)th) reference voltage Vr{(j−1) zS+(zS+1)} Vr(jzS+1). In case the index number j takes all of the integer values of from 1 to h, the (zS+1)th reference voltage group 81-(zS+1) has the reference voltages Vr{zS+1}, Vr{2zS+1}, Vr{3zS+1}, . . . and Vr{hzS+1}, with an interval of (zS) between neighboring reference voltages.

In case the index number takes all of the integer values of from 1 to h, the first reference voltage set 81 has respective different (hzS+1) reference voltages. In case part of the reference voltages is absent, part of the index numbers j may also be correspondingly absent.

A first reference voltage group 82-1 of the second reference voltage set 82 has {(j−1) zS+1}th reference voltage, where the index j may take the values of 1, 2, . . . , and k. In case the index j takes all of the integer values of from 1 to k, the first reference voltage group 82-1 has the reference voltages Vr{1}, Vr{zS+1}, Vr{2zS+1}, . . . , and Vr{(k−1) zS+1}, with an interval of (zS) between neighboring reference voltages.

A second reference voltage group 82-2 of the second reference voltage set 82 has {(j−1) zS+2}nd reference voltage Vr{(j−1) zS+2}. In case the index j takes all of the integer values of from 1 to k, the second reference voltage group 82-2 has the reference voltages Vr{2}, Vr{zS+2}, Vr{2zS+2}, . . . , and Vr{(k−1) zS+2}, with an interval of (zS) between neighboring reference voltages.

In similar manner, a (zS+1)th reference voltage group 82-(zS+1) of the second reference voltage set 82 has a (jzS+1)th reference voltage Vr{(jzS+1). In case the index j takes all of the integer values of from 1 to h, the (zS+1)th reference voltage group 82-(zS+1) has the reference voltages Vr{zS+1}, Vr{2zS+1}, Vr{3zS+1}, . . . , and Vr{kzS+1}, with an interval of (zS) between neighboring reference voltages.

In the present exemplary embodiment, the decoder 100 inputs the m-bit digital signal (D(m−1) to D0 and their complementary signals D(m−1)B to D0B). The first and second sub-decoder sections 10 and 20 input upper order (m−n) bits (D(m−1) to Dn and D(m−1)B to DnB) of the m-bit digital signal. The third and fourth sub-decoder sections 30 and 40 input lower order n bits (D(n−1) to D0 and D(n−1)B to D0B).

The first sub-decoder section 10 includes first to (zS+1)th sub-decoders 10-1 to 10-(zS+1), each of which includes a plurality of transistor switches of the first conductivity type. The sub-decoders 10-1 to 10-(zS+1) are supplied with reference voltages of the reference voltage groups 81-1 to 81-(zS+1) of the first reference voltage set 81, respectively, on the group basis. The sub-decoders 10-1 to 10-(zS+1) receive, in common, upper order (m−n) bits (D(m−1) to Dn and D(m−1)B to DnB) of the m-bit digital signal. Depending upon the values of D(m−1) to Dn and D(m−1)B to DnB, each of the sub-decoders 10-1 to 10-(zS+1) selects a reference voltage from a relevant one of the reference voltage groups to transfer the so selected reference voltages to relevant ones of the nodes nd1_1 to nd (zS+1)_1. The (zS+1) reference voltages, transferred at this time, from the sub-decoders 10-1 to 10-(zS+1) to the nodes nd1_1 to nd(zS+1)_1, are reference voltages having the contiguous ordinal sequence in the first reference voltage set 81. For example, if the reference voltage Vr{(j−1)zS+1} has been selected in the sub-decoder 10-1, the reference voltage Vr{(j−1)zS+2} is selected in the sub-decoder 10-2 and so forth until the reference voltage Vr(jzS+1) is selected in the sub-decoder 10-(zS+1). It is noted that the symbol Q of FIG. 1 corresponds to (zS+1) of FIG. 2.

The second sub-decoder section 20 includes first to (zS+1)th sub-decoders 20-1 to 20-(zS+1), each of which includes a plurality of transistor switches of the second conductivity type. The sub-decoders 20-1 to 20-(zS+1) are supplied with reference voltages of the reference voltage groups 82-1 to 82-(zS+1) of the second reference voltage set 82, respectively, on the group basis. The sub-decoders 20-1 to 20-(zS+1) receive, in common, upper order (m−n) bits (D(m−1) to Dn and D(m−1)B to DnB) of the m-bit digital signal. Depending upon the values of D(m−1) to Dn and D(m−1)B to DnB, each of the sub-decoders 20-1 to 20-(zS+1) selects a reference voltage from a relevant one of the reference voltage groups to transfer the so selected reference voltage to a relevant one of the nodes nd1_2 to nd(zS+1)_2. The (zS+1) reference voltages, transferred at this time from the sub-decoders 20-1 to 20-(zS+1) to the nodes nd1_2 to nd(zS+1)_2, are reference voltages bearing the contiguous ordinal sequence numbers in the second reference voltage set 82.

It is noted that the nodes nd1_1 to nd(zS+1)_1 that receive outputs of the sub-decoders 10-1 to 10-(zS+1) of the first sub-decoder section 10 and the nodes nd1_2 to nd(zS+1)_2 that receive outputs of the sub-decoders 20-1 to 20-(zS+1) of the second sub-decoder section 20 are connected in common. However, suffixes _1, _2 are appended to them for distinction only for the sake of convenience for explanation.

It is supposed that the index numbers j, specified by the upper side (m−n) bits, take values of from 1 to k. In this case, the reference voltages Vr((j−1)zS+1) to Vr(jzS+1), totaling at (zS+1) reference voltages, selected by the sub-decoders 10-1 to 10-(zS+1) of the first sub-decoder section 10, and the reference voltages Vr((j−1)zS+1) to Vr(jzS+1), totaling at (zS+1) reference voltages, selected by the sub-decoders 20-1 to 20-(zS+1) of the second sub-decoder section 20, are the same reference voltages. That is, the reference voltages, whose index number assumes integer values of 1 to k, are selected common by the transistor switches of the different conductivity types in the first and second sub-decoders 10 and 20. Hence, the resulting configuration is an equivalent CMOS switch configuration.

In case the index number j takes the values of (k+1) to h, the total of (zS+1) reference voltages of from Vr((j−1)zS+1) to Vr(jzS+1) is selected by the sub-decoders 10-1 to 10-(zS+1) of the first sub-decoder section 10. However, in the sub-decoders 20-1 to 20-(zS+1) of the second sub-decoder section 20, the reference voltages of the second reference voltage set 82 remain unselected. The sub-decoders 20-1 to 20-(zS+1) are turned off and have the output nodes set in a high-impedance state.

The third sub-decoder section 30 includes a plurality of transistor switches of the first conductivity type. Depending upon the values of the lower side n bits (D(n−1) to D0 and D(n−1)B to D0B) of the m-bit digital signal, the third sub-decoder section 30 selects first and second voltages Vo1 and Vo2, inclusive of duplications, from (zS+1) reference voltages transferred to the nodes nd1_1 to nd(zS+1)_1 (and the nodes nd1_2 to nd(zS+1)_2). The third sub-decoder section 30 then transfers the so selected voltages Vo1 and Vo2 to the first to the Pth nodes (T1 to TP). Selecting the first and second voltages Vo1 and Vo2, inclusive of duplications, means that the same voltage may from time to time be selected as the first and second voltages Vo1 and Vo2. There may also be cases where the same voltage is transferred to certain ones or to the total of the nodes T1 to TP.

The fourth sub-decoder section 40 includes a plurality of transistor switches of the second conductivity type. Depending upon the values of the lower side n bits (D(n−1) to D0 and D(n−1)B to D0B) of the m-bit digital signal, the fourth sub-decoder section 40 selects, like the third sub-decoder section 30, first and second voltages Vo1 and Vo2, inclusive of duplications, from (zS+1) reference voltages transferred to the nodes nd1_1 to nd(zS+1)_1 (and the nodes nd1_2 to nd(zS+1)_2). The fourth sub-decoder section 40 then transfers the so selected voltages Vo1 and Vo2 to the first to the Pth nodes T1 to TP.

The switches of the third sub-decoder section 30 and associated switches of fourth sub-decoder section 40 form respectively equivalent CMOS switch configurations. The reason is that the input nodes (nodes nd1_1 to nd(zS+1)_1 and the nodes nd1_2 to nd(zS+1)_2) are connected in common by Pch/Nch area connecting wirings 60_1 to 60_(zS+1), that the output nodes are connected via Pch/Nch area connecting wirings 61_1 to 61_P to the nodes T1 to TP and that the first and second voltages Vo1 and Vo2 are connected in common by transistor switches of respective different conductivity types. As a result, on-resistances of the transistor switches, which are turned on or off under control by the lower side n bits (D(n−1) to D0 and D(n−1)B to D0B) of the m-bit digital signal, for the total of the reference voltages of the reference voltage ensemble 80, may be decreased. In this manner, the gate width of the transistor switches of the single conductivity type that select reference voltages, whose index numbers j assume the values of (k+1) to h in the first sub-decoder section 10, may be suppressed from increasing, that is, the transistor gate widths may be of the standard size, thus saving the area of the decoder 100.

The amplifier circuit 50 includes, as inputs, first to Pth nodes T1 to TP that are shared as output nodes by the third sub-decoder section 30 and the fourth sub-decoder section 40. The amplifier circuit 50 outputs, at an output terminal 51, a voltage Vout obtained by an operation, such as weighted averaging, on the voltages V(T1) to V(TP) at the nodes T1 to TP. The output voltage Vout of the amplifier circuit 50 is fed back to its (P+1)th input.

Figure 3A:
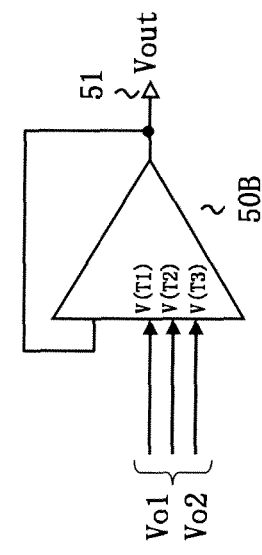
FIG. 3A is a diagram showing a configuration of an amplifier circuit of the first exemplary embodiment of the present invention.
Figure 3B:
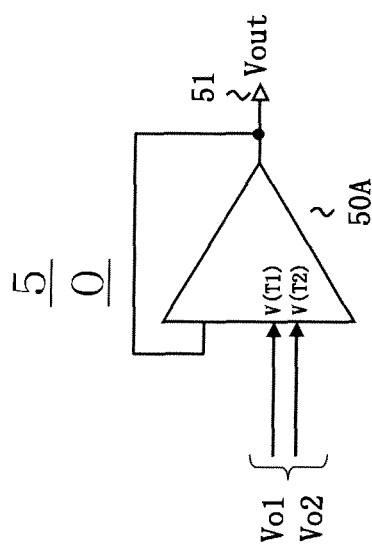
FIG. 3B is a diagram showing a configuration of another amplifier circuit of the first exemplary embodiment of the present invention.

Two specified examples of the amplifier circuit 50 are shown in FIGS. 3A and 3B. Referring to FIG. 3A, showing an amplifier circuit 50A, P=2. The amplifier circuit is an interpolation amplifier that receives voltages Vo1 and Vo2, transferred to its nodes T1 and T2, as voltages V(T1) and V(T2), respectively, and that interpolates the voltages V(T1) and V(T2) at a ratio of 1:1 (Vout={V(T1)+V(T2)}/2). FIG. 3A shows an amplifier circuit that outputs a voltage obtained on averaging voltages Vo(1) and Vo(2). If the voltages Vo(1) and Vo(2) are the same voltage in duplication, the voltage Vo1 (=Vo2) is output, whereas, if the voltages Vo(1) and Vo(2) differ from each other, an intermediate voltage of the voltages (Vo1, Vo2) is output.

Referring to FIG. 3B, showing an amplifier circuit 50B, P=3. The amplifier circuit 50 is an interpolation amplifier that receives voltages Vo1 and Vo2, inclusive of duplication, transferred to its nodes T1, T2 and T3, as voltages V(T1), V(T2) and V(T3), respectively, and that takes a weighted average of the voltages V(T1), V(T2) and V(T3) at a ratio of 1:1:2 (Vout=(V(T1)+V(T2)+2×V(T3))/4). That is, if, in the configuration of FIG. 3B, the voltages (Vo1, Vo2) are the same duplicate voltages, the voltage Vo1 (=Vo2) is output, whereas, if the voltages (Vo1, Vo2) are different from each other, one out of voltages obtained by interpolating the voltages (Vo1, Vo2) at the ratios of 1:3, 1:1 and 3:1 is output. The amplifier circuit may be such a circuit in which P=4, the voltages (Vo1, Vo2), transferred to its nodes T1 to T4, are received as voltages V(T1) to V(T4) and in which the voltages V(T1) to V(T4) are averaged out (Vout={V(T1)+V(T2)+V(T3)+V(T4)}/4). As in the circuit of FIG. 3B, in case the voltages (Vo1, Vo2) are the same duplicate voltages, the amplifier circuit outputs a voltage Vo1 (=Vo2). In case the voltages (Vo1, Vo2) differ from each other, the amplifier circuit outputs one out of voltages obtained on interpolation of the voltages (Vo1, Vo2) at the ratios of 1:3, 1:1 and 3:1.

<Reference Voltage Ensemble 80>

The following describes the grouping of the reference voltage ensemble 80 of FIG. 2, and the reference voltages, selected by the sub-decoders 10-1 to 10-(zS+1) of the first sub-decoder section 10 and by the sub-decoders 20-1 to 20-(zS+1) of the second sub-decoder section 20.

FIG. 4 shows the grouping of the reference voltage ensemble 80 of FIG. 2 in detail. The relationship of correspondence of the reference voltages and the voltages selected by the decoder 100 corresponds to FIG. 14A or to FIG. 14B. Referring to FIG. 4, the grouping of the plurality of ((hzS+1)-number at the maximum) reference voltages of the reference voltage ensemble 80 of FIG. 2, may be represented by a two-dimensional array of (zS+1) rows by h columns in the same way as in FIG. 18. It is noted that the two-dimensional array of FIG. 4 is not present in reality, for example, such as in the decoder 100, but is a kind of representation format suited for explaining the grouping/ordinal sequence of the reference voltages. The first to (zS+1)th reference voltage groups are allocated to the rows, and the ordinal sequence numbers in the reference voltage groups of the reference voltages belonging to the particular reference voltage groups are allocated to columns. It is noted that each of the first reference voltage set 81 and the second reference voltage set 82 is grouped into (zS+1) sub-groups, and is shown in common in FIG. 4. That is, in FIG. 4, the reference voltage set 81 refers to the grouping of reference voltages Vr1 to Vr(hzS+1), whereas the reference voltage set 82 refers to the grouping of reference voltages Vr1 to Vr(kzS+1).

The element of the i-th row and j-th column, allocated to the two-dimensional array, where i denotes an integer not less than 1 and not greater than (zS+1), j denotes an integer not less than 1 and not greater than h or k, and h and k are integers not less than 2, correspond to the reference voltages Vr((j−1)zS+i) of each of the reference voltage sets 81 and 82. That is, the reference voltages of the reference voltage set 81 correspond to array elements of the first to the hth columns of the two-dimensional array (j=1 to h), whereas the reference voltages of the reference voltage set 82 correspond to array elements of the first to the kth columns of the two-dimensional array (j=1 to k).

More specifically, the first reference voltage group 81-1 of the reference voltage set 81 includes reference voltages (Vr1, Vr(zS+1), Vr(2zS+1), . . . , and Vr{(h−1)(zS)+1}), allocated to the first row of the two-dimensional array, where the reference voltages are arrayed at intervals of (zS) reference voltages.

The second reference voltage group 81-2 of the reference voltage set 81 includes reference voltages (Vr2, Vr(zS+2), Vr(2zS+2), . . . , and Vr{(h−1)(zS)+2}), allocated to the second row of the two-dimensional array, where the reference voltages are arrayed at intervals of (zS) reference voltages.

The i-th reference voltage group 81-i of the reference voltage set 81 includes reference voltages (Vr(i), Vr(zS+i), Vr(2zS+i), . . . , and Vr{(h−1)(zS)+i}), allocated to the i'-th row of the two-dimensional array (1≦i≦(zS+1), where the reference voltages are arrayed at intervals of (zS) reference voltages.

The (zS+1)th reference voltage group 81-(zS+1) of the reference voltage set 81 includes reference voltages (Vr(zS+1), Vr(2zS+1), Vr(3zS+1), . . . , and Vr(hzS+1)), allocated to the (zS+1)th row of the two-dimensional array, where the reference voltages are arrayed at intervals of (zS) voltages.

It is noted that the first to the (h−1)th reference voltages in the (zS+1)th reference voltage group 81-(zS+1) of the reference voltage set 81, that is, the reference voltages allocated to the first column to the (h−1)th column in the (zS+1)th row of the two-dimensional array, are the same as the second to the hth reference voltages in the first reference voltage group 81-1, that is, the reference voltages allocated to the second column to the hth column in the first row of the two-dimensional array.

The first reference voltage group 82-1 of the second reference voltage set 82 includes reference voltages (Vr1, Vr(zS+1), Vr(2zS+1), . . . , and Vr((k−1)(zS)+1)), allocated to the first row of the two-dimensional array, where the reference voltages are arrayed at intervals of (zS) reference voltages.

The second reference voltage group 82-2 of the second reference voltage set 82 includes reference voltages (Vr2, Vr(zS+2), Vr(2zS+2), . . . , and Vr((k−1)(zS)+2)), allocated to the second row of the two-dimensional array, where the reference voltages are arrayed at intervals of (zS) reference voltages.

The i-th preference voltage group 82-i of the reference voltage set 82, where 1≦i≦(zS+1), includes reference voltages (Vr(i), Vr(zS+i), Vr(2zS+i), . . . , and Vr((k−1)(zS)+i)), allocated to the i-th row of the two-dimensional array, where the reference voltages are arrayed at intervals of (zS) reference voltages.

The (zS+1)th reference voltage group 82-(zS+1) of the reference voltage set 82 includes reference voltages (Vr(zS+1), Vr(2zS+1), Vr(3zS+1), . . . , and Vr(kzS+1)), allocated to the (zS+1)th row of the two-dimensional array, where the reference voltages are arrayed at intervals of (zS) reference voltages.

It is noted that the first to the (k−1)th reference voltages in the (zS+1)th reference voltage group 82-(zS+1) of the reference voltage set 82 are equal to the second to the kth reference voltages in the first reference voltage group 82-1.

The columns of the two-dimensional array of FIG. 4 correspond to the upper side (m−n) bits (D(m−1) to Dn and D(m−1)B to DnB) of the m-bit digital signal of FIG. 2. Consequently, the reference voltages selected by the first to the (zS+1)th sub-decoders 10-1 to 10-(zS+1) of the first sub-decoder section 10 of FIG. 2 are the reference voltages allocated to one of the first to the hth columns of FIG. 4 corresponding to the upper side (m−n) bits. On the other hand, the reference voltages selected by the first to the (zS+1)th sub-decoders 20-1 to 20-(zS+1) of the second sub-decoder section 20 of FIG. 2 are the reference voltages allocated to one of the first to the kth columns of FIG. 4 corresponding to the upper side (m−n) bits.

If, in the reference voltages of the reference voltage set 81, there are those reference voltages (Vr1 to Vr(fzS+1)) that are unable to be selected by the first conductivity type transistor switches of the first sub-decoder section 10, as shown in FIGS. 14A and 14B, those reference voltages may be dropped. In such case, the reference voltage set 81 includes the reference voltages (Vr(fzS+1) to Vr(hzS+1) corresponding to the array elements of the (f+1)th to hth columns of the two-dimensional array of FIG. 4.

<First Sub-Decoder Section>

Figure 5:
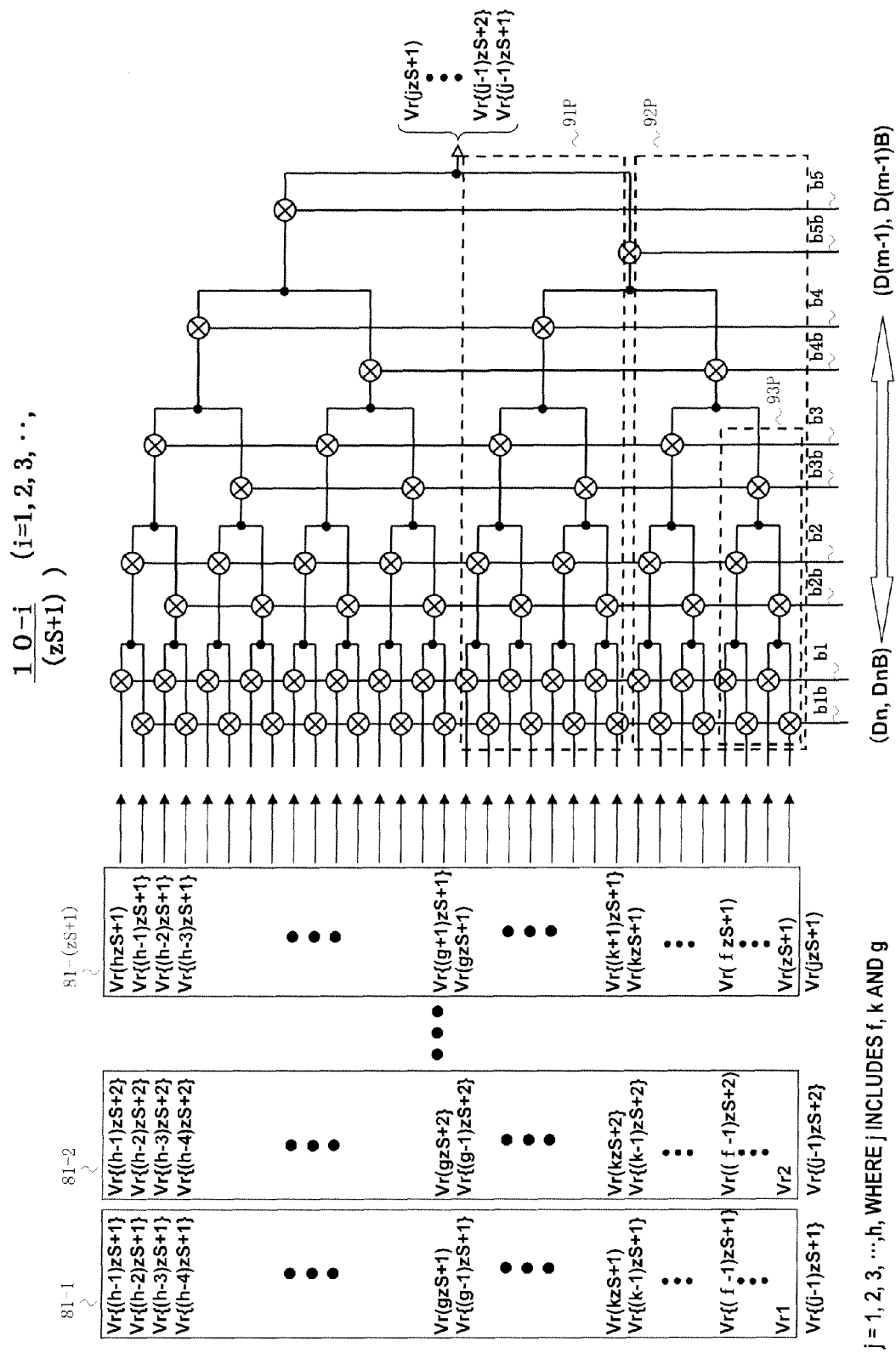
FIG. 5 is a diagram showing a configuration of a first sub-decoder section of the first exemplary embodiment of the present invention.

The following describes the configuration of the first sub-decoder section 10 of FIG. 2. FIG. 5 shows an example configuration of the first to (zS+1)th sub-decoder 10-i, where i is 1 to (zS+1), constituting the first sub-decoder section 10 of FIG. 2. The reference voltages Vr1 to Vr(hzS+1) of the first reference voltage set 81, supplied to the first sub-decoder section 10, are grouped into the first to (zS+1)th reference voltage groups 81-1 to 81-(zS+1), as shown in FIGS. 2 and 4. For each of the first to (zS+1)th reference voltage groups 81-1 to 81-(zS+1), h reference voltages are supplied to the sub-decoders 10-1 to 10-(zS+1). In FIG. 5, the leftmost reference voltage group 81-1 is supplied to the sub-decoder 10-1, and the reference voltage group 81-2 is supplied to the sub-decoder 10-2. The reference voltage group 81-(zS+1) is supplied to the sub-decoder 10-(zS+1). The sub-decoders 10-1 to 10-(zS+1) are of the same circuit configuration, and differ from one another only with respect to the reference voltage sets supplied. Therefore, only a single sub-decoder 10-i (i=1 to (zS+1)) is shown in FIG. 5.

The sub-decoder 10-i (i=1 to (zS+1)) selects, from the reference voltage group 81-i, depending upon the values of the upper side (m−n) bit signals (D(m−1) to Dn and D(m−1)B to DnB) of the m-bit digital signal, the reference voltages Vr{(j−1)zS+i}, bearing the j-th ordinal sequence number in the respective reference voltage groups, as shown in FIG. 5. This reference voltage Vr{(j−1)zS+i} corresponds to the elements of the j-th columns of the two-dimensional array of FIG. 4. It is noted that j is any value of from 1 to h. Consequently, the sub-decoders 10-1 to 10-(zS+1) select, from the reference voltage groups 81-1 to 81-(zS+1), the reference voltages $Vr\{(j-1)zS+1\}$, $Vr\{(j-1)zS+2\}$, ... and $Vr(jzS-1)$ having the j-th ordinal sequence number in each reference voltage group.

The sub-decoder 10-$i$ of FIG. 5 ($i=1$ to $(zS+1)$) is of a tournament configuration sub-decoder that receives h reference voltages of an i-th reference voltage group and that selects a single reference voltage based on the upper side $(m-n)$ bit signal ($D(m-1)$ to Dn and $D(m-1)B$ to DnB). Initially, one of two reference voltages is selected by the lowest side bit signals (Dn, DnB) of the bit signal ($D(m-1)$ to Dn and $D(m-1)B$ to DnB). Then, one of two surviving reference voltages selected by the bit signals (Dn, DnB) is selected by the lowest but one bit signal $D(n+1)/D(n+1)B$ and so forth such that one of two surviving reference voltages is selected based on the bit signals progressing from the lower side towards the upper side.

The respective switches of the sub-decoders 10-$i$ ($i=1$ to $(zS+1)$) are composed by the transistor switches of the first conductivity type (Nch or Pch). In case the respective switches are composed by Nch transistors, Dn to $D(m-1)$ are supplied to bit signal lines b1 to b5, whereas DnB to $D(m-1)B$ are supplied to bit signal lines b1$b$ to b5$b$. In case the respective switches are composed by Pch transistors, DnB to $D(m-1)B$ are supplied to bit signal lines b1 to b5, whereas Dn to $D(m-1)$ are supplied to bit signal lines b1$b$ to b5$b$. In FIG. 5, a 5-bit tournament configuration sub-decoder is shown only for convenience in drafting. Also, in FIG. 5, a circle mark around a symbol x denotes a transistor switch of a first conductivity type (Pch or Nch).

The sub-decoders 10-$i$ ($i=1$ to $(zS+1)$) of FIG. 5 satisfies the relationship between the decoder selection voltage range and the reference voltages of FIG. 14A or 14B.

In the sub-decoders 10-$i$ ($i=1$ to $(zS+1)$) ($i=1$ to $(zS+1)$), shown in FIG. 5, the transistor switches, selecting the reference voltages $Vr(gzS+i)$ to $Vr((h-1)(zS)+i)$, may be composed solely by the transistor switches of the standard size.

Also, in the sub-decoders 10-$i$ ($i=1$ to $(zS+1)$), the transistor switches that select the reference voltages $Vr(kzS+i)$ to $Vr((g-1)(zS)+i)$ (switch set 91P of FIG. 5) may be composed solely by the transistor switches of the first conductivity type. It is however necessary to increase a gate width (W) of the transistor switch.

Also, in the sub-decoders 10-$i$ ($i=1$ to $(zS+1)$) ($i=1$ to $(zS+1)$) of FIG. 5, the transistor switches that select the reference voltages $Vr(i)$ to $Vr((k-1)(zS)+i)$ (switch set 92P of FIG. 5) are transistor switches to be combined with the transistor switches of the second conductivity type (second sub-decoder section 20) to form a CMOS configuration.

It is noted that, if the range of voltage selection by the decoder is broad, such that, in the sub-decoders 10-$i$ ($i=1$ to $(zS+1)$), there are reference voltages ($Vri$ to $Vr((f-1)(zS)+i)$) that are unable to be selected by the transistor switches of the first conductivity type, where $i=1$ to $(zS+1)$), the transistor switches (switch set 93P) selecting the reference voltages $Vri$ to $Vr((f-1)(zS)+i)$ may be omitted.

In the present exemplary embodiment, the third sub-decoder section 30 and the fourth sub-decoder section 40 form an equivalent CMOS circuit to decrease on-resistance of each switch, as mentioned above. Consequently, the gate size (gate width W) of the transistor switches (switch set 91P of FIG. 5), selecting the reference voltages $Vr(kzS+i)$ to $Vr((g-1)(zS)+i)$, where $i$ is 1 to $(zS+1)$, may be suppressed from increasing. Since the transistor switches, the gate size of which may be decreased, are arranged in the sub-decoders 10-$i$ of FIG. 5, where $i$ is 1 to $(zS+1)$, the decoder may be reduced in area by suppressing the gate width from increasing.

<Second Sub-Decoder Section>

Figure 6:
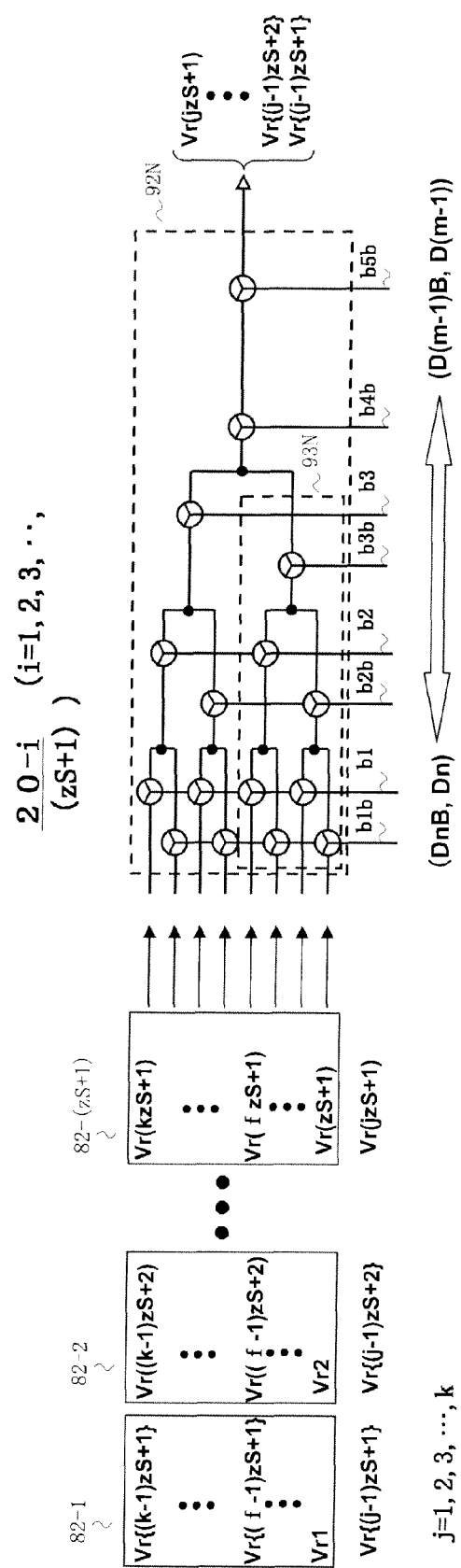
FIG. 6 is a diagram showing a configuration of a second sub-decoder section of the first exemplary embodiment of the present invention.

The following describes the configuration of the second sub-decoder section 20 of FIG. 2. FIG. 6 shows the configuration of a sub-decoder 20-$i$ of the second sub-decoder section 20 of FIG. 2 ($i=1$ to $(zS+1)$). The reference voltages $Vr1$ to $Vr(kzS+1)$ of the reference voltage set 82, supplied to the second sub-decoder section 20, are grouped into first to $(zS+1)$th reference voltage groups 82-1 to 82-$(zS+1)$, as explained with reference to FIGS. 2 and 4. For each of the first to $(zS+1)$th reference voltage groups 82-1 to 82-$(zS+1)$, k reference voltages are supplied to the sub-decoders 20-1 to 20-$(zS+1)$. The sub-decoders 20-1 to 20-$(zS+1)$ of the second sub-decoder section differ from one another only as to the different sets of the reference voltages supplied, and are the same as to the circuit configuration. FIG. 6 shows a single i-th sub-decoder 20-$i$ to represent the sub-decoders 20-1 to 20-$(zS+1)$. Meanwhile, if the reference voltages $Vr1$ to $Vr(hzS+1)$ of the first reference voltage set 81 are divided into a first part composed of $Vr1$ to $Vr(kzS+1)$ and a second part composed of $Vr(kzS+2)$ to $Vr(hzS+1)$, where $1<k<h$, the first part is equal to the reference voltages $Vr1$ to $Vr(kzS+1)$ of the second reference voltage set 82.

Referring to FIG. 6, the sub-decoders 20-1 to 20-$(zS+1)$ select, from the relevant reference voltage group 82-$i$ ($i=1$ to $(zS+1)$), the reference voltages $Vr\{(j-1)(zS)+i\}$, having the j-th ordinal sequence number in the reference voltage groups, depending on the values of the upper order $(m-n)$ bit signals ($D(m-1)$ to Dn and $D(m-1)B$ to DnB) of the m-bit digital signal. The reference voltages $Vr\{(j-1)zS+i\}$ correspond to the elements of the j-th column of the two-dimensional array of FIG. 4, and $j=1$ to $k$. The sub-decoders 20-1, 20-2, ... and 20-$(zS+1)$ select $Vr\{(j-1)(zS)+1\}$, $Vr\{(j-1)(zS)+2\}$, ... and $Vr\{jzS+1\}$, respectively.

The sub-decoder 20-$i$ of FIG. 6 ($i=1$ to $(zS+1)$) is of a tournament configuration sub-decoder that receives k reference voltages of an i-th reference voltage group and that selects a single reference voltage based on the upper side $(m-n)$ bit signal ($D(m-1)$ to Dn and $D(m-1)B$ to DnB). It is noted that the number of the reference voltages (k-number) supplied to the sub-decoder 20-$i$ of FIG. 6 is less than the number of the reference voltages (h-number) supplied to the sub-decoder 10-$i$ of FIG. 5. Hence, the upper side bit signals are selected by only one out of the positive signals, such as $D(m-1)$, and its complementary signal, such as $D(m-1)B$.

The respective switches of the sub-decoders 20-$i$ of FIG. 6, where $i$ is 1 to $(zS+1)$, includes transistors of the second conductivity type opposite to that of the switches of the first sub-decoder section 10, that is, Pch or Nch. In case the switches of the sub-decoder 20-$i$, where $i$ is 1 to $(zS+1)$, are formed by Nch transistors, corresponding lower side bit signals of Dn to $D(m-1)$ are supplied to the bit signal lines b1 to b3, whereas DnB to $D(m-1)B$ are supplied to the bit signal lines b1$b$ to b5$b$. In case the switches of the sub-decoder 20-$i$, where is 1 to $(zS+1)$, are formed by Pch transistors, corresponding lower side bit signals of DnB to $D(m-1)B$ are supplied to the bit signal lines b1 to b3, whereas Dn to $D(m-1)$ are supplied to the bit signal lines b1$b$ to b5$b$. In FIG. 6, there is shown a configuration of a tournament type sub-decoder, selected by 5 bits, is shown only for convenience in drawing. Also, in FIG. 6, a circle mark around a symbol Y denotes a transistor switch of a second conductivity type (Nch or Pch) opposite to the first conductivity type.

The sub-decoder 20-$i$, where $i$ is 1 to $(zS+1)$, that is, a switch set 92N of FIG. 6, includes transistor switches (switch set 92N of FIG. 6) combined with the transistor switches (switch set 92P of FIG. 5) that select reference voltages $Vr(i)$ to Vr((k−1)(zS)+i) of the sub-decoder 10-*i* (i is 1 to (zS+1)) of FIG. 5 to form a CMOS circuit.

If, in the sub-decoders 10-*i* (i is 1 to (zS+1)) of FIG. 5, there lack transistor switches that select the reference voltages (Vr(i) to Vr((f−1)(zS)+1), that is, the switch set 93P of FIG. 5, the transistor switches that select the reference voltages (Vr(i) to Vr((f−1)(zS)+1) of the sub-decoders 10-*i* (i is 1 to (zS+1)) of FIG. 6, that is, the switch set 93N of FIG. 6, are composed solely as transistor switches of the second conductivity type.

<Third and Fourth Sub-Decoders Sections>

The following describes an example configuration of the third and fourth sub-decoder sections 30 and 40 of FIG. 2. Since the configuration of the sub-decoder sections 30 and 40 differ with different values of parameters S, z and P, the following explanation is made only for a typical configuration example.

Figure 7:
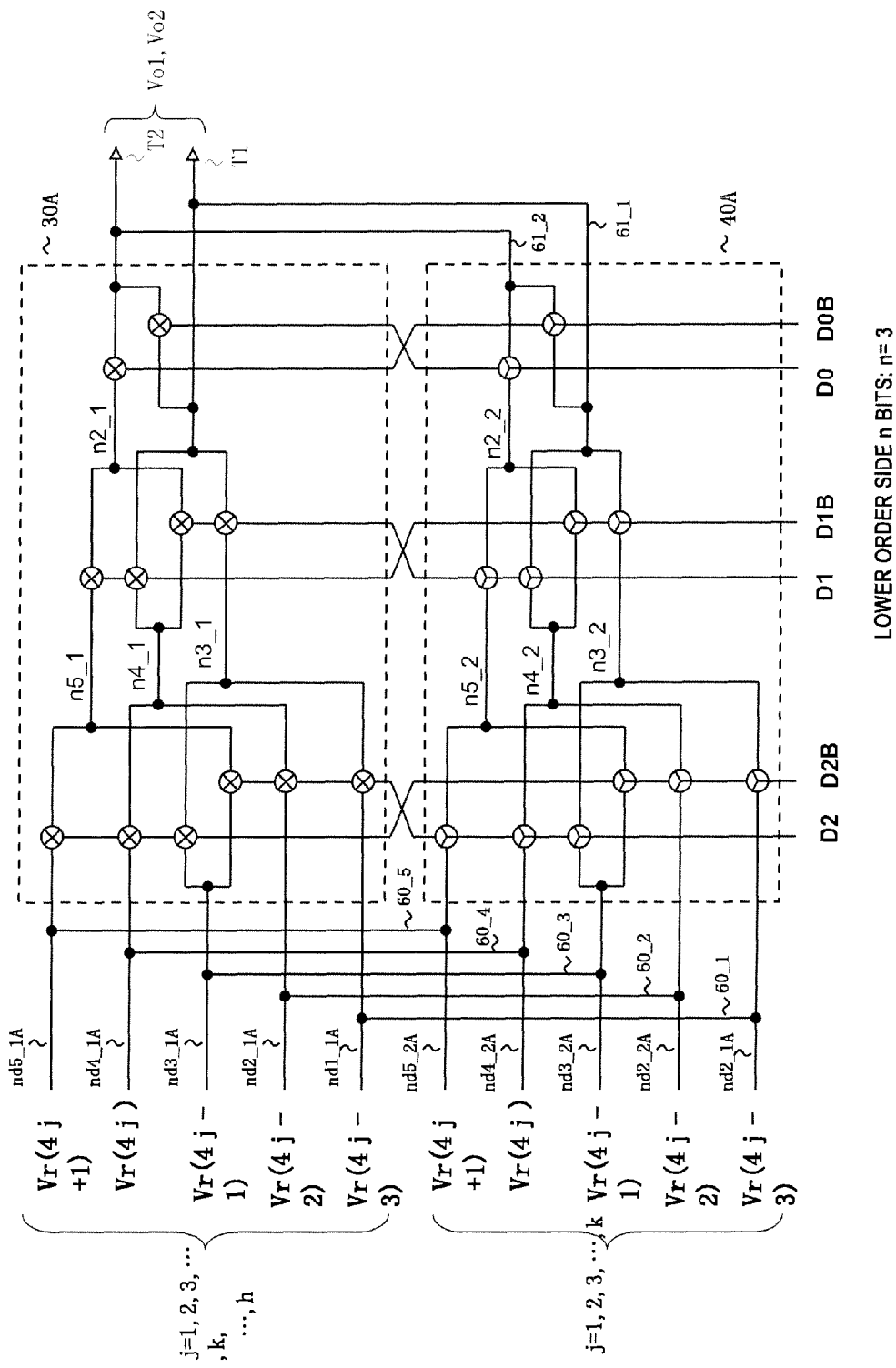
FIG. 7 is a diagram showing a configuration of third and fourth sub-decoder sections of the first exemplary embodiment of the present invention.

FIG. 7 shows a configuration example of third and fourth sub-decoder sections 30A and 40A for S=2, z=2 (zS+1=5), P=2 and n=3. Referring to FIG. 7, (zS+1) (=5) reference voltages (Vr(4j−3), Vr(4j−2), Vr(4j−1), Vr(4j), and Vr(4j+1), selected by the first and second sub-decoders 10 and 20, are supplied to the third and fourth sub-decoder sections 30A and 40A. The third and fourth sub-decoder sections 30A and 40A select the first and second voltages (Vo1, Vo2), based on the lower side n-bit signals (D2 to D0, D2B to D0B) of the m-bit digital signal, where n=3, to transfer the so selected signals to the nodes T1 and T2.

The third and fourth sub-decoder sections 30A and 40A include a plurality of transistor switches of the respective different conductivity types. In the third sub-decoder section 30A, a circle mark enclosing a symbol x denotes a transistor switch of the first conductivity type (Pch or Nch). In the fourth sub-decoder section 40A, a circle mark enclosing a symbol Y denotes the transistor switch of the opposite conductivity type, such as Nch or Pch.

Figure 20:
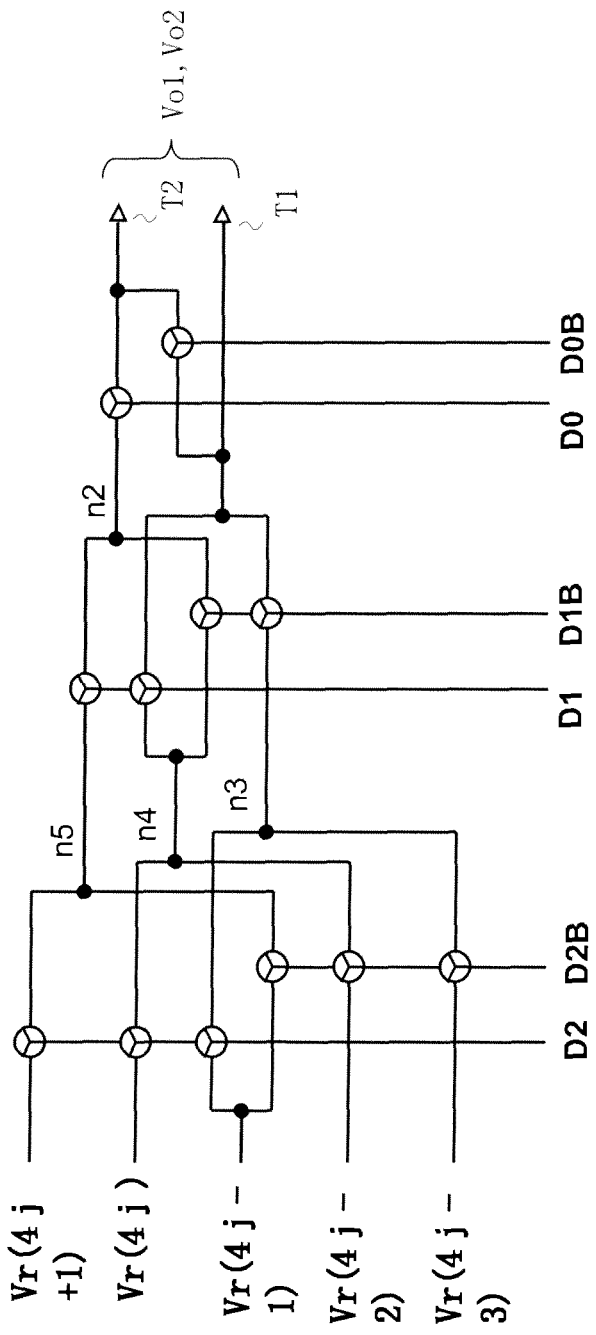
FIG. 20 is a diagram showing an example configuration of a sub-decoder 813 of FIG. 17.

Referring to FIG. 7, switch positions are the same in both the third and fourth sub-decoder sections 30A and 40A. However, the gates of the switches of the third sub-decoder section 30A and those of the switches of the fourth sub-decoder section 40 are supplied with bit signals complementary to each other. In case the switches of the fourth sub-decoder section 40 of FIG. 7 are composed by Nch transistor switches, the configuration is similar to that of FIG. 20.

Referring to FIG. 7, input nodes nd1_1A, nd2_1A, nd3_1A, nd4_1A and nd5_1A of the third sub-decoder section 30A and the input nodes nd1_2A, nd2_2A, nd3_2A, nd4_2A and nd5_2A of the fourth sub-decoder section 40A are connected together in common through wirings 60_1, 60_2, 60_3, 60_4 and 60_5 connecting the Pch/Nch transistor regions. The first and second output nodes (T1, T2) of the third sub-decoder section 30A are also connected in common by wirings 61_1 and 61_2 connecting the Pch/Nch transistor regions.

Referring to FIG. 7, the input nodes nd1_1A, nd2_1A, nd3_1A, nd4_1A and nd5_1A of the third sub-decoder section 30A are supplied with the reference voltages (Vr(4j−3), Vr(4j−2), Vr(4j−1), Vr(4j) and Vr(4j+1), selected by the first sub-decoder section 10, where j may be any value from 1 to h. The input nodes nd1_2A, nd2_2A, nd3_2A, nd4_2A and nd5_2A of the fourth sub-decoder section 40A are supplied with the reference voltages (Vr(4j−3), Vr(4j−2), Vr(4j−1), Vr(4j) and Vr(4j+1), selected by the second sub-decoder section 20, where j may be any values of from 1 to k (1≤k≤h).

In case the index number j is such that j=1 to k, the reference voltages (Vr(4j−3), Vr(4j−2), Vr(4j−1), Vr(4j) and Vr(4j+1) from the first and second sub-decoders 10 and 20, are transferred common to the input nodes of the third and fourth sub-decoder sections 30A and 40A.

When the index number j is such that j=(k+1) to h, the second sub-decoder section 20 is not selected. The reference voltages (Vr(4j−3), Vr(4j−2), Vr(4j−1), Vr(4j) and Vr(4j+1), selected by the first sub-decoder section 10, are transferred to the input nodes of the third and fourth sub-decoder sections 30A and 40A.

The following describes selection of the reference voltages (Vr(4j−3), Vr(4j−2), Vr(4j−1), Vr(4j) and Vr(4j+1) in the third and fourth sub-decoder sections 30A and 40A with reference to FIG. 7. It is presumed that the third sub-decoder section 30A includes a plurality of Pch transistor switches (Pch-SW) and that the fourth sub-decoder section 40A includes a plurality of Nch transistor switches (Nch-SW).

(1) If (D2, D1, D0)=(Low, Low, Low), the Pch SWs in the third sub-decoder section 30A, whose gates are connected to D2, D1 and D0, respectively, are turned on. Vr(4j−3), Vr(4j−2) and Vr(4j−1) are transferred to the nodes n3_1, n4_1 and n5_1, respectively, whereas n3_1 (=Vr(4j−3)) and n4_1 are transferred to T1 and n2_1, respectively, and n3_1 (=Vr(4j−3)) is transferred to T2. In the fourth sub-decoder section 40A, Nch-SWs, whose gates are connected to D2B, D1B and D0B, respectively, are turned on. Vr(4j−3), Vr(4j−2) and Vr(4j−1) are transferred to the nodes n3_2, n4_2 and n5_2, respectively, whereas n3_2 (=Vr(4j−3)) and n4_2 are transferred to the wiring 61_1 and n2_2, respectively, and n3_2 (=Vr(4j−3)) is transferred to the wiring 61_2. As a result, (V(T1), V(T2)) (Vr(4j−3), Vr(4j−3)) is transferred to the nodes T1 and T2.

(2) If (D2, D1, D0)=(Low, Low, High), the Pch SWs in the third sub-decoder section 30A, whose gates are connected to D2, D1 and D0B, respectively, are turned on. Vr(4j−3), Vr(4j−2) and Vr(4j−1) are transferred to the nodes n3_1, n4_1 and n5_1, respectively, whereas n3_1 (=Vr(4j−3)) and n4_1 are transferred to T1 and n2_1, respectively, and n2_1 (=Vr(4j−2)) is transferred to T2. In the fourth sub-decoder section 40A, Nch-SWs, whose gates are connected to D2B, D1B and D0, are turned on. Vr(4j−3), Vr(4j−2) and Vr(4j−1) are transferred to the nodes n3_2, n4_2 and n5_2, respectively, whereas n3_2 (=Vr(4j−3)) and n4_2 (=Vr(4j−2)) are transferred to the wiring 61_1 and n2_2, respectively, and n2_2 (=Vr(4j−2)) is transferred to the wiring 61_2. As a result, (V(T1), V(T2))=(Vr(4j−3), Vr(4j−2)) is transferred to the nodes T1 and T2.

(3) If (D2, D1, D0)=(Low, High, Low), the Pch SWs in the third sub-decoder section 30A, whose gates are connected to D2, D1B and D0, respectively, are turned on. (Vr(4j−3), Vr(4j−2), Vr(4j−1) are transferred to the nodes n3_1, n4_1 and n5_1, respectively, whereas n4_1 (=Vr(4j−2)) and n5_1 are transferred to T1, n2_1, respectively, and n4_1 is transferred to T2. In the fourth sub-decoder section 40A, Nch-SWs, whose gates are connected to D2B, D1 and D0B, respectively, are turned on. Vr(4j−3), Vr(4j−2), Vr(4j−1) are transferred to the nodes n3_2, n4_2 and n5_2, respectively, whereas n4_2 (=Vr(4j−2)), n5_2 are transferred to the wiring 61_1 and the node n2_2, respectively, and n4_2 is transferred to the wiring 61_2. As a result, (V(T1), V(T2)) (Vr(4j−2), Vr(4j−2)) is transferred to the nodes T1 and T2.

(4) If (D2, D1, D0)=(Low, High, High), the Pch SWs in the third sub-decoder section 30A, whose gates are connected to D2, D1B and D0B, respectively, are turned on. Vr(4j−3), Vr(4j−2) and Vr(4j−1) are transferred to the nodes n3_1, n4_1 and n5_1, respectively, whereas n4_1 (=Vr(4j−2)) and n5_1 are transferred to T1 and n2_1, respectively, and n5_1 (=Vr(4j−1)) is transferred to T2. In the fourth sub-decoder section 40A, Nch-SWs, whose gates are connected to D2B, D1 and D0, respectively, are turned on. Vr(4j−3), Vr(4j−2) and Vr(4j−1) are transferred to the nodes n3_2, n4_2 and n5_2, respectively, whereas n4_2 (=Vr(4j−2)) and n5_2 are transferred to the wiring 61_1 and the node n2_2, respectively, and n2_2 (=Vr(4j−1)) is transferred to the wiring 61_2. As a result, (V(T1), V(T2))=(Vr(4j−2), Vr(4j−1)) is transferred to the nodes T1 and T2.

(5) If (D2, D1, D0)=(High, Low, Low), the Pch SWs in the third sub-decoder section 30A, whose gates are connected to D2B, D1 and D0, respectively, are turned on. Vr(4j−1), Vr(4j) and Vr(4j+1) are transferred to the nodes n3_1, n4_1 and n5_1, respectively, whereas n3_1 (=Vr(4j−1)) and n4_1 are transferred to T1, n2_1, respectively, and n3_1 (=Vr(4j−1)) is transferred to T2. In the fourth sub-decoder section 40A, Nch-SWs, whose gates are connected to D2, D1B and D0B, respectively, are turned on. Vr(4j−1), Vr(4j) and Vr(4j+1) are transferred to the nodes n3_2, n4_2 and n5_2, respectively, whereas n3_2 (=Vr(4j−1)), n4_2 are transferred to the wiring 61_1 and the node n2_2, respectively, and n3_2 is transferred to the wiring 61_2. As a result, (V(T1), V(T2)) (Vr(4j−1), Vr(4j−1)) is transferred to the nodes T1 and T2.

(6) If (D2, D1, D0) (High, Low, High), the Pch SWs in the third sub-decoder section 30A, whose gates are connected to D2B, D1 and D0B, respectively, are turned on. Vr(4j−1), Vr(4j) and Vr(4j+1) are transferred to the nodes n3_1, n4_1 and n5_1, respectively, whereas n3_1 (=Vr(4j−1)) and n4_1 are transferred to T1 and n2_1, respectively, and n2_1 (=Vr(4j)) is transferred to T2. In the fourth sub-decoder section 40A, Nch-SWs, whose gates are connected to D2, D1B and D0, respectively, are turned on. Vr(4j−1), Vr(4j) and Vr(4j+1) are transferred to the nodes n3_2, n4_2 and n5_2, respectively, whereas n3_2 (=Vr(4j−1)) and n4_2 are transferred to the wiring 61_1 and the node n2_2, respectively, and n2_2 (=Vr(4j)) is transferred to the wiring 61_2. As a result, (V(T1), V(T2)) (Vr(4j−1), Vr(4j)) is transferred to the nodes T1 and T2.

(7) If (D2, D1, D0)=(High, High, Low), the Pch SWs in the third sub-decoder section 30A, whose gates are connected to D2B, D1B, D0, respectively, are turned on. Vr(4j−1), Vr(4j) and Vr(4j+1) are transferred to the nodes n3_1, n4_1 and n5_1, respectively, whereas n4_1 (=Vr(4j)) and n5_1 are transferred to T1, n2_1, respectively, and n4_1 is transferred to T2. In the fourth sub-decoder section 40A, Nch-SWs, whose gates are connected to D2, D1 and D0B, respectively, are turned on. Vr(4j−1), Vr(4j) and Vr(4j+1) are transferred to the nodes n3_2, n4_2 and n5_2, respectively, whereas n4_2 (=Vr(4j)) and n5_2 are transferred to the wirings 61_1 and n2_2, respectively, and n4_2 is transferred to the wiring 61_2. As a result, (V(T1), V(T2))=(Vr(4j), Vr(4j)) is transferred to the nodes T1 and T2.

(8) If (D2, D1, D0)=(High, High, High), the Pch SWs in the third sub-decoder section 30A, whose gates are connected to D2B, D1B and D0B, respectively, are turned on. Vr(4j−1), Vr(4j) and Vr(4j+1) are transferred to the nodes n3_1, n4_1 and n5_1, respectively, whereas n4_1 (=Vr(4j)) and n5_1 are transferred to T1 and n2_1, respectively, and n2_1 (=Vr(4j+1)) is transferred to T2. In the fourth sub-decoder section 40A, Nch-SWs, whose gates are connected to D2, D1 and D0, respectively, are turned on. Vr(4j−1), Vr(4j) and Vr(4j+1) are transferred to the nodes n3_2, n4_2 and n5_2, respectively, whereas n4_2 (=Vr(4j)), n5_2 are transferred to the wirings 61_1 and n2_2, respectively, and n2_2 (=Vr(4j+1)) is transferred to the wiring 61_2. As a result, (V(T1), V(T2)) (Vr(4j), Vr(4j+1)) is transferred to the nodes T1 and T2.

That is, the voltages transferred to the nodes T1 and T2, corresponding to the first and second voltages Vo1 and Vo2, are two voltages, out of the reference voltages Vr(4j−3), Vr(4j−2), Vr(4j−1), Vr(4j), and Vr(4j+1), which are adjacent to each other in the ordinal sequence, or which are a sole voltage selected in duplicate.

The voltages V(T1) and V(T2) at respective nodes T1 and T2, are supplied to the amplifier circuit 50 of FIG. 3A, and a voltage corresponding to a voltage averaged (interpolated) at a ratio of 1:1 is supplied at an output terminal of the amplifier circuit 50.

It is now presumed that five reference voltages Vr(4j−3), Vr(4j−2), Vr(4j−1), Vr(4j) and Vr(4j+1), contiguous in their order of ordinal sequence numbers, supplied to the third and fourth sub-decoder sections 30A and 40A, are at voltage levels separated at an interval of 2Vf from one another, such that $Vr(4j-3)=Vo$ $Vr(4j-2)=Vo+2Vf$ $Vr(4j-1)=Vo+4Vf$ $Vr(4j)=Vo+6Vf$ $Vr(4j+1)=Vo+8Vf.$ Then, the output voltage Vout of the amplifier circuit 50 (=(V(T1)+V(T2))/2) is such that in case $(D2,D1,D0)=(Low,Low,Low)$, $Vout=Vo$;

in case $(D2,D1,D0)=(Low,Low,High)$, $Vout=Vo+Vf$;

in case $(D2,D1,D0)=(Low,High,Low)$, $Vout=Vo+2Vf$;

in case $(D2,D1,D0)=(Low,High,High)$, $Vout=Vo+3Vf$;

in case $(D2,D1,D0)=(High,Low,Low)$, $Vout=Vo+4Vf$;

in case $(D2,D1,D0)=(High,Low,High)$, $Vout=Vo+5Vf$;

in case $(D2,D1,D0)=(High,High,Low)$, $Vout=Vo+6Vf$; and in case $(D2,D1,D0)=(High,High,High)$, $Vout=Vo+7Vf.$ Hence, eight voltage levels of from Vo to Vo+7Vf, spaced apart from one another at an interval of Vf, are output in response to the signal (D2, D1, D0).

Exemplary Embodiment 2

Figure 8:
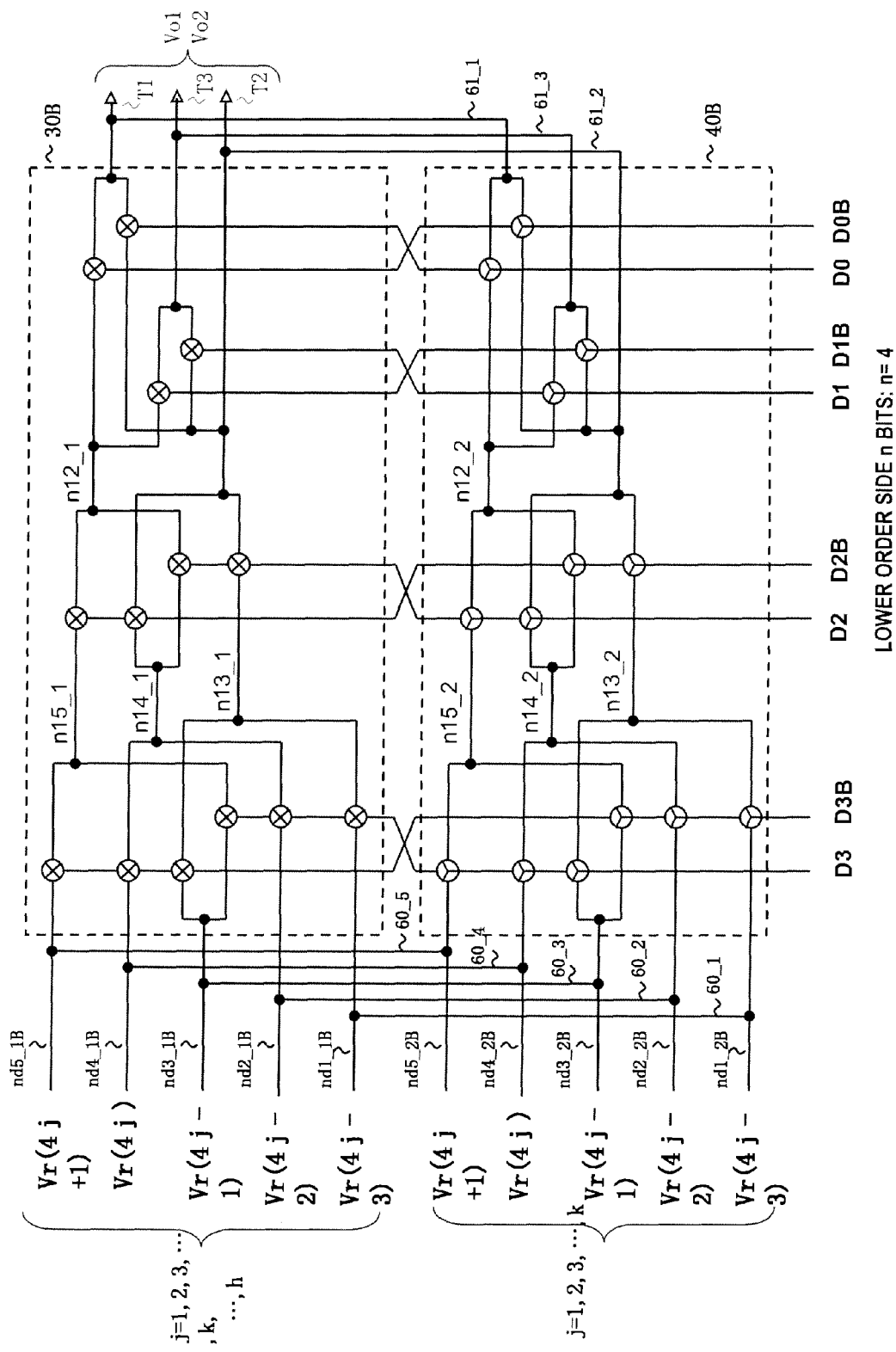
FIG. 8 is a diagram showing a configuration of the third and fourth sub-decoder sections of a second exemplary embodiment of the present invention.

FIG. 8 schematically shows the configuration of third and fourth sub-decoder sections 30B and 40B of a second exemplary embodiment, for S=2, z=2 (zS+1=5), P=3 and n=4. The first and second sub-decoder sections 10 and 20 are the same as those of the first exemplary embodiment in FIG. 2. The third and fourth sub-decoder sections 30B and 40B receive (zS+1=5) reference voltages, selected and output by the first and second sub-decoder sections 10 and 20. Then, based upon the lower side n (=4) bits of m-bit digital data (D3 to D0, D3B to D0B), the third and fourth sub-decoders select first and second voltages (Vo1, Vo2) and transfer the so selected voltages, inclusive of duplications, to the nodes T1 to T3.

Figure 21:
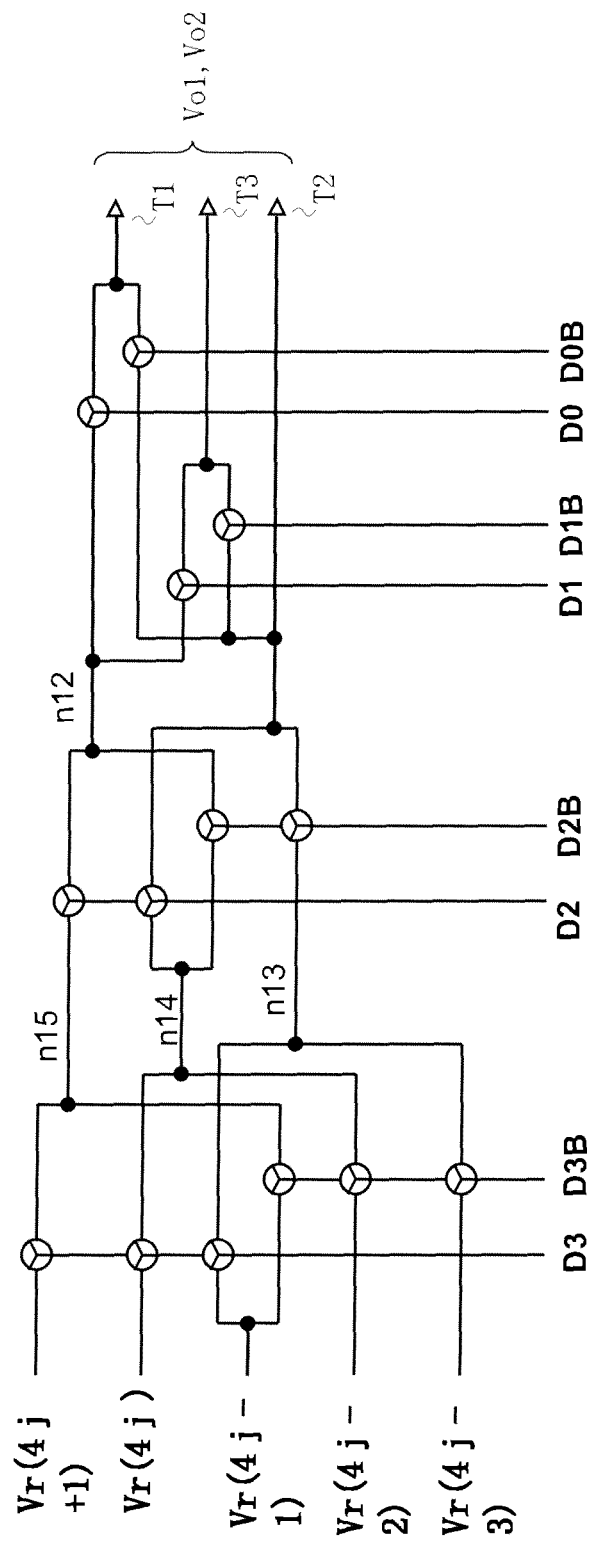
FIG. 21 is a diagram showing another example configuration of the sub-decoder 813 of FIG. 17.

The third sub-decoder section 30B includes a plurality of transistor switches of the first conductivity type, such as Pch, whereas the fourth sub-decoder section 40B includes a plurality of transistor switches of the second conductivity type, such as Nch. Although the manner of switch positions of the third and fourth transistor switches are the same, the bit signals supplied to the gates of the third and fourth transistor switches are complementary to each other. In case the fourth sub-decoder section 40B is composed by Nch transistors, the resulting arrangement is the same as that of FIG. 21.

Referring to FIG. 8, input nodes nd1_1B, nd2_1B, nd3_1B, nd4_1B and nd5_1B of the third sub-decoder section 30B and the input nodes nd1_2B, nd2_2B, nd3_2B, nd4_2B and nd5_2B of the fourth sub-decoder section 40B are connected together in common through wirings 60_1, 60_2, 60_3 and 60_4 used for connecting the Pch/Nch transistor regions. The first to third output nodes (T1, T2, T3) of the third sub-decoder section 30B and the first to third output nodes (T1, T2, T3) of the fourth sub-decoder section 40B are also connected in common by wirings 61_1, 61_2 and 61_3 used for connecting the Pch/Nch transistor regions.

Referring to FIG. 8, the input nodes nd1_1B, nd2_1B, nd3_1B, nd4_1B and nd5_1B of the third sub-decoder section 30B are supplied with the reference voltages Vr(4j−3), Vr(4j−2), Vr(4j−1), Vr(4j) and Vr(4j+1), selected by the first sub-decoder section 10, where j is any value of from 1 to h. The input nodes nd1_2B, nd2_2B, nd3_2B, nd4_2B and nd5_2B of the fourth sub-decoder section 40B are supplied with the reference voltages Vr(4j−3), Vr(4j−2), Vr(4j−1), Vr(4j) and Vr(4j+1), selected by the second sub-decoder section 20, where j may be any values of from 1 to k (1<k).

In case the index number j is an integer such that j=1 to k, the reference voltages Vr(4j−3), Vr(4j−2), Vr(4j−1), Vr(4j) and Vr(4j+1) from the first and second sub-decoder sections 10 and 20, are transferred common to the input nodes of the third and fourth sub-decoder sections 30B and 40B.

When the index j is an integer such that j=(k+1) to h, the second sub-decoder section 20 is not selected. The reference voltages Vr(4j−3), Vr(4j−2), Vr(4j−1), Vr(4j) and Vr(4j+1), selected by the first sub-decoder section 10, are transferred to the input nodes of the third and fourth sub-decoder sections 30B and 40B.

The following describes selection of the reference voltages Vr(4j−3), Vr(4j−2), Vr(4j−1), Vr(4j) and Vr(4j+1) in the third and fourth sub-decoders 30B and 40B with reference to FIG. 8. In the explanation to follow, it is presumed that the third sub-decoder section 30B includes a plurality of Pch transistor switches, whilst the fourth sub-decoder section 40B includes a plurality of Pch transistor switches.

(1) If (D3, D2, D1, D0) (Low, Low, Low, Low), the Pch-SWs in the third sub-decoder section 30B, whose gates are connected to D3, D2, D1 and D0, respectively, are turned on. Vr(4j−3), Vr(4j−2) and Vr(4j−1) are transferred to the nodes n13_1, n14_1 and n15_1, respectively, whilst n13_1 and n14_1 are transferred to terminals T2 and n12_1, and n13_1 is transferred to terminals T1 and T3. In the fourth sub-decoder section 40B, Nch-SWs, whose gates are connected to D3B, D2B, D1B and D0B, respectively, are turned on. Vr(4j−3), Vr(4j−2) and Vr(4j−1) are transferred to the nodes n13_2, n14_2 and n15_2, respectively, whilst n13_2 and n14_2 are transferred to wiring 61_2 and n12_2, and n13_2 is transferred to wirings 61_1 and 61_3. As a result, (V(T1), V(T2), V(T3))=(Vr(4j−3), Vr(4j−3), Vr(4j−3)) are transferred to the nodes T1, T2 and T3, respectively.

In the same manner as above, (2) If (D3, D2, D1, D0)=(Low, Low, Low, High), the Pch-SWs in the third sub-decoder section 30B, whose gates are connected to D3, D2, D1, D0B, respectively, are turned on, whilst the Nch-SWs in the fourth sub-decoder section 40B, whose gates are connected to D3B, D2B, D1B, D0, respectively, are turned on. As a result, (V(T1), V(T2), V(T3))=(Vr(4j−2), Vr(4j−3), Vr(4j−3)) are transferred to the nodes T1, T2 and T3.

(3) If (D3, D2, D1, D0)=(Low, Low, High, Low), the Pch-SWs in the third sub-decoder section 30B, whose gates are connected to D3, D2, D1B, D0, respectively, are turned on, whilst the Nch-SWs in the fourth sub-decoder section 40B, whose gates are connected to D3B, D2B, D1, D0B, respectively, are turned on. As a result, (V(T1), V(T2), V(T3))=(Vr(4j−3), Vr(4j−3), Vr(4j−2)) are transferred to the nodes T1, T2 and T3, respectively.

(4) If (D3, D2, D1, D0)=(Low, Low, High, High), the Pch-SWs in the third sub-decoder section 30B, whose gates are connected to D3, D2, D1B, D0B, respectively, are turned on, whilst the Nch-SWs in the fourth sub-decoder section 40A, whose gates are connected to D3B, D2B, D1, D0, respectively, are turned on. As a result, (V(T1), V(T2), V(T3))=(Vr(4j−2), Vr(4j−3), Vr(4j−2)) are transferred to the nodes T1, T2 and T3, respectively.

(5) If (D3, D2, D1, D0)=(Low, High, Low, Low), the Pch-SWs in the third sub-decoder section 30B, whose gates are connected to D3, D2B, D1, D0, respectively, are turned on, whilst the Nch-SWs in the fourth sub-decoder section 40A, whose gates are connected to D3B, D2, D1B, D0B, respectively, are turned on. As a result, (V(T1), V(T2), V(T3))=(Vr(4j−2), Vr(4j−2) Vr(4j−2)) are transferred to the nodes T1, T2 and T3, respectively.

(6) If (D3, D2, D1, D0)=(Low, High, Low, High), the Pch-SWs in the third sub-decoder section 30B, whose gates are connected to D3, D2B, D1, D0B, respectively, are turned on, whilst the Nch-SWs in the fourth sub-decoder section 40B, whose gates are connected to D3B, D2, D1B, D0, respectively, are turned on. As a result, (V(T1), V(T2), V(T3))=(Vr(4j−1), Vr(4j−2), Vr(4j−2)) are transferred to the nodes T1, T2 and T3, respectively.

(7) If (D3, D2, D1, D0)=(Low, High, High, Low), the Pch-SWs in the third sub-decoder section 30B, whose gates are connected to D3, D2B, D1B, D0, respectively, are turned on, whilst the Nch-SWs in the fourth sub-decoder section 40B, whose gates are connected to D3B, D2, D1, D0B, respectively, are turned on. As a result, (V(T1), V(T2), V(T3))=(Vr(4j−2), Vr(4j−2), Vr(4j−1)) are transferred to the nodes T1, T2 and T3, respectively.

(8) If (D3, D2, D1, D0)=(Low, High, High, High), the Pch-SWs in the third sub-decoder section 30B, whose gates are connected to D3, D2B, D1B, D0B, respectively, are turned on, whilst the Nch-SWs in the fourth sub-decoder section 40B, whose gates are connected to D3B, D2, D1, D0, respectively, are turned on. As a result, (V(T1), V(T2), V(T3))=(Vr(4j−1), Vr(4j−2), Vr(4j−1)) are transferred to the nodes T1, T2 and T3, respectively.

(9) If (D3, D2, D1, D0)=(High, Low, Low, Low), the Pch-SWs in the third sub-decoder section 30B, whose gates are connected to D3B, D2, D1, D0, respectively, are turned on, whilst the Nch-SWs in the fourth sub-decoder section 40B, whose gates are connected to D3, D2B, D1B, and D0B, are turned on. As a result, (V(T1), V(T2), V(T3)) (Vr(4j−1), Vr(4j−1), Vr(4j−1)) are transferred to the nodes T1, T2 and T3, respectively.

(10) If (D3, D2, D1, D0)=(High, Low, Low, High), the Pch-SWs in the third sub-decoder section 30B, whose gates are connected to D3B, D2, D1, D0B, respectively, are turned on, whilst the Nch-SWs in the fourth sub-decoder section 40B, whose gates are connected to D3, D2B, D1B, D0, respectively, are turned on. As a result, (V(T1), V(T2), V(T3))=(Vr(4j), Vr(4j−1), Vr(4j−1)) are transferred to the nodes T1, T2 and T3, respectively.

(11) If (D3, D2, D1, D0)=(High, Low, High, Low), the Pch-SWs in the third sub-decoder section 30B, whose gates are connected to D3B, D2, D1B, D0, respectively, are turned on, whilst the Nch-SWs in the fourth sub-decoder section 40B, whose gates are connected to D3, D2B, D1 and D0B, respectively, are turned on. As a result, (V(T1), V(T2), V(T3))=(Vr(4j−1), Vr(4j−1), Vr(4j)) are transferred to the nodes T1, T2 and T3, respectively.

(12) If (D3, D2, D1, D0)=(High, Low, High, High), the Pch-SWs in the third sub-decoder section 30B, whose gates are connected to D3B, D2, D1B, D0B, respectively, are turned on, whilst the Nch-SWs in the fourth sub-decoder section 40A, whose gates are connected to D3, D2B, D1, and D0, respectively, are turned on. As a result, (V(T1), V(T2), V(T3)) =(Vr(4j), Vr(4j−1), Vr(4j)) are transferred to the nodes T1 and T2, T3, respectively.

(13) If (D3, D2, D1, D0)=(High, High, Low, Low), the Pch-SWs in the third sub-decoder section 30B, whose gates are connected to D3B, D2B, D1 and D0, respectively, are turned on, whilst the Nch-SWs in the fourth sub-decoder section 40A, whose gates are connected to D3, D2, D1B, and D0B, are turned on. As a result, (V(T1), V(T2), V(T3)) (Vr(4j), Vr(4j), Vr(4j)) are transferred to the nodes T1, T2 and T3, respectively.

(14) If (D3, D2, D1, D0) (High, High, Low, High), the Pch-SWs in the third sub-decoder section 30B, whose gates are connected to D3B, D2B, D1, D0B, respectively, are turned on, whilst the Nch-SWs in the fourth sub-decoder section 40B, whose gates are connected to D3, D2, D1B, D0, respectively, are turned on. As a result, (V(T1), V(T2), V(T3))=(Vr(4j+1), Vr(4j), Vr(4j)) are transferred to the nodes T1, T2 and T3, respectively.

(15) If (D3, D2, D1, D0)=(High, High, High, Low), the Pch-SWs in the third sub-decoder section 30B, whose gates are connected to D3B, D2B, D1B, D0, respectively, are turned on, whilst the Nch-SWs in the fourth sub-decoder section 40B, whose gates are connected to D3, D2, D1 and D0B, are turned on. As a result, (V(T1), V(T2), V(T3)) (Vr(4j), Vr(4j), Vr(4j+1)) are transferred to the nodes T1, T2 and T3, respectively.

(16) If (D3, D2, D1, D0)=(High, High, High, High), the Pch-SWs in the third sub-decoder section 30B, whose gates are connected to D3B, D2B, D1B, D0B, respectively, are turned on, whilst the Nch-SWs in the fourth sub-decoder section 40B, whose gates are connected to D3, D2, D1, D0, are turned on. As a result, (V(T1), V(T2), V(T3))=(Vr(4j+1), Vr(4j), Vr(4j+1)) is transferred to the nodes T1, T2 and T3, respectively.

That is, the voltages transferred to the nodes T1, T2 and T3, corresponding to the first and second voltages Vo1 and Vo2, are either two voltages, out of the reference voltages Vr(4j−3), Vr(4j−2), Vr(4j−1), Vr(4j) and Vr(4j+1), which are adjacent to each other in their ordinal sequence numbers, or are a single voltage selected in duplicate.

The voltages V(T1), V(T2) and V(T3) at the respective nodes T1, T2 and T3 are supplied to the amplifier circuit 50 of FIG. 3B, and a voltage corresponding to the voltages V(T1), V(T2) and V(T3) averaged (interpolated) at a ratio of 1:1:2 is supplied at an output terminal of the amplifier circuit 50.

It is now presumed that five reference voltages Vr(4j−3), Vr(4j−2), Vr(4j−1), Vr(4j) and Vr(4j+1), contiguous in their order of ordinal sequence numbers, and which are supplied to the third and fourth sub-decoder sections 30B and 40B, are at voltage levels separated from one another at an interval of 4Vf, such that $$Vr(4j-3)=Vo,$$

$$Vr(4j-2)=Vo+4Vf,$$

$$Vr(4j-1)=Vo+8Vf,$$

$$Vr(4j)=Vo+12Vf,\text{ and}$$

$$Vr(4j+1)=Vo+16Vf.$$

Then, the output voltage Vout of the amplifier circuit 50 (=(V(T1)+V(T2)+2×V(T3))/4) is such that in case $(D3,D2,D1,D0)=(\text{Low},\text{Low},\text{Low},\text{Low})$,
$$Vout=Vo;$$

in case $(D3,D2,D1,D0)=(\text{Low},\text{Low},\text{Low},\text{High})$,
$$Vout=Vo+Vf;$$

in case $(D3,D2,D1,D0)=(\text{Low},\text{Low},\text{High},\text{Low})$,
$$Vout=Vo+2Vf;$$

in case $(D3,D2,D1,D0)=(\text{Low},\text{Low},\text{High},\text{High})$,
$$Vout=Vo+3Vf;$$

in case $(D3,D2,D1,D0)=(\text{Low},\text{High},\text{Low},\text{Low})$,
$$Vout=Vo+4Vf;$$

in case $(D3,D2,D1,D0)=(\text{Low},\text{High},\text{Low},\text{High})$,
$$Vout=Vo+5Vf;$$

in case $(D3,D2,D1,D0)=(\text{Low},\text{High},\text{High},\text{Low})$,
$$Vout=Vo+6Vf;$$

in case $(D3,D2,D1,D0)=(\text{Low},\text{High},\text{High},\text{High})$,
$$Vout=Vo+7Vf;$$

in case $(D3,D2,D1,D0)=(\text{High},\text{Low},\text{Low},\text{Low})$,
$$Vout=Vo+8Vf;$$

in case $(D3,D2,D1,D0)=(\text{High},\text{Low},\text{Low},\text{High})$,
$$Vout=Vo+9Vf;$$

in case $(D3,D2,D1,D0)=\text{High},\text{Low},\text{High},\text{Low})$,
$$Vout=Vo+10Vf;$$

in case $(D3,D2,D1,D0)=(\text{High},\text{Low},\text{High},\text{High})$,
$$Vout=Vo+11Vf;$$

in case $(D3,D2,D1,D0)=(\text{High},\text{High},\text{Low},\text{Low})$,
$$Vout=Vo+12Vf;$$

in case $(D3,D2,D1,D0)=(\text{High},\text{High},\text{Low},\text{High})$,
$$Vout=Vo+13Vf;$$

in case $(D3,D2,D1,D0)=(\text{high},\text{High},\text{High},\text{Low})$,
$$Vout=Vo+14Vf;\text{ and}$$

in case $(D3,D2,D1,D0)=(\text{High},\text{High},\text{High},\text{High})$,
$$Vout=Vo+15Vf.$$

Consequently, 16 voltage levels of from Vo to Vo+15Vf, spaced apart from one another at intervals of Vf, are output in response to the signal (D3, D2, D1, D0).

Exemplary Embodiment 3

Figure 9:
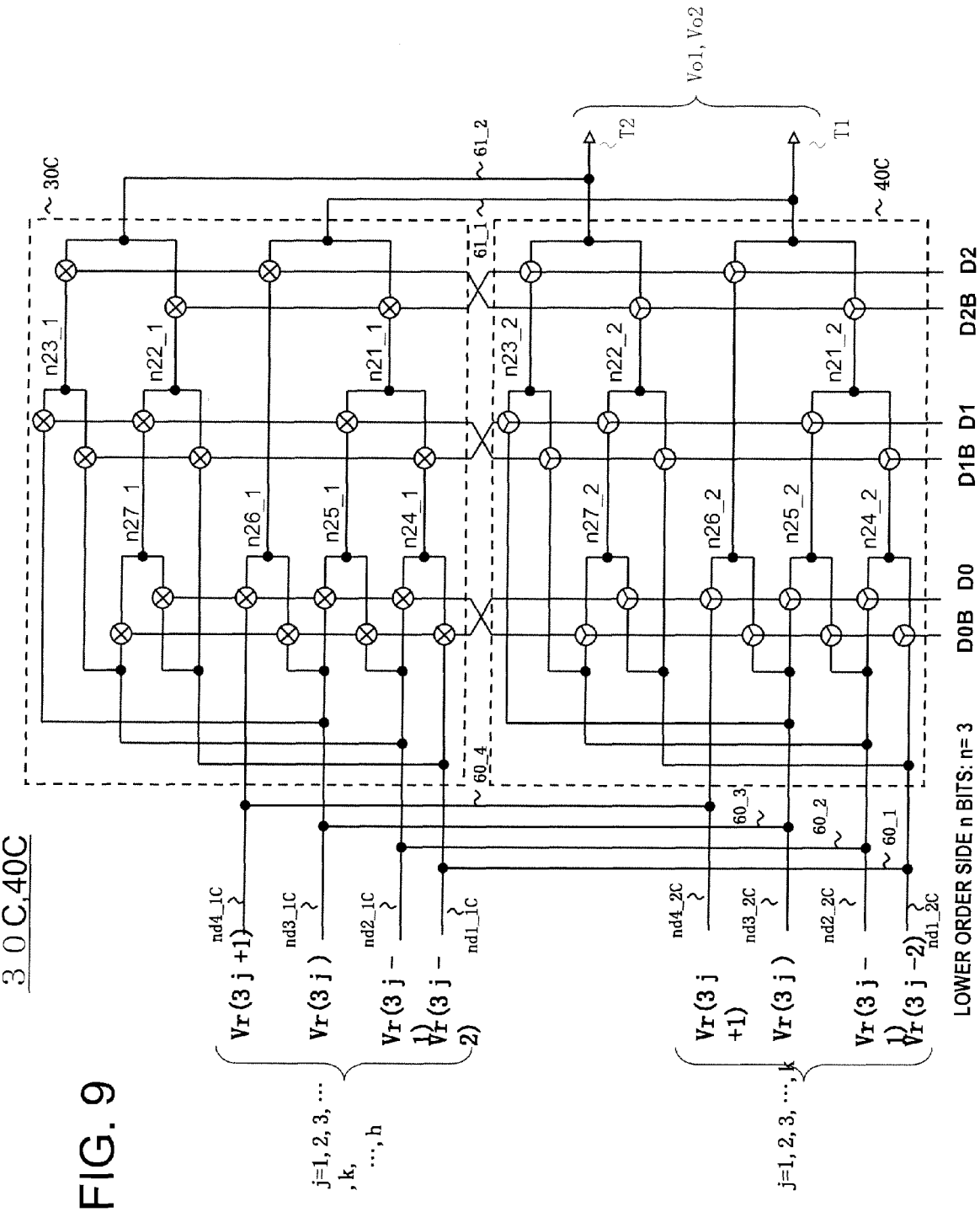
FIG. 9 is a diagram showing a configuration of the third and fourth sub-decoder sections of a third exemplary embodiment of the present invention.

FIG. 9 schematically shows the configuration of third and fourth sub-decoder sections 30C and 40C of a third exemplary embodiment, for S=1, z=3 (zS+1=4), P=2 and n=3. Each of these sub-decoder sections 30C and 40C of FIG. 9 receives (zS+1=4) reference voltages, selected and output by the first and second sub-decoder sections 10 and 20. The first and second sub-decoder sections 10 and 20 are the same as those of the first exemplary embodiment in FIG. 2. Then, based upon the lower side n (=3) bits of m-bit digital data (D2 to D0, D2B to D0B), the sub-decoder sections 30C and 40C select first and second voltages (Vo1, Vo2) and transfer the so selected voltages, inclusive of duplications, to the nodes T1 and T2.

Figure 22:
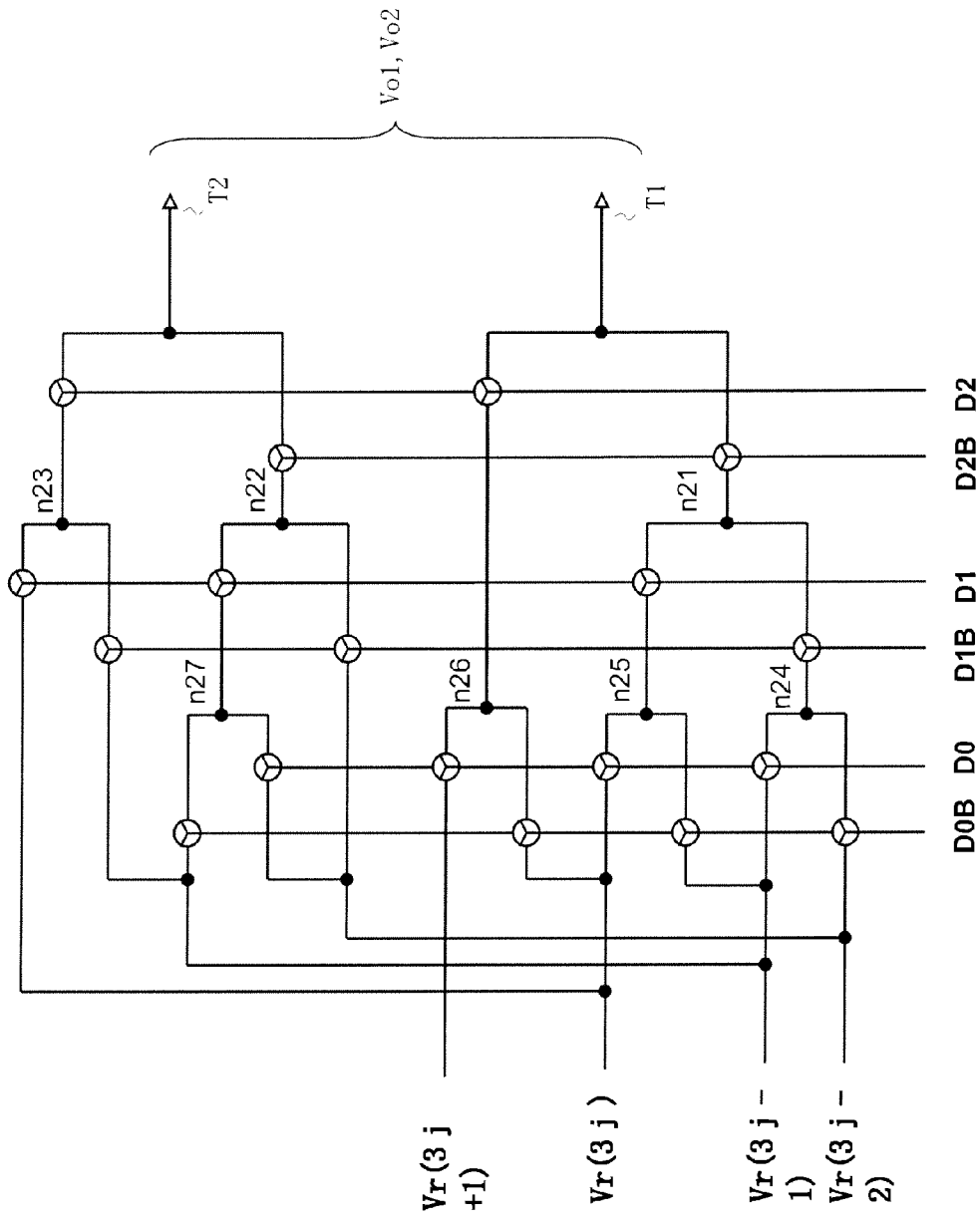
FIG. 22 is a diagram showing still another example configuration of the sub-decoder 813 of FIG. 17.

The third sub-decoder section 30C includes a plurality of transistor switches of the first conductivity type, such as Pch, whereas the fourth sub-decoder section 40C includes a plurality of transistor switches of the second conductivity type, such as Nch. Although the switch positions of the third and fourth transistor switches is the same, the bit signals supplied to the gates of the third and fourth transistor switches are complementary to each other. In case the fourth sub-decoder section 40C is composed by Nch transistor switches, the resulting arrangement is the same as that of FIG. 22.

Referring to FIG. 9, input nodes nd1_1C, nd2_1C, nd3_1C and nd4_1C of the third sub-decoder section 30C and the input nodes nd1_2C, nd2_2C, nd3_2C, and nd4_2C of the fourth sub-decoder section 40C are connected together in common through wirings 60_1, 60_2, 60_3 and 60_4 connecting the Pch/Nch transistor regions. The first and second output nodes (T1, T2) of the third sub-decoder section 30C and the first and second output nodes (T1, T2) of the fourth sub-decoder section 40C are also connected in common by wirings 61_1 and 61_2 connecting the Pch/Nch transistor regions.

Referring to FIG. 9, the input nodes nd1_1C, nd2_1C, nd3_1C and nd4_1C of the third sub-decoder section 30C are supplied with the reference voltages Vr(3j−2), Vr(3j−1), Vr(3j) and Vr(3j+1), selected by the first sub-decoder section 10, where j is any value of from 1 to h. The input nodes nd1_2C, nd2_2C, nd3_2C and nd4_2C of the fourth sub-decoder section 40C are supplied with the reference voltages Vr(3j−2), Vr(3j−1), Vr(3j), and Vr(3j+1), selected by the second sub-decoder section 20, where j may be any values of from 1 to k.

In case the index number j=1 to k, the reference voltages Vr(3j−2), Vr(3j−1), Vr(3j) and Vr(3j+1) from the first and second sub-decoder sections 10 and 20, are transferred in common to the input nodes of the third and fourth sub-decoder sections 30C and 40C. When the index number j=(k+1) to h, the second sub-decoder section 20 is not selected. The reference voltages Vr(3j−2), Vr(3j−1), Vr(3j) and Vr(3j+1), selected by the first sub-decoder section 10, are transferred to the input nodes of the third and fourth sub-decoder sections 30C and 40C.

The following describes selection of the reference voltages Vr(3j−2), Vr(3j−1), Vr(3j) and Vr(3j+1) in the third and fourth sub-decoder sections 30C and 40C with reference to FIG. 9. In the following, it is presumed that the third sub-decoder section 30C includes a plurality of Pch transistor switches, whilst the fourth sub-decoder section 40C includes a plurality of Nch transistor switches.

(1) If (D2, D1, D0) (Low, Low, Low), the Pch-SWs in the third sub-decoder section 30C, whose gates are connected to D2, D1, D0, respectively, are turned on. Vr(3j−2), Vr(3j−1), Vr(3j) and Vr(3j−1) are transferred to the nodes n24_1, n25_1, n26_1 and n27_1, respectively. The voltage at the node n24_1, Vr(3j−2) and Vr(3j−1) are transferred to n21_1, n22_1 and n23_1, respectively, whilst voltages at n21_1 and n22_2 are transferred to wirings 61_1 and 61_2 respectively. In the fourth sub-decoder section 40C, Nch-SWs, whose gates are connected to D2B, D1B and D0B, respectively, are turned on. Vr(3j−2), Vr(3j−1), Vr(3j) and Vr(3j−1) are transferred to the nodes n24_2, n25_2, n26_2 and n27_2, whilst the voltage at the node n24_2, Vr(3j−2) and Vr(3j−1) are transferred to nodes n21_2, n22_2, n23_2, and voltages at nodes n21_2, and n22_2 are transferred to T1 and T2, respectively. As a result, (V(T1), V(T2))=(Vr(3j−2), Vr(3j−2)) are transferred to the nodes T1 and T2, respectively.

In a similar manner, (2) if (D2, D1, D0)=(Low, Low, High), the Pch SWs in the third sub-decoder section 30C, whose gates are connected to D2, D1 and D0B, respectively, are turned on, whereas Nch-SWs in the fourth sub-decoder section 40C, whose gates are connected to D2B, D1B and D0, respectively, are turned on. (V(T1), V(T2))=(Vr(3j−1), Vr(3j−2)) are transferred to the nodes T1 and T2, respectively.

(3) If (D2, D1, D0)=(Low, High, Low), the Pch SWs in the third sub-decoder section 30C, whose gates are connected to D2, D1B and D0, are turned on, whereas Nch-SWs in the fourth sub-decoder section 40C, whose gates are connected to D2B, D1 and D0B, respectively, are turned on. (V(T1), V(T2)) (Vr(3j−1), Vr(3j−1)) are transferred to the nodes T1 and T2.

(4) If (D2, D1, D0)=(Low, High, High), the Pch SWs in the third sub-decoder section 30C, whose gates are connected to D2, D1B and D0B, respectively, are turned on, whereas Nch-SWs in the fourth sub-decoder section 40C, whose gates are connected to D2B, D1 and D0, respectively, are turned on. (V(T1), V(T2))=(Vr(3j), Vr(3j−2)) are transferred to the nodes T1 and T2.

(5) If (D2, D1, D0)=(High, Low, Low), the Pch SWs in the third sub-decoder section 30C, whose gates are connected to D2B, D1 and D0, respectively, are turned on, whereas Nch-SWs in the fourth sub-decoder section 40C, whose gates are connected to D2, D1B and D0B, are turned on. (V(T1), V(T2)) (Vr(3j), Vr(3j−1)) is transferred to the nodes T1 and T2.

(6) If (D2, D1, D0)=(High, Low, High), the Pch SWs in the third sub-decoder section 30C, whose gates are connected to D2B, D1 and D0B, are turned on, whereas Nch-SWs in the fourth sub-decoder section 40C, whose gates are connected to D2, D1B and D0, are turned on. (V(T1), V(T2))=(Vr(3j+1), Vr(3j−1)) is transferred to the nodes T1 and T2.

(7) If (D2, D1, D0)=(High, High, Low), the Pch SWs in the third sub-decoder section 30C, whose gates are connected to D2B, D1B and D0, respectively, are turned on, whereas Nch-SWs in the fourth sub-decoder section 40C, whose gates are connected to D2, D1 and D013, respectively, are turned on. (V(T1), V(T2))=(Vr(3j), Vr(3j)) is transferred to the nodes T1 and T2.

(8) If (D2, D1, D0)=(High, High, High), the Pch SWs in the third sub-decoder section 30C, whose gates are connected to D2B, D1B and D0B, respectively, are turned on, whereas Nch-SWs in the fourth sub-decoder section 40C, whose gates are connected to D2, D1 and D0, respectively, are turned on. (V(T1), V(T2))=(Vr(3j+1), Vr(3j)) is transferred to the nodes T1 and T2.

That is, the voltages transferred to the nodes T1 and T2, corresponding to the first and second voltages Vo1 and Vo2, are either two voltages, out of the reference voltages Vr(3j−2), Vr(3j−1), Vr(3j) and Vr(3j+1), inclusive of those which are not adjacent to each other in their ordinal sequence numbers, or the same voltage selected in duplication.

The voltages V(T1) and V(T2) at respective nodes T1 and T2 are supplied to the amplifier circuit 50 of FIG. 3A, and a voltage corresponding to a voltage averaged (interpolated) at a ratio of 1:1 is supplied at the output terminal of the amplifier circuit 50.

For example, it is presumed that four reference voltages Vr(3j−2), Vr(3j−1), Vr(3j) and Vr(3j+1), contiguous in their order of ordinal sequence numbers, and which are supplied to the third and fourth sub-decoder sections 30C and 40C, are at voltage levels separated from one another at an interval of 2Vf or 4Vf, such that $Vr(3j-2)=Vo,$ $Vr(3j-1)=Vo+2Vf,$ $Vr(3j)=Vo+6Vf,$ and $Vr(3j+1)=Vo+8Vf.$ Then, the output voltage Vout of the amplifier circuit 50 (=(V(T1)+V(T2))/2) is such that in case (D2,D1,D0)=(Low,Low,Low), Vout=Vo;

in case (D2,D1,D0)=(Low,Low,High), Vout=Vo+Vf;

in case (D2,D1,D0)=(Low,High,Low), Vout=Vo+2Vf;

in case (D2,D1,D0)=(Low,High,High), Vout=Vo+3Vf;

in case (D2,D1,D0)=(High,Low,Low), Vout=Vo+4Vf;

in case (D2,D1,D0)=(High,Low,High), Vout=Vo+5Vf;

in case (D2,D1,D0)=(High,High,Low), Vout=Vo+6Vf; and in case (D2,D1,D0)=(High,High,High), Vout=Vo+7Vf.

Consequently, eight voltage levels of from Vo to Vo+7Vf, spaced apart from one another at an identical interval of Vf, are output in response to the signal (D2, D1, D0).

In FIGS. 7 to 9, the switch positions in the third sub-decoder section 30 are the same as those in the fourth sub-decoder section 40, and complementary bit signals are supplied to the gates in the respective sub-decoders. However, the configurations of the third and fourth sub-decoders may be made to differ from each other, such as by interchanging the sequence of selection of bit signals of one or both of the third and fourth sub-decoders, provided that the values of the lower side n-bit signals and the values of the selected voltages remain the same.

In the exemplary embodiments of FIGS. 7 to 9, input nodes of the third and fourth sub-decoder sections 30 and 40 of FIGS. 1 and 2 are connected in common, and output nodes thereof are also connected in common, thereby providing an equivalent CMOS configuration. By so doing, the switch on-resistances at the time of selection by the third and fourth sub-decoder sections 30 and 40 may be decreased for the total of the reference voltages selected by the decoder 100. The gate widths of the transistor switches of the first sub-decoder section 10 (switch set 91P of the sub-decoder 10-*i* of FIG. 5) may thus be suppressed from increasing.

The first sub-decoder section 10 includes (zS+1) tournament configuration sub-decoder sections each of which is selected by an (m−n) bit signal, Consequently, the increase of the gate widths of transistor switches of the first sub-decoder section 10 may be suppressed, thus achieving saving in an area otherwise taken up by the decoder 100.

Figure 15:
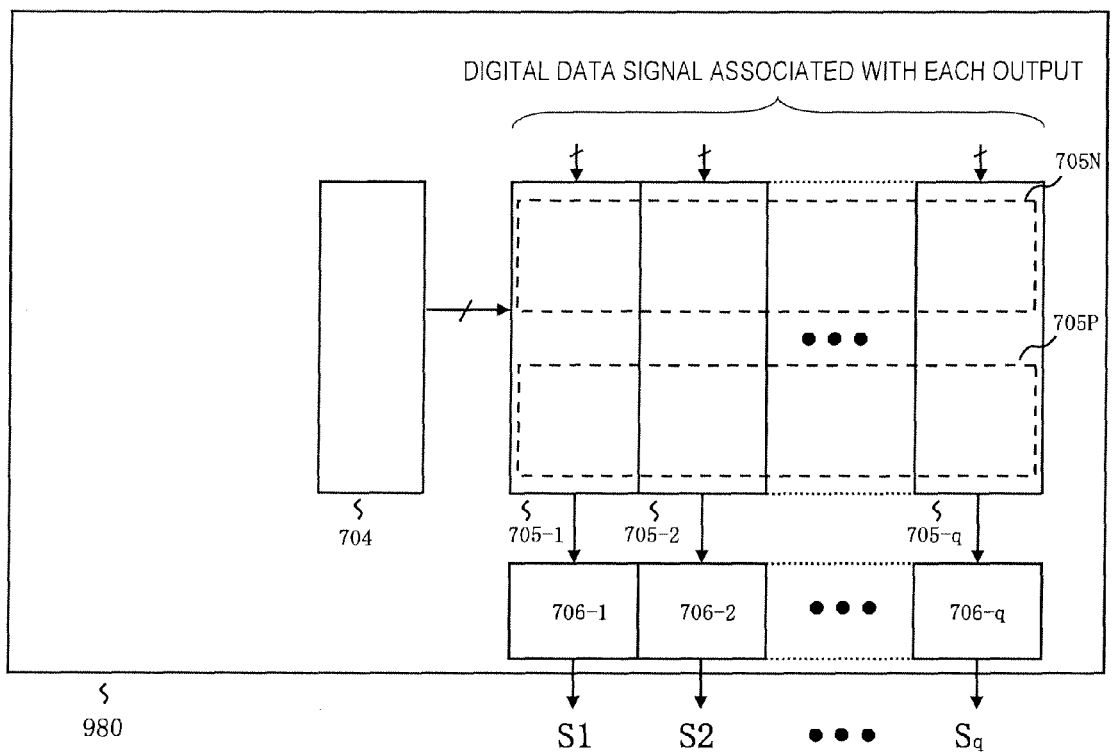
FIG. 15 is a diagram showing the layout of a data driver (LSI chip).
Figure 16B:
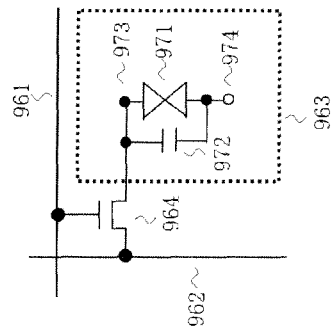
FIGS. 16A to 16C are diagrams showing example configuration of an illustrative display and illustrative display elements (liquid crystal elements and organic EL elements).
Figure 16C:
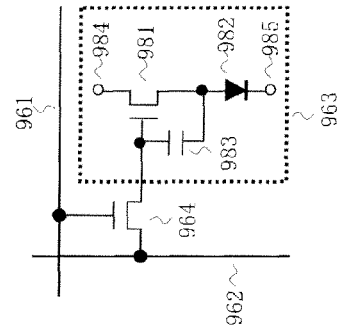
Figure 16A:
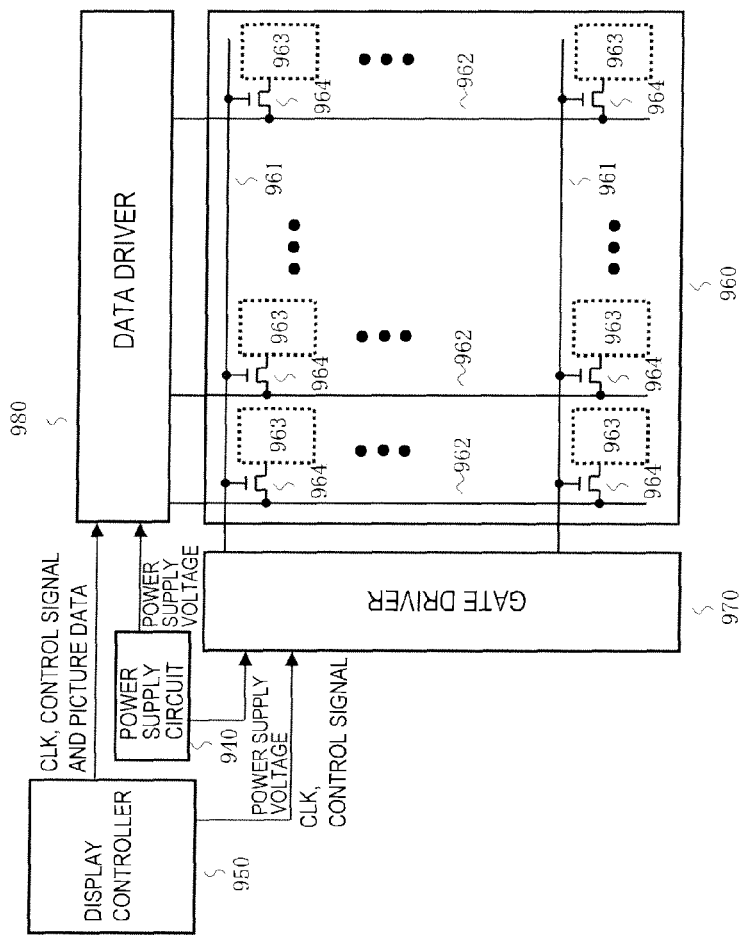
Figure 17:
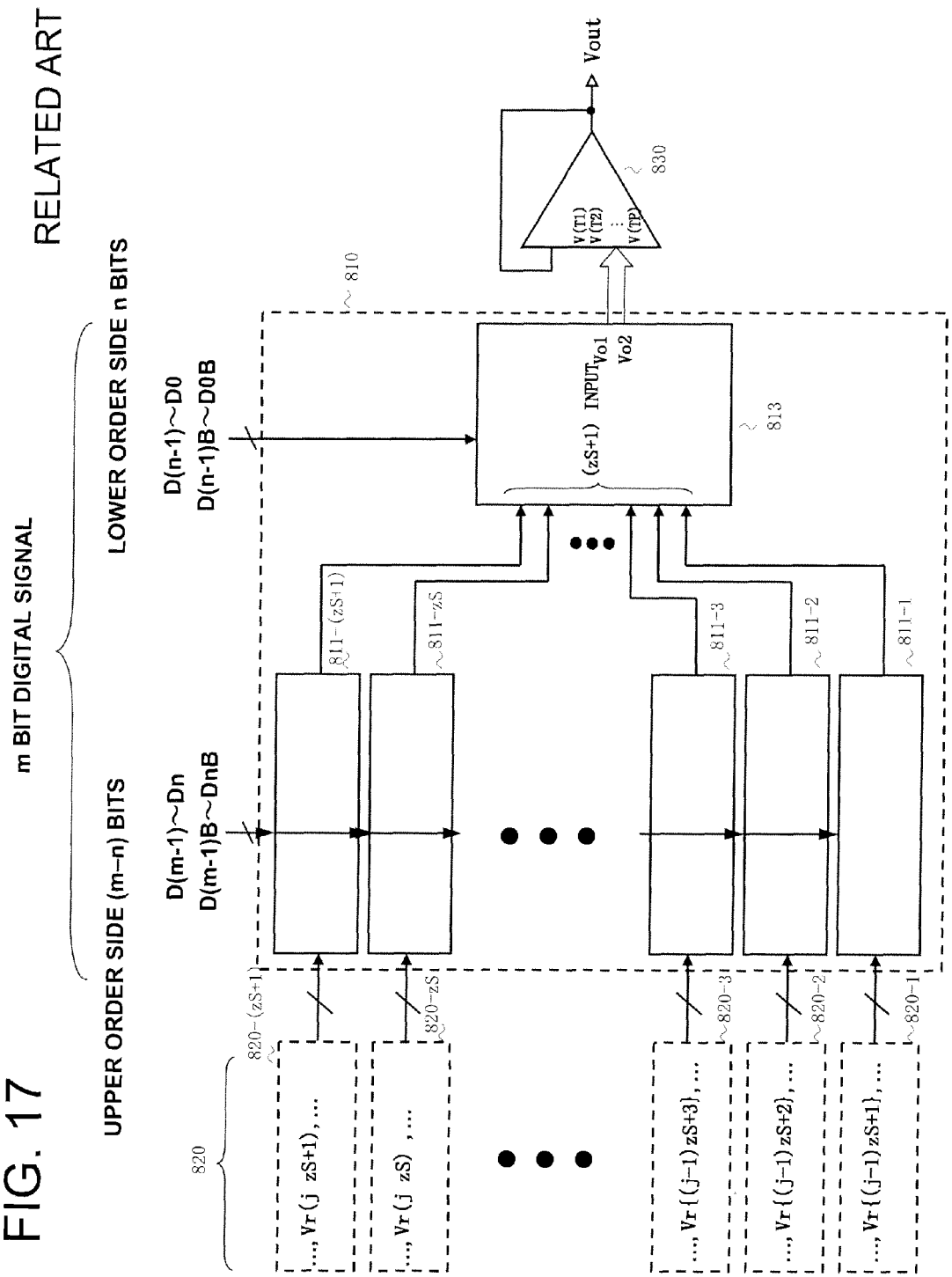
FIG. 17 is a diagram showing a configuration of a digital-to-analog converter circuit of a related technique.
Figure 19:
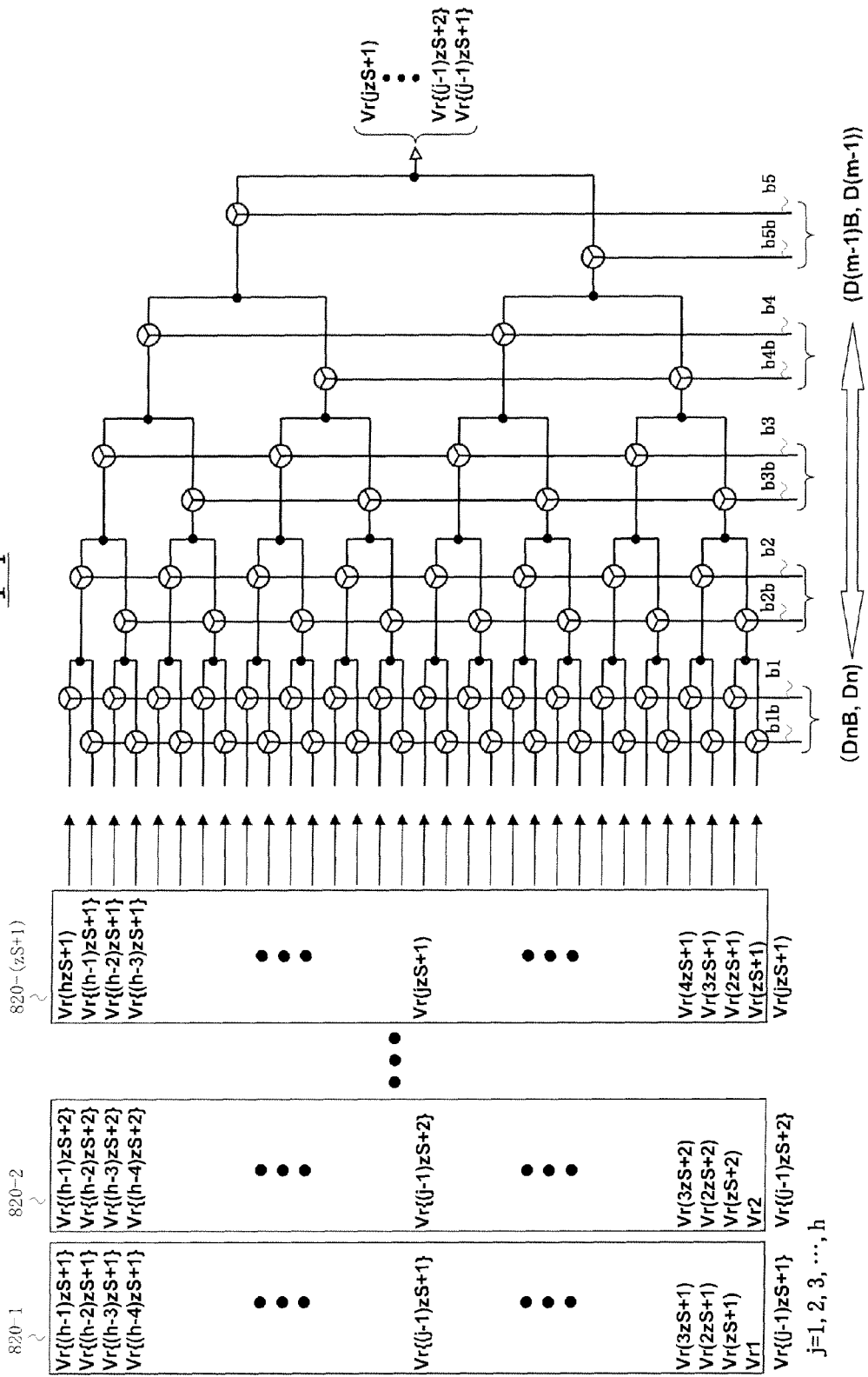
FIG. 19 is a diagram showing an example configuration of a sub-decoder 811 of FIG. 17.

In addition, the input nodes of the third and fourth sub-decoder sections 30 and 40 are connected by wirings connecting Pch/Nch transistor regions, while output nodes thereof are also connected by wirings connecting Pch/Nch transistor regions. By so doing, the number of wirings may be suppressed from increasing. The number of wirings laid along the short side of the chip 980 in FIG. 15 is increased only moderately, and hence the space taken up by the wirings is scarcely increased.

<Reference Case>

Figure 10:
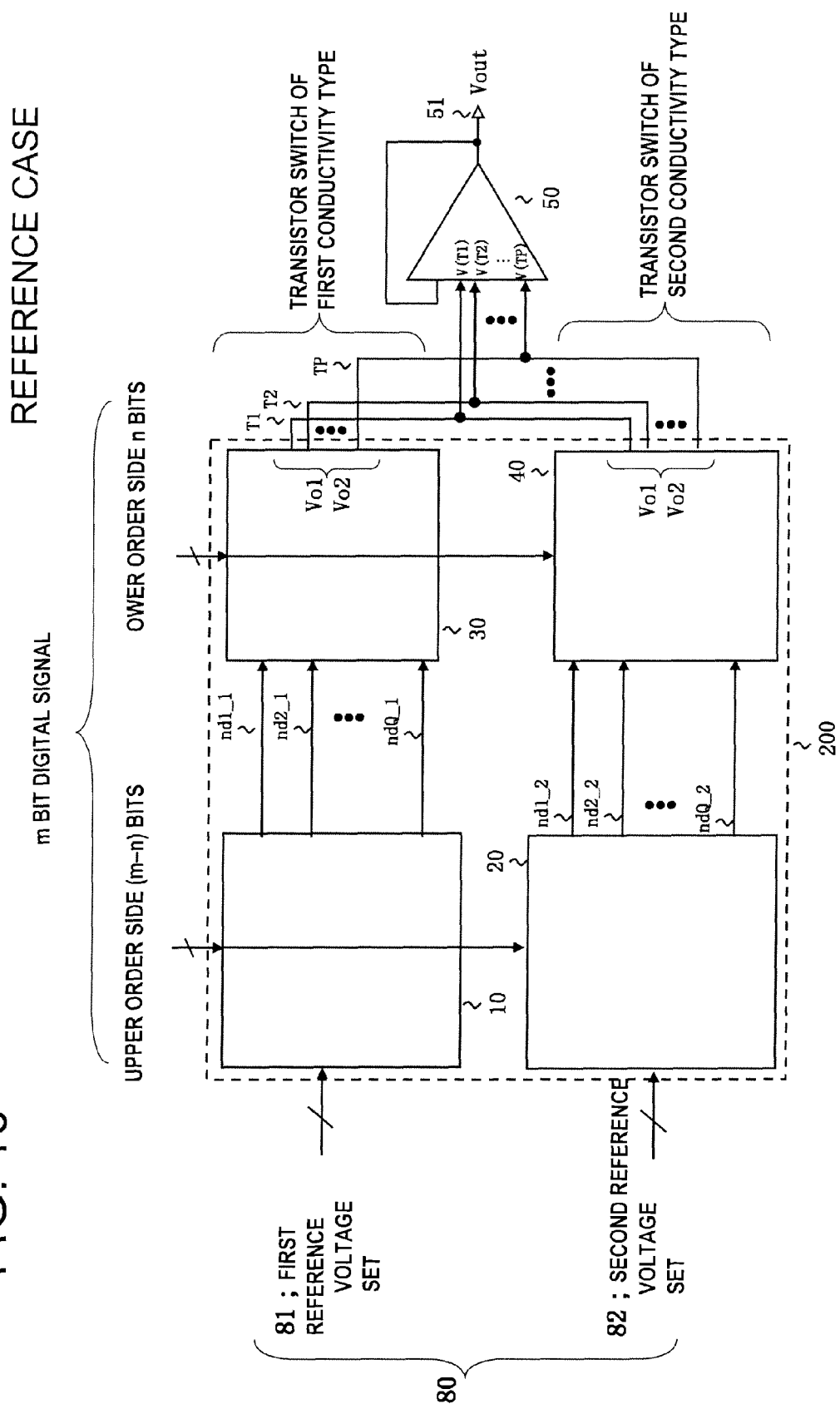
FIG. 10 is a diagram showing a configuration of a reference case.

FIG. 10 is a schematic circuit diagram showing a reference case (comparative example) of the decoder 100 of FIG. 1, in which the configuration according to the present invention is not adopted. It is noted that the reference case of FIG. 10 is created by the present inventor by way of comparison to the present invention.

In a decoder 200 of the reference case, shown in FIG. 10, Q output nodes nd1_1 to ndQ_1 of the first sub-decoder section 10 are not connected to Q output nodes nd1_2 to ndQ_2 of the second sub-decoder section 20, in contradistinction from the configuration example of FIG. 1. Hence, the third and fourth sub-decoder sections 30 and 40 do not form an equivalent CMOS configuration for the total of the reference voltages of the reference voltage ensemble 80, in contradistinction from the configuration example of FIG. 1. Thus, in the first sub-decoder section 10, it becomes necessary to increase the gate width W of the transistor switches of the switch set 91P of the sub-decoder 10-*i* of FIG. 5 to decrease the on-resistances of the transistor switches. This increases the decoder area. In the decoder 100 of the present invention, it is possible to decrease the decoder area.

Figure 11:
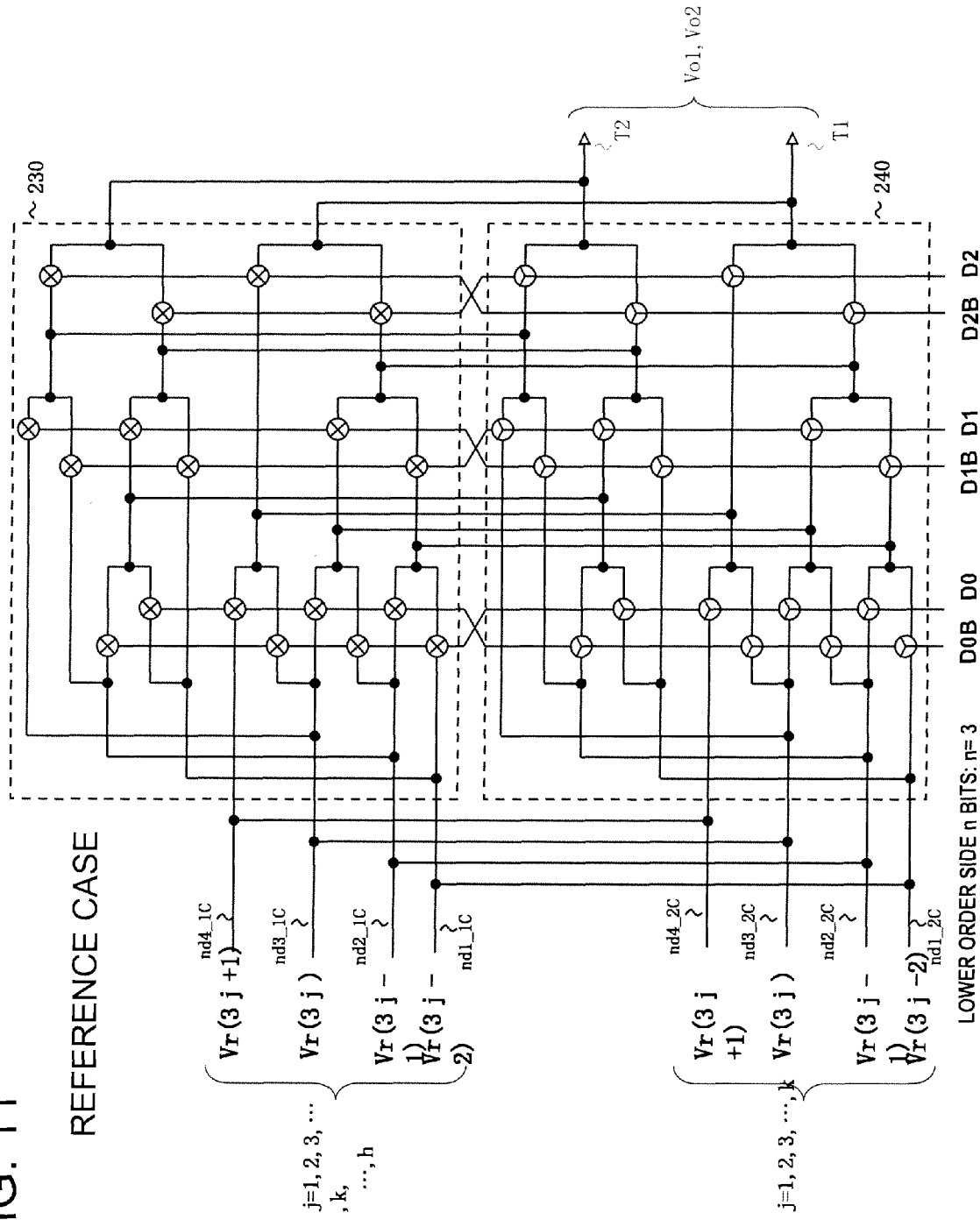
FIG. 11 is a diagram showing a configuration of the third and fourth sub-decoder sections of another reference case distinct from FIG. 9.
Figure 12A:
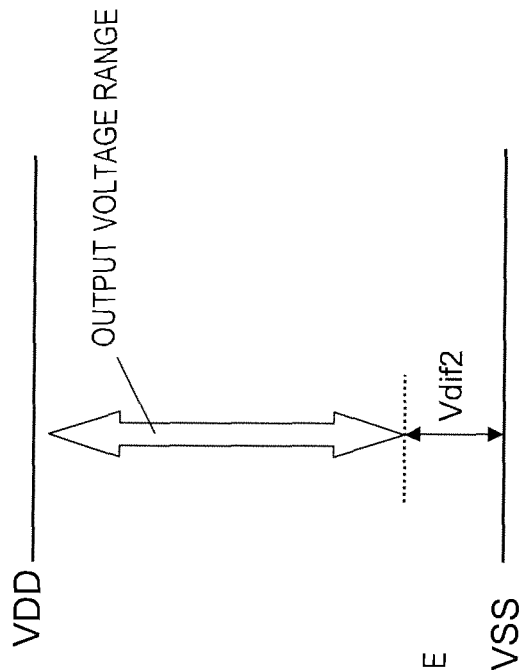
FIG. 12A is a diagram showing an example output range of an LCD driver.
Figure 12B:
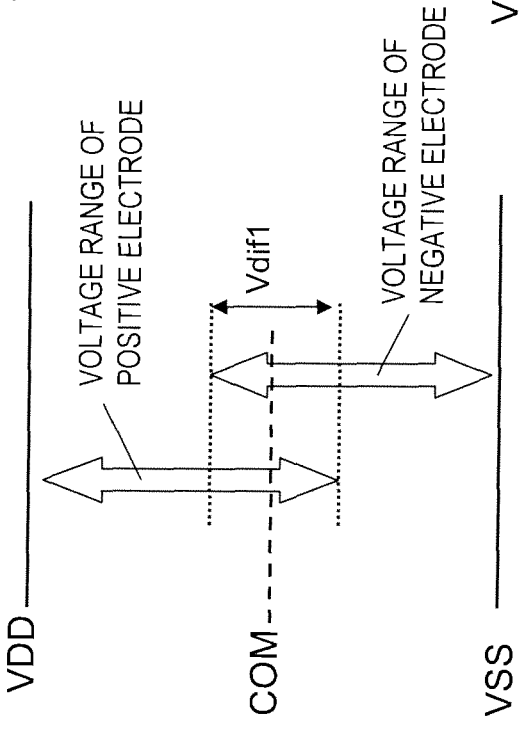
FIG. 12B is a diagram showing an example output range of an OLED display driver.

FIG. 11 is a schematic circuit diagram showing sub-decoder sections 230 and 240 as reference case of the third and fourth sub-decoder sections 30C and 40C of FIG. 9. The sub-decoder sections 230 and 240 include transistor switches of the first and second conductivity types, as in FIG. 9. In the sub-decoder sections 230 and 240, shown in FIG. 11, both ends of corresponding switches of the sub-decoder sections 230 and 240 are connected in common to provide a CMOS configuration, in contradistinction from the configuration of FIG. 9.

In this manner, on-resistances of the switches of the third and fourth sub-decoder sections 230 and 240 may be decreased. However, the number of wirings connecting the Nch/Pch transistor regions is increased, thus increasing the area taken up by the wirings. Moreover, since the bit signal lines of data signal and the interconnections are laid in the same area, as explained with reference to FIG. 15, the size of the decoder per output along the decoder's long side is increased. That is, in FIG. 15, the sizes of decoders 705-1 to 705q along the long sides thereof are increased, thus increasing the chip area.

Contrary to this, with the exemplary embodiments of the present invention, as shown in FIGS. 7 to 9, only the input nodes of the third and fourth sub-decoder sections 30 and 40 are connected together, and also only the output nodes of the third and fourth sub-decoder sections 30 and 40 are connected together. By so doing, an equivalent CMOS configuration may be accomplished with the use of the smallest amount of wiring connecting the Nch/Pch transistor regions, such as to suppress the area otherwise taken up by the wirings from increasing.

The disclosure of the aforementioned Patent Documents is incorporated by reference herein. The particular exemplary embodiments or examples may be modified or adjusted within the range of the entire disclosure of the present invention, inclusive of claims, based on the fundamental technical concept of the invention. Further, a variety of combinations or selection of elements disclosed herein may be made within the framework of the claims. That is, the present invention may cover a wide variety of modifications or corrections that may occur to those skilled in the art in accordance with the entire disclosure of the present invention, inclusive of claim and the technical concept of the present invention.

What is claimed is:

1. A digital-to-analog converter circuit comprising:
    a reference voltage ensemble that includes a plurality reference voltages different from one another;
    a decoder that receives an m-bit digital signal, where m is a preset positive integer not less than 3, and selects first and second voltages from said reference voltage ensemble, based on said m-bit digital signal; and
    an amplifier circuit that receives said first and second voltages, selected by said decoder and performs operational amplification on said first and second voltages received to output a resulting voltage, at an output terminal thereof, wherein
said reference voltage ensemble includes:
a first reference voltage set; and
a second reference voltage set, said first reference voltage set including a part or all of said reference voltages of said second reference voltage set, wherein
said decoder includes:
first and second sub-decoder sections, each of which receives, in common, a signal of upper side (m−n) bits of said m-bit digital signal, where n is a preset positive integer not less than 2 and not greater than (m−1), and includes first to Qth output nodes, where Q is a preset positive integer not less than 2;
third and fourth sub-decoder sections, each of which receives, in common, a signal of lower side n bits of said m-bit digital signal and includes first to Qth input nodes and first to Pth output nodes, where P is a preset positive integer not less than 2;
first to Qth nodes that are connected respectively to said first to Qth output nodes of each of said first and second sub-decoder sections and are connected respectively to said first to Qth input nodes of each of said third and fourth sub-decoders; and
first to Pth nodes that are connected respectively to said first to Pth output nodes of each of said third and fourth sub-decoder sections,
said first sub-decoder section including
a plurality of switches that are controlled to be electrically conductive or non-conductive, based on said signal of said upper side (m−n) bit of said m-bit digital signal, said plurality of switches of said first sub-decoder section selecting Q reference voltages different one another from said first reference voltage set to transfer said Q reference voltages selected to said first to Qth nodes, respectively,
said second sub-decoder section including
a plurality of switches that are controlled to be electrically conductive or non-conductive, based on said signal of said upper side (m−n) bits of said m-bit digital signal, said plurality of switches of said second sub-decoder section selecting Q reference voltages different one another from said second reference voltage set to transfer said Q reference voltages selected to said first to Qth nodes, respectively,
said third sub-decoder section including
a plurality of switches that are controlled to be electrically conductive or non-conductive, based on a signal of lower side n bits of said m-bit digital signal, said plurality of switches of said third sub-decoder section selecting said first and second voltages from said Q reference voltages transferred to said first to Qth nodes to transfer said first and second voltages selected to said first to Pth nodes,
said fourth sub-decoder section including
a plurality of switches that are controlled to be electrically conductive or non-conductive, based on said signal of lower side n bits of said m-bit digital signal, said plurality of switches of said fourth sub-decoder section selecting said first and second voltages, in common with said third sub-decoder section from said Q reference voltages transferred to said first to Qth nodes to transfer said first and second voltages selected to said first to Pth nodes,
said switches of said first and third sub-decoder sections each being composed by a transistor of an identical conductivity type,
said switches of said second and fourth sub-decoder sections each being composed by a transistor having a conductivity type opposite to that of said switches of said first and third sub-decoder sections, wherein
said amplifier circuit includes
first to Pth inputs that are connected to said first to Pth nodes, respectively, said amplifier circuit taking a weighted average of voltages transferred to said first to Pth nodes and received at said first to Pth inputs, respectively, with preset weighting factors to output a weighted average voltage as an analog signal corresponding to said m-bit digital signal.

2. The digital-to-analog converter circuit according to claim 1, wherein said third and fourth sub-decoder sections transfer an identical voltage to a part of or an entirety of said first to Pth nodes, based upon a value of lower side n bits of said m-bit digital signal.

3. The digital-to-analog converter circuit according to claim 1, wherein said Q is z×S+1, where S is a predetermined positive integer corresponding to powers of 2 inclusive of 1, and said z is a predetermined positive integer corresponding to powers of 2 inclusive of 1, added to with 1, wherein
said reference voltage ensemble includes
first to (h×z×S+1)th reference voltages, levels thereof corresponding to respective ordinal numbers in an ascending order or a descending order, where h is a preset positive integer not less than 2,
said first to (h×z×S+1)th reference voltages being mapped into array elements of a two-dimensional array with (z×S+1) rows and h columns, an array element of an i-th row and a j-th column of said two-dimensional array, where i is an integer not less than 1 and not greater than (z×S+1), and j is an integer not less than 1 and not greater than h, corresponding to {(j−1)×z×S+i}th reference voltage of said first to (h×z×S+1)th reference voltages,
said first reference voltage set being grouped into first to (z×S+1)th reference voltage groups corresponding respectively to first to (z×S+1)th rows of said two-dimensional array, said reference voltages belonging to each of said reference voltage groups of said first reference voltage set corresponding to array elements of f-th to h-th columns of said two-dimensional array, where f is an integer not less than 1 and less than h,
said second reference voltage set being grouped into first to (z×S+1)th reference voltage groups corresponding to said first to (z×S+1)th rows of said two-dimensional array, said reference voltages belonging to said reference voltage groups of said second reference voltage set being reference voltages corresponding to array elements of first to k-th columns of said two-dimensional array, where k is an integer greater than f and less than h, wherein
said first sub-decoder section includes
first to (z×S+1)th sub-decoders provided in association with said first to (z×S+1)th reference voltage groups of said first reference voltage set, said first to (z×S+1)th sub-decoders in case said upper side (m−n) bit signal of said m-bit signal is of a value corresponding to one of said fth to hth columns of said two-dimensional array, selecting, from said first to (z×S+1)th reference voltage groups of said first reference voltage set, said reference voltages allocated to said one of said fth to hth columns, said (z×S+1) reference voltages, selected by said first to (z×S+1)th sub-decoders of said first sub-decoder section, being transferred to said first to (z×S+1)th nodes provided in common for said first and second sub-decoder sections, wherein said second sub-decoder section includes first to (z×S+1)th sub-decoders provided in association with said first to (z×S+1)th reference voltage groups of said second reference voltage set, said first to (z×S+1)th sub-decoders selecting, in case a signal of said upper side (m−n) bits of said m-bit digital signal is of a value corresponding to one of said first to k-th columns of said two-dimensional array, said reference voltages allocated to said one of said first to k-th columns from said first to (z×S+1)th reference voltage groups of said second reference voltage set, said (z×S+1) reference voltages, selected by said first to (z×S+1)th sub-decoders of said second sub-decoder section, being transferred to said first to (z×S+1)th nodes provided in common for said first and second sub-decoder sections.

4. The digital-to-analog converter circuit according to claim 3, wherein, when said first, second and so forth down to (z×S+1)th sub-decoders of said first sub-decoder section select j-th reference voltages Vr((j−1)×z×S+1), Vr((j−1)×z×S+2) and so forth down to Vr(z×S+1), where j is an integer not less than 1 and not greater than k, from said first to (z×S+1)th reference voltage groups of said first reference voltage set, based on said upper side (m−n) bit signal of said m-bit digital signal, said first, second down to (z×S+1)th sub-decoders of said second sub-decoder section select Vr((j−1)×z×S+1), Vr((j−1)×z×S+2) and so forth down to Vr(z×S+1), and wherein when said first, second and so forth down to (z×S+1)th sub-decoders of said first sub-decoder section select j-th reference voltages Vr((j−1)×z×S+1), Vr((j−1)×z×S+2) and so forth down to Vr(z×S+1), j being an integer greater than k and not greater than h, said first, second and so forth down to (z×S+1)th sub-decoders of said second sub-decoder section are set in an off state, with said outputs thereof being in high-impedance state.

5. The digital-to-analog converter circuit according to claim 1, wherein said first and second sub-decoder sections sequentially decode said first and second reference voltage sets, supplied respectively thereto, based on said upper side (m−n) bit signal of said m-bit digital signal, in a direction from lower side bits to upper side bits.

6. The digital-to-analog converter circuit according to claim 1, wherein said value of P is 2, said amplifier circuit receives, at first and second inputs thereof, said voltages transferred to first and second nodes connected in common to first and second output nodes of said third and fourth sub-decoder sections, said amplifier circuit averaging said voltages, received at said first and second inputs, at a ratio of 1:1 to output a resulting averaged voltage.

7. The digital-to-analog converter circuit according to claim 1, wherein said value of P is 3;

said amplifier circuit receives, at first to third inputs thereof, said voltages transferred to first to third nodes connected in common to first to third output nodes of said third and fourth sub-decoder sections; said amplifier circuit averaging said voltages, transferred to said first to third inputs, at a ratio of 1:1:2 to output a resulting averaged voltage.

8. A data driver comprising the digital-to-analog converter circuit according to claim 1.

9. A display apparatus comprising the data driver according to claim 8.

* * * * *